United States Patent
Nosaka

(10) Patent No.: US 11,031,920 B2
(45) Date of Patent: Jun. 8, 2021

(54) RADIO-FREQUENCY FILTER, RADIO-FREQUENCY FRONT-END CIRCUIT, AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/519,596

(22) Filed: Jul. 23, 2019

(65) Prior Publication Data
US 2019/0348967 A1 Nov. 14, 2019

Related U.S. Application Data

(63) Continuation of application No. PCT/JP2018/001247, filed on Jan. 17, 2018.

(30) Foreign Application Priority Data

Jan. 30, 2017 (JP) .............................. JP2017-014759

(51) Int. Cl.
*H03H 9/64* (2006.01)
*H04B 1/00* (2006.01)

(52) U.S. Cl.
CPC ........ *H03H 9/6413* (2013.01); *H03H 9/6483* (2013.01); *H04B 1/0057* (2013.01)

(58) Field of Classification Search
CPC .. H03H 9/52; H03H 9/13; H03H 9/17; H03H 9/542; H03H 9/545; H01Q 1/50; H04B 1/006

(Continued)

(56) References Cited

U.S. PATENT DOCUMENTS 6,472,953 B1  10/2002 Sakuragawa et al.
10,256,791 B2 *  4/2019 Tsutsumi ............... H03H 9/171
(Continued)

FOREIGN PATENT DOCUMENTS

JP  2000-323961 A  11/2000
JP  2003-101373 A  4/2003
(Continued)

OTHER PUBLICATIONS

International Search Report for International Application No. PCT/JP2018/001247 dated Mar. 13, 2018.
(Continued)

*Primary Examiner* — Benny T Lee
*Assistant Examiner* — Hafizur Rahman
(74) *Attorney, Agent, or Firm* — Pearne & Gordon LLP

(57) ABSTRACT

A radio-frequency filter (10) includes a series arm circuit (11) and a parallel arm circuit (12). The series arm circuit (11) is disposed on a path connecting an input/output terminal (11m) and an input/output terminal (11n). The parallel arm circuit (12) is connected to a ground and to a node (x1) on the path. The series arm circuit (11) includes a series connecting circuit (11e) and a first variable frequency circuit (11a). The series connecting circuit (11e) includes a series arm resonator (s1) and a capacitor (C1). The first variable frequency circuit (11a) is connected in parallel with the series connecting circuit (11e) and varies the anti-resonant frequency of the series arm circuit (11). The first variable frequency circuit (11a) includes a capacitor (C2) and a switch (SW1) connected in series with each other. The series arm resonator (s1) and the capacitor (C1) are connected in series with each other.

17 Claims, 28 Drawing Sheets

(58) Field of Classification Search
USPC .......................................................... 333/195
See application file for complete search history.

(56) References Cited

U.S. PATENT DOCUMENTS

| | | | |
|---|---|---|---|
| 2003/0062969 A1 | 4/2003 | Inoue | |
| 2007/0026836 A1 | 2/2007 | Chow et al. | |
| 2008/0042781 A1 | 2/2008 | Kando | |
| 2009/0251235 A1* | 10/2009 | Belot | H03H 9/605 333/187 |
| 2010/0110940 A1 | 5/2010 | Hara et al. | |
| 2012/0313731 A1 | 12/2012 | Burgener et al. | |
| 2014/0340173 A1* | 11/2014 | Burgener | H03H 9/0009 333/188 |
| 2016/0301383 A1 | 10/2016 | Tani | |
| 2017/0264336 A1* | 9/2017 | Saji | H03H 9/6483 |
| 2017/0359051 A1 | 12/2017 | Urata | |

FOREIGN PATENT DOCUMENTS

| | | |
|---|---|---|
| JP | 2008-219748 A | 9/2008 |
| JP | 2011-146768 A | 7/2011 |
| JP | 2014-502803 A | 2/2014 |
| JP | 2016-54374 A | 4/2016 |
| WO | 2006/123518 A1 | 11/2006 |
| WO | 2009/025055 A1 | 2/2009 |
| WO | 2015/099105 A1 | 7/2015 |
| WO | 2016/104598 A1 | 6/2016 |

OTHER PUBLICATIONS

Written Opinion for International Application No. PCT/JP2018/001247 dated Mar. 13, 2018.

* cited by examiner

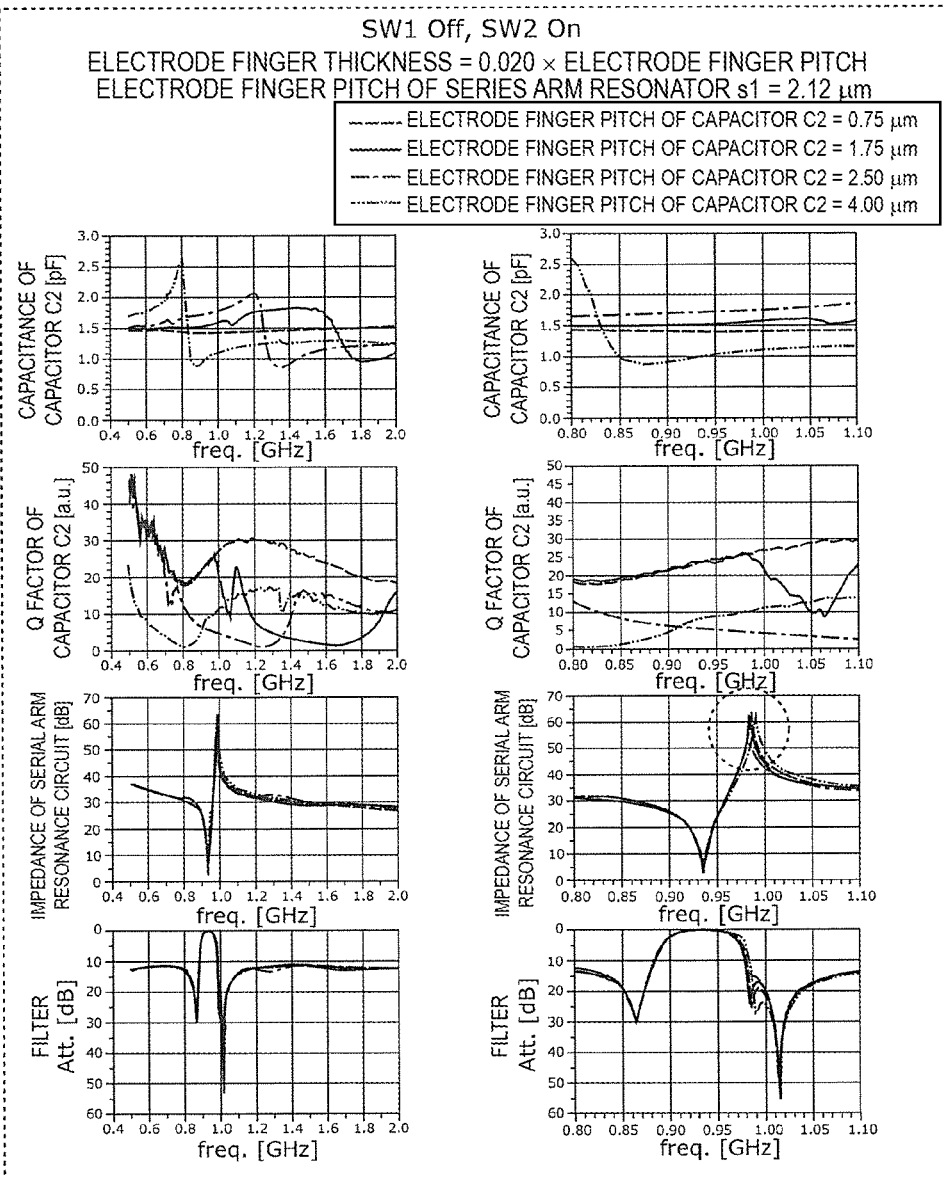

SECOND EXAMPLE

THIRD EXAMPLE

SWITCH-DRIVING POWER TERMINAL
SWITCH CONTROL TERMINAL

RADIO-FREQUENCY FILTER, RADIO-FREQUENCY FRONT-END CIRCUIT, AND COMMUNICATION APPARATUS

This is a continuation of International Application No. PCT/JP2018/001247 filed on Jan. 17, 2018 which claims priority from Japanese Patent Application No. 2017-014759 filed on Jan. 30, 2017. The contents of these applications are incorporated herein by reference in their entireties.

BACKGROUND OF THE DISCLOSURE

Field of the Disclosure

The present disclosure relates to a radio-frequency filter including a resonator, a radio-frequency front-end circuit, and a communication apparatus.

Description of the Related Art

Hitherto, as a multiband-support radio-frequency filter, a variable-frequency radio-frequency filter (tunable filter) is proposed. As a series arm circuit of such a variable-frequency radio-frequency filter, for example, the configuration in which a series connecting circuit of a capacitor and a switch is connected in parallel with a series arm resonator is known.

In the above-described configuration, it is possible to shift the anti-resonant frequency of the series arm circuit as a result of the switch being switched between ON and OFF. The anti-resonant frequency of the series arm circuit determines an attenuation pole. The frequency of the attenuation pole of the radio-frequency filter can accordingly be changed (see Patent Document 1, for example).

Patent Document 1: U.S. Patent Application Publication No. 2007/0026836

BRIEF SUMMARY OF THE DISCLOSURE

In the above-described configuration of the related art, however, the resonant frequency of the series arm circuit does not change even if the switch is switched between ON and OFF.

With the application of the above-described configuration of the related art to a ladder filter circuit including a series arm circuit and a parallel arm circuit, a radio-frequency filter having the following configuration is formed. In this radio-frequency filter, the resonant frequency of the series arm circuit and the parallel arm circuit determines the pass band, and the anti-resonant frequency of the series arm circuit determines the attenuation pole on the higher-frequency side of the pass band. The radio-frequency filter is able to vary the frequency of the attenuation pole on the higher-frequency side of the pass band as a result of the switch being switched between ON and OFF.

In this radio-frequency filter, however, the resonant frequency of the series arm circuit does not change even if the switch is switched between ON and OFF. This raises the difference between the anti-resonant frequency and the resonant frequency of the series arm circuit, which accordingly increases the loss at the high edge of the pass band.

It is an object of the present disclosure to provide a radio-frequency filter that is able to vary the frequency of the attenuation pole on the higher-frequency side of a pass band substantially without increasing the loss at the high edge of the pass band, and also to provide a radio-frequency front-end circuit and a communication apparatus.

To achieve the above-described object, a radio-frequency filter according to an aspect of the present disclosure includes a series arm circuit and a parallel arm circuit. The series arm circuit is disposed on a path which connects first and second input/output terminals. The parallel arm circuit is connected to a ground and to a node on the path. The series arm circuit includes a first series connecting circuit and a first variable frequency circuit. The first series connecting circuit includes a series arm resonator and a first capacitor. The first variable frequency circuit is connected in parallel with the first series connecting circuit and varies an anti-resonant frequency of the series arm circuit. The first variable frequency circuit includes a second capacitor and a first switch connected in series with the second capacitor. The series arm resonator and the first capacitor are connected in series with each other.

With this configuration, the series arm resonator and the first capacitor are connected in series with each other, and thus, the resonant frequency of the first series connecting circuit constituted by the series arm resonator and the first capacitor becomes higher than that of the series arm resonator alone. That is, the first series connecting circuit can decrease the difference between the resonant frequency and the anti-resonant frequency in comparison with the series arm resonator alone. According to this aspect, because of a smaller difference between the resonant frequency and the anti-resonant frequency of the series arm circuit, it is possible to shift the attenuation pole on the higher-frequency side of the pass band while the cut-off frequency on the higher-frequency side of the pass band is shifted to the higher-frequency side. That is, it is possible to implement a variable-frequency radio-frequency filter which is able to vary the frequency of the attenuation pole on the higher-frequency side of the pass band substantially without increasing the loss at the high edge of the pass band.

The series arm circuit may include a parallel connecting circuit. The parallel connecting circuit may include the first capacitor and a second switch connected in parallel with each other. The parallel connecting circuit may form a second variable frequency circuit that varies a resonant frequency of the series arm circuit.

With this configuration, the second switch is connected in parallel with the first capacitor, and the resonant frequency of the series arm circuit is accordingly shifted as a result of the second switch being switched between ON and OFF. It is thus possible to separately shift the resonant frequency and the anti-resonant frequency of the series arm circuit. This makes it possible to change the cut-off frequency on the higher-frequency side of the pass band and the frequency of the attenuation pole on the higher-frequency side of the pass band independently of each other. That is, it is possible to increase the variations in the cut-off frequency on the higher-frequency side of the pass band and the frequency of the attenuation pole on the higher-frequency side of the pass band as a result of the first and second switches being switched between ON and OFF.

When the first switch is ON, the second switch may be ON, and when the first switch is OFF, the second switch may be OFF.

According to this aspect, as a result of setting the first and second switches to the same state (ON or OFF), the resonant frequency and the anti-resonant frequency of the series arm circuit can shift to the lower-frequency side or the higher-frequency side together. The cut-off frequency and the attenuation pole on the higher-frequency side of the pass band can accordingly shift to the lower-frequency side or the higher-frequency side together. It is thus possible to vary the frequency of the attenuation pole on the higher-frequency side of the pass band substantially without increasing the loss at the high edge of the pass band.

Additionally, the same control circuit can be used for the first and second switches, thereby reducing the size of the radio-frequency filter.

The series arm resonator may include an IDT electrode which is formed on a substrate at least partly exhibiting piezoelectricity and which is constituted by a plurality of electrode fingers. At least one of the first and second capacitors may include the substrate and an interdigital capacitor electrode which is formed on the substrate and which is constituted by a plurality of electrode fingers. The pitch of the plurality of electrode fingers forming the interdigital capacitor electrode may be smaller than that of the plurality of electrode fingers forming the series arm resonator. The self-resonant point of the at least one of the first and second capacitors may be located at a higher-frequency side than a pass band of the radio-frequency filter.

The self-resonant point of a capacitor constituted by an interdigital capacitor electrode shifts to the higher-frequency side as the electrode finger pitch is narrower. The self-resonant point is the frequency at a singularity point at which the Q factor (capacitor Q) of a capacitance element is locally decreased. The pitch of the electrode fingers of the interdigital capacitor electrode is set to be smaller than that of the series arm resonator so as to shift the self-resonant point of the interdigital capacitor electrode to the higher-frequency side than the pass band of the radio-frequency filter. This can enhance the Q factor of the at least one of the first and second capacitors in the pass band and in the vicinity of the higher-frequency side of the pass band, thereby making it possible to regulate the loss in the pass band.

The film thickness of the plurality of electrode fingers forming the interdigital capacitor electrode may be smaller than or equal to that of the plurality of electrode fingers forming the series arm resonator.

Because of the manufacturing reason, the pitch of electrode fingers is restricted by the film thickness of the electrode fingers. Accordingly, the film thickness of the electrode fingers of a capacitor constituted by an interdigital capacitor electrode is set to be smaller than that of a series arm resonator, thereby making it possible to reduce the pitch of the electrode fingers of the capacitor to be even smaller. This makes it easier to achieve both of the required Q factor of the series arm resonator and that of the capacitor. As a result of obtaining the required Q factor of the series arm resonator and the required Q factor of the at least one of the first and second capacitors, it is possible to further regulate the loss in the pass band and/or to further enhance the sharpness of the attenuation slope on the higher-frequency side of the pass band.

The radio-frequency filter may further include at least another series arm circuit disposed on the path. The above-described series arm circuit may be connected to one of the first and second input/output terminals without having the at least another series arm circuit interposed therebetween.

If a surface acoustic wave resonator is used as a series arm resonator, a bulk wave loss is incurred on the higher-frequency side of the anti-resonant frequency of the series arm resonator. In a multiplexer having a common terminal to which one terminal of each of plural filters is connected, if a radio-frequency filter including such a series arm resonator is applied to a filter having a lower center frequency, the loss in the pass band of a filter having a higher center frequency is increased due to the bulk wave loss. Such an increase in the loss is mainly due to the influence of the bulk wave loss in the series arm circuit positioned most closely to the common terminal (that is, the series arm circuit connected to the common terminal without having another series arm circuit interposed therebetween).

As to this bulk wave loss, according to this aspect, the series arm circuit includes the first and second capacitors, and thus, an input signal (power) is distributed between the series arm resonator and the first and second capacitors, thereby reducing the bulk wave loss in the series arm circuit as a whole. Such a series arm circuit is disposed most closely to one of the input/output terminals. With this configuration, in a multiplexer including a filter having a lower center frequency and also including a common terminal connected to this input/output terminal, an increase in the loss within the pass band in a filter having a higher center frequency can be regulated.

One terminal of the first switch may be connected to the first or second input/output terminal to which the series arm circuit is connected, and the other terminal of the first switch may be connected to the second capacitor.

In this case, if the plural series arm resonators are included in a resonator chip and the first switch is included in a different chip, the number of terminals of the resonator chip can be reduced. More specifically, in the resonator chip, the same terminal can be used as the terminal connected to the input/output terminal to which the series arm circuit is connected and as the terminal connected to the different chip. According to this aspect, fewer terminals are required for the resonator chip than the configuration in which these terminals are individually provided, thereby reducing the size of the radio-frequency filter.

The parallel arm circuit may include a first parallel arm resonator and a third variable frequency circuit. The first parallel arm resonator is connected between the node and the ground. The third variable frequency circuit is connected in parallel with the first parallel arm resonator. The third variable frequency circuit may include a second series connecting circuit including a second parallel arm resonator and a third switch. The resonant frequency of the first parallel arm resonator may be lower than that of the series arm resonator. The resonant frequency of the second parallel arm resonator may be higher than that of the first parallel arm resonator. The anti-resonant frequency of the second parallel arm resonator may be higher than that of the first parallel arm resonator.

The third variable frequency circuit is connected in parallel with the first parallel arm resonator. Ideally, when the third switch is OFF, the impedance of the third switch becomes infinite so as to make the second parallel arm resonator ineffective. The parallel arm circuit thus has the resonant frequency and the anti-resonant frequency of the first parallel arm resonator. In contrast, when the third switch is ON, the second parallel arm resonator becomes effective, and the parallel arm circuit is represented by a parallel connecting circuit of the first and second parallel arm resonators. The parallel arm circuit thus has two resonant frequencies; one resonant frequency is equal to that of the first parallel arm resonator and the other resonant frequency is equal to that of the second parallel arm resonator. The parallel arm circuit also has two anti-resonant frequencies; one anti-resonant frequency is lower than that of the first parallel arm resonator and the other anti-resonant frequency is lower than that of the second parallel arm resonator.

As a result of the third switch being switched between ON and OFF, the resonant frequency and the anti-resonant frequency of the parallel arm circuit can be changed. More specifically, when the third switch is ON, the cut-off frequency on the higher-frequency side of the pass band shifts to the lower-frequency side, and also, another attenuation pole determined by the resonant frequency of the second parallel arm resonator is formed on the higher-frequency side of the pass band.

According to this aspect, ideally, it is possible to vary the frequency of the pass band and that of the attenuation band as a result of the third switch being switched between ON and OFF.

In actuality, however, when the third switch is OFF, it has OFF capacitance. Accordingly, even when the third switch is OFF, the second parallel arm resonator becomes effective, and the parallel arm circuit has two resonant frequencies and two anti-resonant frequencies produced by the first parallel arm resonator and a series connecting circuit of the second parallel arm resonator and the OFF capacitance of the third switch. The higher anti-resonant frequency and the higher resonant frequency are positioned on the higher-frequency side than the attenuation pole determined by the anti-resonant frequency of the series arm circuit.

Typically, the OFF capacitance of a switch is very small (about 0.3 pF). Accordingly, when the third switch is OFF, the lower one of the two anti-resonant frequencies is slightly lower than the anti-resonant frequency of the first parallel arm resonator and is higher than that when the third switch is ON. The higher one of the two resonant frequencies is slightly lower than the anti-resonant frequency of the second parallel arm resonator and is higher than that when the third switch is ON. It is thus possible to shift the lower anti-resonant frequency and the higher resonant frequency of the parallel arm circuit to the lower-frequency side or the higher-frequency side together as a result of the third switch being switched between ON and OFF.

As a result of the third switch being switched between ON and OFF, the cut-off frequency and the attenuation pole on the higher-frequency side of the pass band can shift to the lower-frequency side or the higher-frequency side together. It is thus possible to vary the frequency of the attenuation pole on the higher-frequency side of the pass band substantially without increasing the loss at the high edge of the pass band.

The third variable frequency circuit may further include an impedance element connected in parallel with the third switch.

The impedance element is connected in parallel with the third switch. With this configuration, regardless of whether the third switch is ON or OFF, the parallel arm circuit has two resonant frequencies and two anti-resonant frequencies. Even when the third switch is OFF, the attenuation pole formed by the higher resonant frequency of the parallel arm circuit can be located in the vicinity of the attenuation pole formed by the anti-resonant frequency of the series arm circuit, and also, the attenuation band width is increased. As a result of the third switch being switched between ON and OFF, the lower anti-resonant frequency and the higher resonant frequency shift to the lower-frequency side or the higher-frequency side together. The cut-off frequency and the attenuation pole on the higher-frequency side of the pass band accordingly shift to the lower-frequency side or the higher-frequency side together as a result of the third switch being switched between ON and OFF. It is thus possible to vary the frequency of the attenuation pole on the higher-frequency side of the pass band substantially without increasing the loss at the high edge of the pass band.

The series arm circuit may include a second switch connected in parallel with the first capacitor. The impedance element may be a third capacitor. When the first switch is ON, both of the second and third switches may be ON, and when the first switch is OFF, both of the second and third switches may be OFF.

The impedance element is a third capacitor, and as a result of setting the first, second, and third switches to the same state (ON or OFF), it is possible to shift the resonant frequency and the anti-resonant frequency of the series arm circuit and the lower anti-resonant frequency and the higher resonant frequency of the parallel arm circuit to the lower-frequency side or the higher-frequency side together. Accordingly, the cut-off frequency and the attenuation pole on the higher-frequency side of the pass band shift to the lower-frequency side or the higher-frequency side together. It is thus possible to vary the frequency of the attenuation pole on the higher-frequency side of the pass band substantially without increasing the loss at the high edge of the pass band.

Additionally, the same control circuit can be used for the first, second, and third switches, thereby reducing the size of the radio-frequency filter.

The first switch may be an FET switch made of GaAs or CMOS or a diode switch.

With this configuration, the resistance of the first switch can be reduced, and the loss in the pass band can accordingly be regulated. The size of the first switch can also be decreased, thereby reducing the size and the cost of the radio-frequency filter.

A radio-frequency front-end circuit according to an aspect of the disclosure includes one of the above-described radio-frequency filters and a controller that controls an ON state and an OFF state of the first switch.

It is thus possible to implement a small-size radio-frequency front-end circuit that can vary the frequency of the attenuation pole on the higher-frequency side of the pass band substantially without increasing the loss at the high edge of the pass band.

A communication apparatus according to an aspect of the disclosure includes an RF signal processing circuit and the above-described radio-frequency front-end circuit. The RF signal processing circuit processes a radio-frequency signal to be transmitted by an antenna element and a radio-frequency signal received by the antenna element. The radio-frequency front-end circuit transfers the radio-frequency signals between the antenna element and the RF signal processing circuit.

It is thus possible to implement a small-size communication apparatus that can vary the frequency of the attenuation pole on the higher-frequency side of the pass band substantially without increasing the loss at the high edge of the pass band.

In a radio-frequency filter, a radio-frequency front-end circuit, and a communication apparatus according to the present disclosure, it is possible to vary the frequency of the attenuation pole on the higher-frequency side of a pass band substantially without increasing the loss at the high edge of the pass band.

BRIEF DESCRIPTION OF THE SEVERAL VIEWS OF THE DRAWINGS

FIGS. 7A, 7B, 7C and 7D show graphs illustrating the relationships of the electrode finger pitch of a capacitor to the capacitance and capacitor Q factor of the capacitor, the impedance of a series arm circuit, and the filter characteristics.

FIG. 13B shows graphs illustrating a comparison between the impedance characteristics and the bandpass characteristics when the radio-frequency filter of the first typical example is switched OFF and those when the radio-frequency filter is switched ON.

DETAILED DESCRIPTION OF THE DISCLOSURE

Figure 1A:
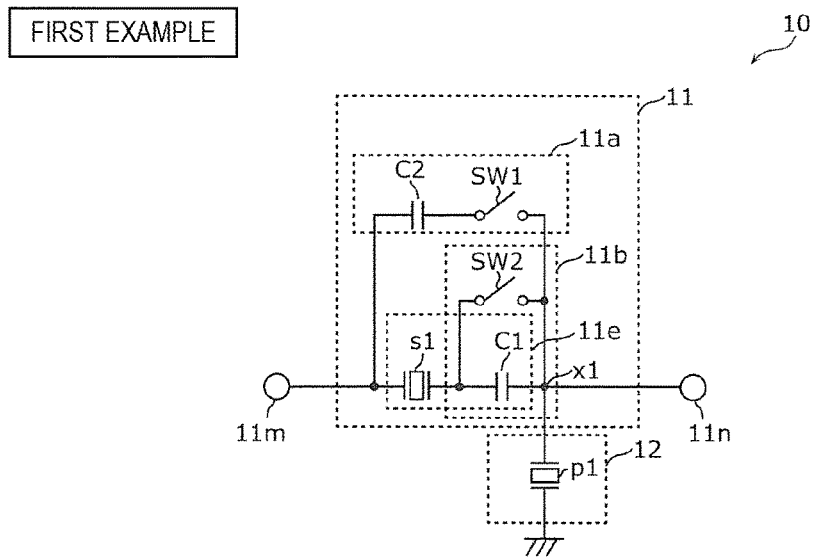
FIG. 1A is a circuit diagram of a radio-frequency filter according to an example (first example) of a first embodiment.

Embodiments of the present disclosure will be described below in detail by using the examples and the drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios. In the individual drawings, substantially the same configurations are designated by the same reference numeral, and an explanation thereof may not be repeated or may be simplified. Regarding a circuit element, such as a resonator, the constants may be adjusted appropriately in accordance with the required specifications, for example. Even for the circuit element designated by the same reference numeral, the constants may be different in accordance with the required specifications.

Unless otherwise stated, the resonant frequency of a resonator or a circuit is a resonant frequency for forming a pass band or an attenuation pole in the vicinity of the pass band of a filter which includes the resonator or the circuit. The resonant frequency is the frequency of a "resonant point", which is the singularity point at which the impedance of the resonator or the circuit is minimized (ideally zero).

Unless otherwise stated, the anti-resonant frequency of a resonator or a circuit is an anti-resonant frequency for forming a pass band or an attenuation pole in the vicinity of the pass band of a filter which includes the resonator or the circuit. The anti-resonant frequency is the frequency of an "anti-resonant point", which is the singularity point at which the impedance of the resonator or the circuit is maximized (ideally infinite).

In the following embodiments, a series arm circuit and a parallel arm circuit are defined as follows.

The parallel arm circuit is a circuit disposed between a ground and a node on a path connecting the first and second input/output terminals.

The series arm circuit is a circuit disposed between the first input/output terminal or the second input/output terminal and a node on the above-described path to which the parallel arm circuit is connected, or a circuit disposed between a node on the above-described path to which one parallel arm circuit is connected and another node on the above-described path to which another parallel arm circuit is connected.

First Embodiment

A radio-frequency filter according to a first embodiment will be described below through illustration of an example (first example).

[1-1. Configuration]

FIG. 1A is a circuit diagram of a radio-frequency filter 10 according to the first example. The radio-frequency filter 10 shown in FIG. 1A includes a series arm circuit 11 and a parallel arm circuit 12.

The series arm circuit 11 is a resonance circuit disposed on a path (series arm) connecting an input/output terminal 11*m* (first input/output terminal) and an input/output terminal 11*n* (second input/output terminal). More specifically, the series arm circuit 11 includes a series arm resonator s1, a capacitor C1 (first capacitor), a capacitor C2 (second capacitor), a switch SW1 (first switch), and a switch SW2 (second switch). The series arm circuit 11 includes the series arm resonator s1 having a resonant frequency (resonant point) at which the impedance is minimized and an anti-resonant frequency (anti-resonant point) at which the impedance is maximized. The resonant frequency and the anti-resonant frequency of the series arm circuit 11 are thus dependent on the resonant frequency and the anti-resonant frequency of the series arm resonator s1. Details of this point will be discussed later.

The series arm resonator s1 and the capacitor C1 are connected in series with each other so as to form a series connecting circuit 11*e* (first series connecting circuit). The capacitor C2 and the switch SW1 are connected in series with each other so that this series connecting circuit forms a first variable frequency circuit 11*a*. The capacitor C1 and the switch SW2 are connected in parallel with each other so that this parallel connecting circuit forms a second variable frequency circuit 11*b*.

The series arm resonator s1 is a resonator disposed on a series arm which connects the input/output terminals 11*m* and 11*n*, and is connected between the input/output terminal 11*m* (first input/output terminal) and the input/output terminal 11*n* (second input/output terminal).

The first variable frequency circuit 11*a* is a series connecting circuit of the capacitor C2 (second capacitor) and the switch SW1 (first switch), and is connected in parallel with the series connecting circuit 11*e* of the series arm resonator s1 and the capacitor C1 (first capacitor). The first variable frequency circuit 11*a* varies the anti-resonant frequency of the series arm circuit 11. More specifically, the first variable frequency circuit 11*a* varies the anti-resonant frequency as a result of the switch SW1 being switched between ON and OFF in accordance with a control signal from a controller (not shown), such as an RFIC.

In the first example, the capacitor C2 and the switch SW1 forming the first variable frequency circuit 11*a* are connected in this order as viewed from the input/output terminal 11*m*. However, the connection order may be reversed.

The second variable frequency circuit lib is a parallel connecting circuit of the capacitor C1 (first capacitor) and the switch SW2 (second switch) and is connected in series with the series arm resonator s1. The second variable frequency circuit 11*b* varies the resonant frequency of the series arm circuit 11. More specifically, the second variable frequency circuit 11*b* varies the resonant frequency as a result of the switch SW2 being switched between ON and OFF in accordance with a control signal from a controller (not shown), such as an RFIC.

In the first example, the second variable frequency circuit 11*b* is connected between the series arm resonator s1 and the input/output terminal 11*n*. However, the second variable frequency circuit 11*b* may be connected between the input/output terminal 11*m* and the series arm resonator s1. That is, the capacitor C1 may be connected between the input/output terminal 11*m* and the series arm resonator s1, instead of being connected between the series arm resonator s1 and the input/output terminal 11*n*.

In the first example, in the first and second variable frequency circuits 11*a* and 11*b*, when the switch SW1 (first switch) is ON, the switch SW2 (second switch) is ON, and when the switch SW1 is OFF, the switch SW2 is OFF. That is, the switches SW1 and SW2 are turned ON together or turned OFF together.

The switches SW1 and SW2 are SPST (Single Pole Single Throw) switch elements. The switches SW1 and SW2 are FET (Field Effect Transistor) switches made of GaAs (gallium arsenide) or CMOS (Complementary Metal Oxide Semiconductor) or diode switches, for example, and are formed as a switch IC (Integrated Circuit), for example. The switches SW1 and SW2 are not restricted to semiconductor switches formed on a semiconductor substrate, and may be mechanical switches formed by using MEMS (Micro Electro Mechanical Systems).

The parallel arm circuit 12 is a resonance circuit connected between a ground (reference terminal) and a node x1 on the path (series arm) connecting the input/output terminals 11*m* and 11*n*. More specifically, the parallel arm circuit 12 includes a parallel arm resonator p1, which is a resonator connected between the node x1 and a ground. The parallel arm circuit 12 includes the parallel arm resonator p1 having a resonant frequency (resonant point) at which the impedance is minimized and an anti-resonant frequency (anti-resonant point) at which the impedance is maximized. The resonant frequency and the anti-resonant frequency of the parallel arm circuit 12 are thus dependent on the resonant frequency and the anti-resonant frequency of the parallel arm resonator p1.

[1-2. Characteristics]

The radio-frequency filter 10 configured as described above is able to vary the frequency of the attenuation pole on the higher-frequency side of the pass band substantially without increasing the loss at the high edge of the pass band. The filter characteristics (bandpass characteristics) of the radio-frequency filter 10 of the first example will be discussed below while also referring to the impedance characteristics (resonance characteristics) which determine the filter characteristics.

The circuit constants of the radio-frequency filter 10 of the first example are shown in Table 1.

TABLE 1

| | Series arm resonator s1 | Parallel arm resonator p1 | Capacitor C1 | Capacitor C2 |
|---|---|---|---|---|
| Electrostatic capacity Cap. [pF] | 2.0 | 5.0 | 2.0 | 7.0 |
| Resonant frequency fr [MHz] | 730 | 700 | | |
| Anti-resonant frequency fa [MHz] | 788 | 728 | | |

Figure 1B:
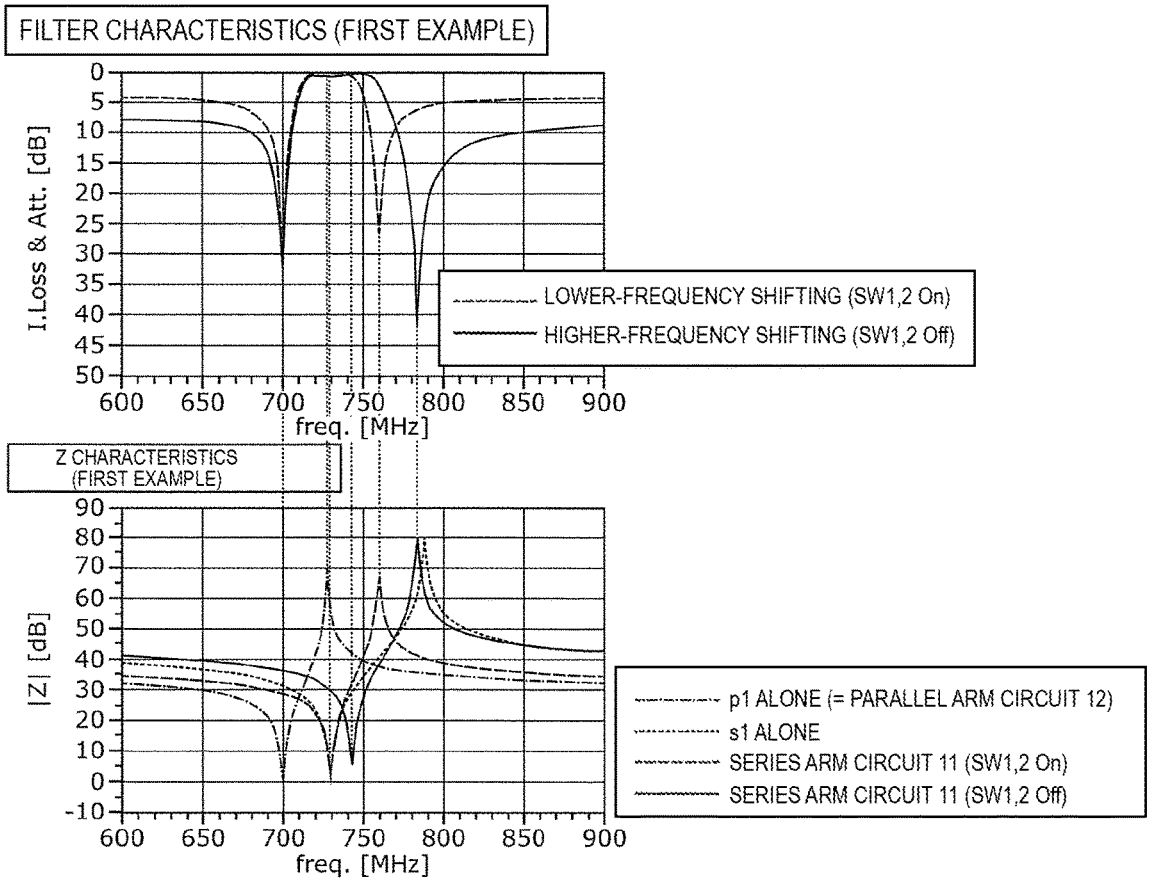
FIG. 1B shows graphs illustrating various characteristics concerning the radio-frequency filter of the first example.

FIG. 1B shows graphs illustrating various characteristics concerning the radio-frequency filter 10. More specifically, the graph in the top section of FIG. 1B illustrates the filter characteristics in two states, that is, in a state in which the switches SW1 and SW2 are both ON and in a state in which the switches SW1 and SW2 are both OFF. The graph in the bottom section of FIG. 1B illustrates the impedance characteristics of the series arm resonator s1, the series arm circuit 11, and the parallel arm resonator p1. Concerning the series arm circuit 11, the impedance characteristics in two states, that is, in a state in which the switches SW1 and SW2 are both ON and in a state in which the switches SW1 and SW2 are both OFF, are shown.

A description will first be given of the characteristics when the switch SW1 is OFF and the switch SW2 is OFF (switches SW1 and SW2 are both OFF) in the circuit configuration shown in FIG. 1A.

In this case, the series arm circuit 11 is in the state in which the first variable frequency circuit 11a including the OFF switch SW1 is connected in parallel with the series connecting circuit 11e (first series connecting circuit) constituted by the series arm resonator s1 and the capacitor C1.

As illustrated in the graph in the bottom section of FIG. 1B, the anti-resonant frequency of the series arm circuit 11 is slightly lower than that of the series arm resonator s1 due to the influence of the combined capacitance of the capacitor C2 and the OFF capacitance (Coff1) of the switch SW1 of the first variable frequency circuit 11a.

The OFF capacitance (Coff1) of the switch SW1 is a capacitance component when the switch SW1 is OFF. When the switch SW1 is OFF, the capacitance component is ideally zero (that is, the impedance is infinite). In actuality, however, the switch SW1 has OFF capacitance (Coff1), which is a very small capacitance component. The OFF capacitance is much smaller (about 0.3 pF) than the capacitance of the capacitor C2. The combined capacitance of the capacitor C2 and the OFF capacitance of the switch SW1 is thus much smaller than the capacitance of the capacitor C2. Hence, a frequency difference is generated in the anti-resonant frequency of the series arm circuit 11 between when the switch SW1 is ON and when the switch SW1 is OFF.

The resonant frequency of the series arm circuit 11 becomes higher than that of the series arm resonator s1 due to the influence of the capacitor C1.

A description will now be given of the characteristics when the switch SW1 is ON and the switch SW2 is ON (switches SW1 and SW2 are both ON) in the circuit configuration shown in FIG. 1A.

In this case, the series arm circuit 11 is in the state in which the first variable frequency circuit 11a including the ON switch SW1 is connected in parallel with the series connecting circuit of the series arm resonator s1 and the switch SW2. That is, the series arm circuit 11 is a parallel connecting circuit of the series arm resonator s1 and the capacitor C2.

As illustrated in the graph in the bottom section of FIG. 1B, the anti-resonant frequency of the series arm circuit 11 becomes lower than that of the series arm resonator s1 due to the influence of the capacitor C2 of the first variable frequency circuit 11a. The resonant frequency of the series arm circuit 11 becomes equal to that of the series arm resonator s1 because the capacitor C1 is short-circuited by the switch SW2.

In this manner, in the first example, the anti-resonant frequency and the resonant frequency of the series arm circuit 11 are shifted as a result of the switches SW1 and SW2 being switched between ON and OFF.

The resonant frequency of the series arm circuit 11 and the anti-resonant frequency of the parallel arm circuit 12 determine the pass band of the radio-frequency filter 10. The anti-resonant frequency of the series arm circuit 11 determines the attenuation pole on the higher-frequency side of the pass band of the radio-frequency filter 10. The resonant frequency of the parallel arm circuit 12 determines the attenuation pole on the lower-frequency side of the pass band of the radio-frequency filter 10. The anti-resonant frequency and the resonant frequency of the parallel arm circuit 12 are fixed regardless of whether the switches SW1 and SW2 are ON or OFF. The anti-resonant frequency of the parallel arm circuit 12 is the same as that of the parallel arm resonator p1, while the resonant frequency thereof is the same as that of the parallel arm resonator p1.

The attenuation pole on the higher-frequency side of the pass band shifts to the higher-frequency side when the switch SW1 is OFF and it shifts to the lower-frequency side when the switch SW1 is ON. The cut-off frequency on the higher-frequency side of the pass band shifts to the higher-frequency side when the switch SW2 is OFF and it shifts to the lower-frequency side when the switch SW2 is ON.

As illustrated in the graph in the top section of FIG. 1B, the pass band of the radio-frequency filter 10 shifts to the lower-frequency side when the switches SW1 and SW2 are both ON (lower-frequency shifting), and it shifts to the higher-frequency side when the switches SW1 and SW2 are both OFF (higher-frequency shifting).

[1-3. Advantages]

Advantages achieved by the first example will be discussed below in comparison with a radio-frequency filter according to a comparative example of the first embodiment.

Figure 2A:
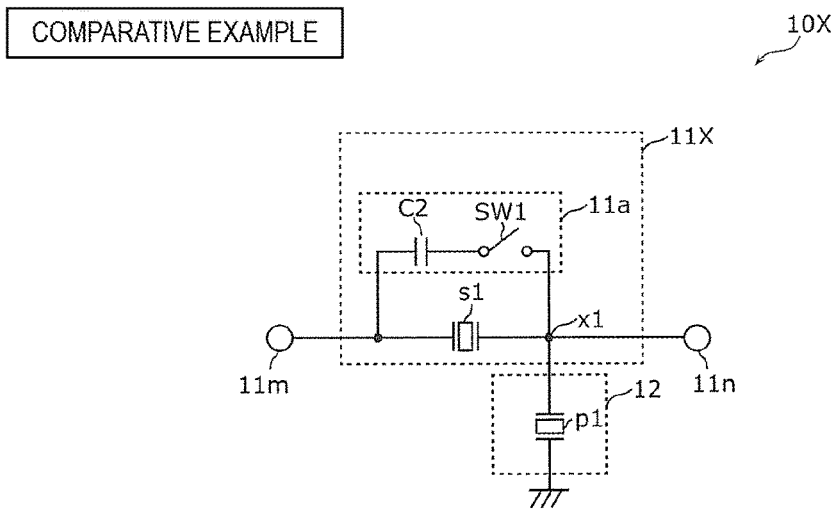
FIG. 2A is a circuit diagram of a radio-frequency filter according to a comparative example.

FIG. 2A is a circuit diagram of a radio-frequency filter 10X according to a comparative example. The radio-frequency filter 10X shown in FIG. 2A is different from the radio-frequency filter 10 of the first example only in that it does not include the second variable frequency circuit 11b constituted by the capacitor C1 and the switch SW2.

The radio-frequency filter 10X configured as described above is still able to vary the frequency of the attenuation pole on the higher-frequency side of the pass band in accordance with the ON/OFF state of the switch SW1.

Figure 2B:
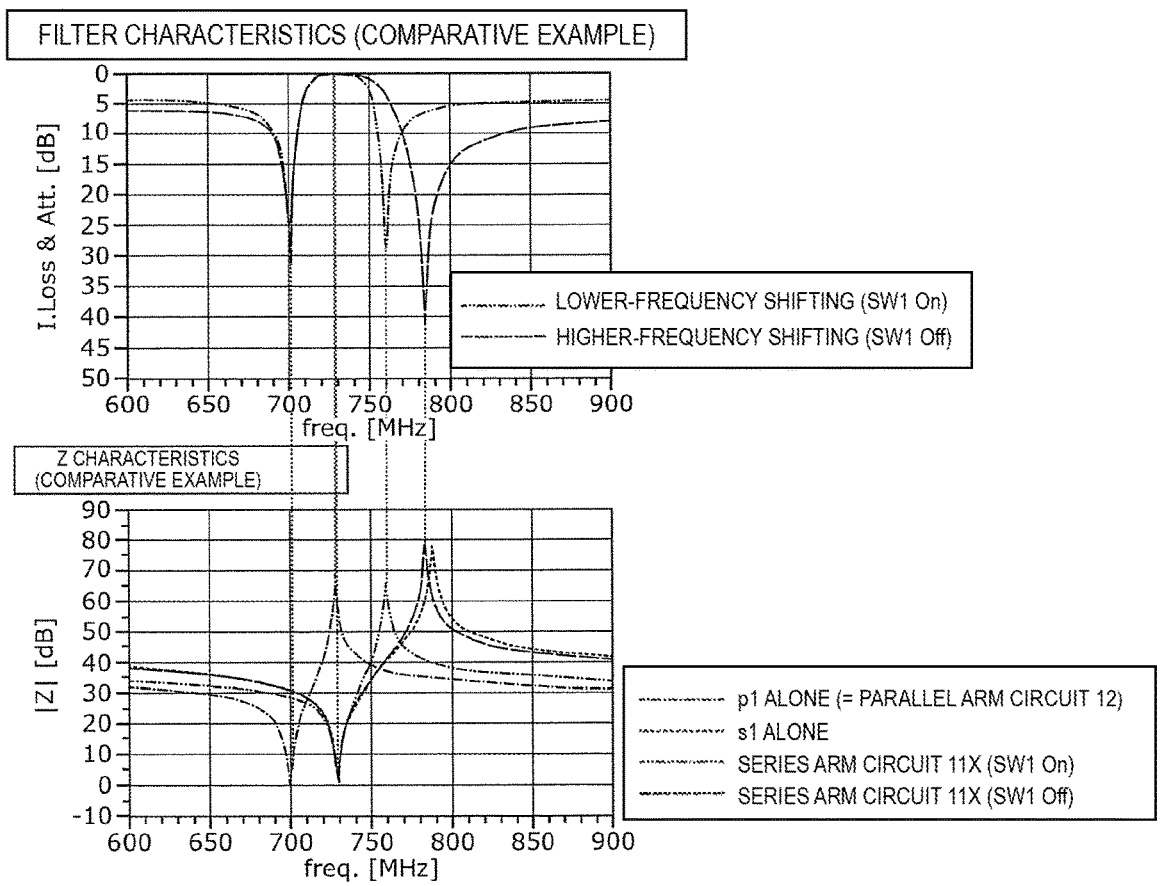
FIG. 2B shows graphs illustrating various characteristics concerning the radio-frequency filter of the comparative example.

FIG. 2B shows graphs illustrating various characteristics concerning the radio-frequency filter 10X. More specifically, the graph in the top section of FIG. 2B illustrates the filter characteristics in two states, that is, in a state in which the switch SW1 is ON and in a state in which the switch SW1 is OFF. The graph in the bottom section of FIG. 2B illustrates the impedance characteristics of the series arm resonator s1, a series arm circuit 11X, and the parallel arm resonator p1. Concerning the series arm circuit 11X, the impedance characteristics in two states, that is, in a state in which the switch SW1 is ON and in a state in which the switch SW1 is OFF, are shown.

The circuit constants of the radio-frequency filter 10X of the comparative example are similar to those of the first example.

A description will first be given of the characteristics when the switch SW1 is OFF in the circuit configuration shown in FIG. 2A.

In this case, the series arm circuit 11X is in the state in which the first variable frequency circuit 11a including the OFF switch SW1 is connected in parallel with the series arm resonator s1.

As illustrated in the graph in the bottom section of FIG. 2B, the anti-resonant frequency of the series arm circuit 11X is slightly lower than that of the series arm resonator s1 due to the influence of the combined capacitance of the capacitor C2 and the OFF capacitance (Coff1) of the switch SW1. The resonant frequency of the series arm circuit 11X is equal to that of the series arm resonator s1.

A description will now be given of the characteristics when the switch SW1 is ON in the circuit configuration shown in FIG. 2A.

In this case, the series arm circuit 11X is in the state in which the first variable frequency circuit 11a including the ON switch SW1 is connected in parallel with the series arm resonator s1. That is, the series arm circuit 11X is a parallel connecting circuit of the series arm resonator s1 and the capacitor C2.

As illustrated in the graph in the bottom section of FIG. 2B, the anti-resonant frequency of the series arm circuit 11X becomes lower than that of the series arm resonator s1 due to the influence of the capacitor C2 of the first variable frequency circuit 11a. The resonant frequency of the series arm circuit 11X is equal to that of the series arm resonator s1.

As illustrated in the graph in the top section of FIG. 2B, only the attenuation pole on the higher-frequency side of the pass band is shifted, and, only in this manner, the pass band in the comparative example shifts to the lower-frequency side or the higher-frequency side.

Figure 3A:
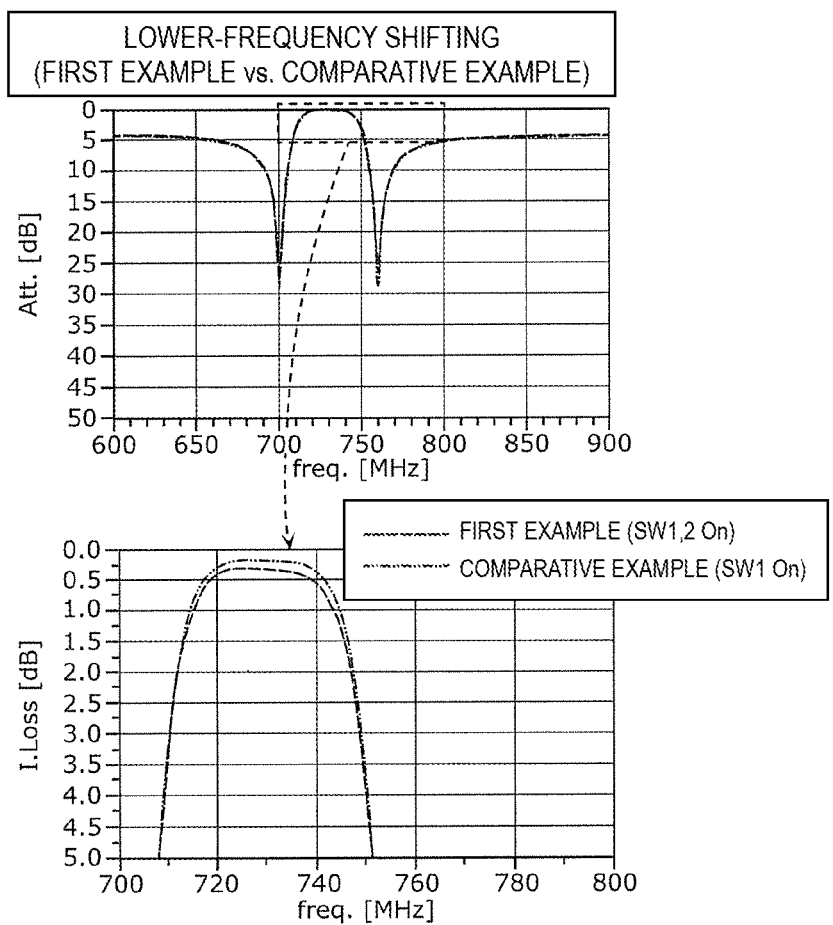
FIG. 3A shows graphs illustrating a comparison between the characteristics of the radio-frequency filter of the first example and those of the comparative example in the case of lower-frequency shifting.
Figure 3B:
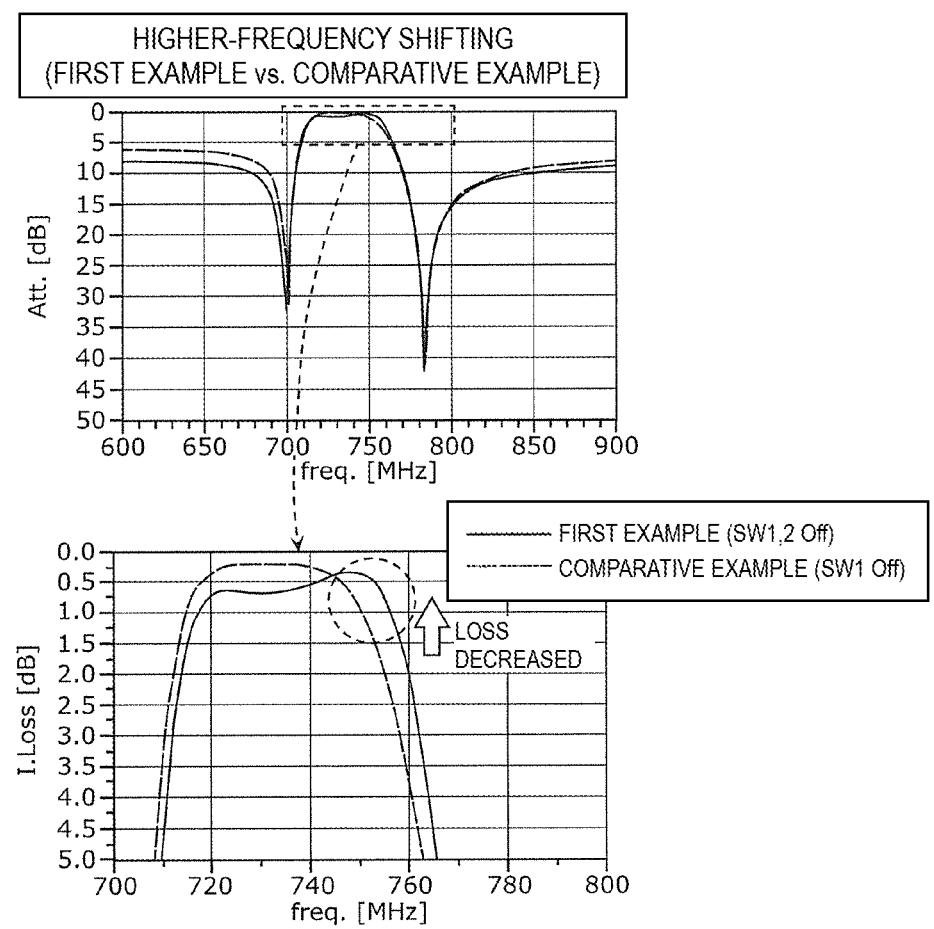
FIG. 3B shows graphs illustrating a comparison between the characteristics of the radio-frequency filter of the first example and those of the comparative example in the case of higher-frequency shifting.

FIG. 3A shows graphs illustrating a comparison between the characteristics of the radio-frequency filter of the first example and those of the comparative example in the case of lower-frequency shifting. FIG. 3B shows graphs illustrating a comparison between the characteristics of the radio-frequency filter of the first example and those of the comparative example in the case of higher-frequency shifting.

FIG. 3A shows that, in the case of lower-frequency shifting, although the loss in the pass band in the first example is slightly higher than that in the comparative example, it can still be regulated at roughly the same level as that in the comparative example.

A slight increase in the loss in the first example is due to the influence of the resistance components when the switch SW2 is ON (ON resistance). Decreasing the ON resistance of the switch SW2 can regulate an increase in the loss. However, this leads to an increase in the size of the switch SW2. A suitable switch is thus selected as the switch SW2 in accordance with the required specifications, such as the size of the radio-frequency filter 10 and the loss in the pass band.

Typically, a switch has a tradeoff relationship between a decrease in the ON resistance and an increase in the OFF capacitance and the size of the switch. The inventor of the disclosure of this application has considered this tradeoff relationship and the influence of the characteristics of the switches SW1 and SW2 (ON resistance, OFF capacitance, and so on) on the filter characteristics, and has found the following points about the switches SW1 and SW2.

The switch SW1 is connected to bypass the series arm resonator s1, and the characteristics of the switch SW1 thus influence the anti-resonant frequency of the series arm circuit 11. That is, the characteristics of the switch SW1 influence the attenuation pole on the higher-frequency side of the pass band of the radio-frequency filter 10. An increase in the ON resistance of the switch SW1 only negligibly increases the loss in the pass band of the radio-frequency filter 10. On the other hand, however, if the OFF capacitance of the switch SW1 is increased, the difference in the capacitance of the first variable frequency circuit 11a between when the switch SW1 is ON and when the switch SW1 is OFF becomes smaller. This decreases the range by which the frequency is variable (variable frequency range). It is thus preferable that the OFF capacitance of the switch SW1 is decreased (that is, the ON resistance is increased).

The switch SW2 is connected in series with the series arm resonator s1, and the characteristics of the switch SW2 thus influence the resonant frequency of the series arm circuit 11. That is, the characteristics of the switch SW2 influence the pass band of the radio-frequency filter 10. A rise in the ON resistance of the switch SW2 increases the loss in the pass band of the radio-frequency filter 10 when the switch SW2 is ON. On the other hand, however, even if the OFF capacitance of the switch SW2 is increased, the combined capacitance of the OFF capacitance of the switch SW2 and the capacitor C1 can be maintained by suitably adjusting the capacitance of the capacitor C1. It is thus preferable that the ON resistance of the switch SW2 is decreased (that is, the OFF capacitance is increased).

FIG. 3B shows that, in the case of higher-frequency shifting, the loss at the high edge of the pass band in the first example is smaller than that in the comparative example.

That is, in the series arm circuit 11X of the comparative example, only the anti-resonant frequency is variable as a result of the switch SW1 being switched between ON and OFF, and the resonant frequency remains the same. Accordingly, the difference between the anti-resonant frequency and the resonant frequency of the series arm circuit 11X is increased in the case of higher-frequency shifting. In other words, there is only a small change in the cut-off frequency in comparison with the variations in the attenuation pole on the higher-frequency side of the pass band. This causes a poor sharpness, thereby increasing the loss at the high edge of the pass band.

In contrast, in the first example, the series arm resonator s1 and the capacitor C1 (first capacitor) are connected in series with each other. Accordingly, the resonant frequency of the series connecting circuit 11e (first series connecting circuit) constituted by the series arm resonator s1 and the capacitor C1 becomes higher than that of the series arm resonator s1 alone. That is, the series connecting circuit 11e can decrease the difference between the resonant frequency and the anti-resonant frequency in comparison with the series arm resonator s1 alone. According to the first example, because of a smaller difference between the resonant frequency and the anti-resonant frequency of the series arm circuit 11, it is possible to shift the attenuation pole to the higher-frequency side of the pass band while the cut-off frequency on the higher-frequency side of the pass band is shifted to the higher-frequency side. That is, it is possible to implement a variable-frequency radio-frequency filter that is able to vary the frequency of the attenuation pole on the higher-frequency side of the pass band substantially without increasing the loss at the high edge of the pass band.

According to the first example, the switch SW2 (second switch) is connected in parallel with the capacitor C1. This configuration can shift the resonant frequency of the series arm circuit 11 in accordance with the ON/OFF state of the switch SW2. It is thus possible to separately shift the resonant frequency and the anti-resonant frequency of the series arm circuit 11. This can change the cut-off frequency on the higher-frequency side of the pass band and the frequency of the attenuation pole on the higher-frequency side of the pass band independently of each other.

In many bands defined in 3GPP (Third Generation Partnership Project), the Tx band (transmit band) is a lower-frequency band, while the Rx band (receive band) is a higher-frequency band, and the center frequency and the bandwidth are different among the bands. A variable-frequency radio-frequency filter for such bands uses one of the Tx band and the Rx band as a pass band and the other band as an attenuation band, and is also required to shift the pass band and the attenuation band to the lower-frequency side or the higher-frequency side together.

According to the first example, as a result of setting the switches SW1 and SW2 to the same state (ON or OFF), the resonant frequency and the anti-resonant frequency of the series arm circuit 11 can shift to the lower-frequency side or the higher-frequency side together. The cut-off frequency and the attenuation pole on the higher-frequency side of the pass band can also accordingly shift to the lower-frequency side or the higher-frequency side together. It is thus possible to vary the frequency of the attenuation pole on the higher-frequency side of the pass band substantially without increasing the loss at the high edge of the pass band.

In the comparative example, the difference between the resonant frequency and the anti-resonant frequency of the series arm circuit 11X is increased in the case of higher-frequency shifting. This decreases the sharpness on the higher-frequency side of the pass band and accordingly increases the loss at the high edge of the pass band. In contrast, according to the first example, it is possible to shift the resonant frequency and the anti-resonant frequency of the series arm circuit 11 to the lower-frequency side or the higher-frequency side together. In the case of higher-frequency shifting, the difference between the resonant frequency and the anti-resonant frequency of the series arm circuit 11 remains the same, thereby maintaining the sharpness on the higher-frequency side of the pass band. In the first example, the improved sharpness on the higher-frequency side of the pass band can regulate an increase in the loss at the high edge of the pass band in comparison with the comparative example.

The variable frequency range of the pass band of the radio-frequency filter 10 is determined by the constants of the capacitors C1 and C2. For example, as the constant of the capacitor C1 is smaller and the constant of the capacitor C2 is greater, the variable frequency range becomes wider. The constant of the capacitor C1 is thus suitably determined in accordance with the frequency specifications demanded for the radio-frequency filter 10. Each of the capacitors C1 and C2 may be a variable capacitor, such as varicap or a DTC (Digitally Tunable Capacitor).

In the radio-frequency filter 10 according to the first embodiment, the mode in which the switches SW1 and SW2 are ON at the same time and the mode in which the switches SW1 and SW2 are OFF at the same time have been discussed. However, other modes may be selected. That is, a mode in which the switch SW1 is ON and the switch SW2 is OFF and a mode in which the switch SW1 is OFF and the switch SW2 is ON may be selected.

Figure 4:
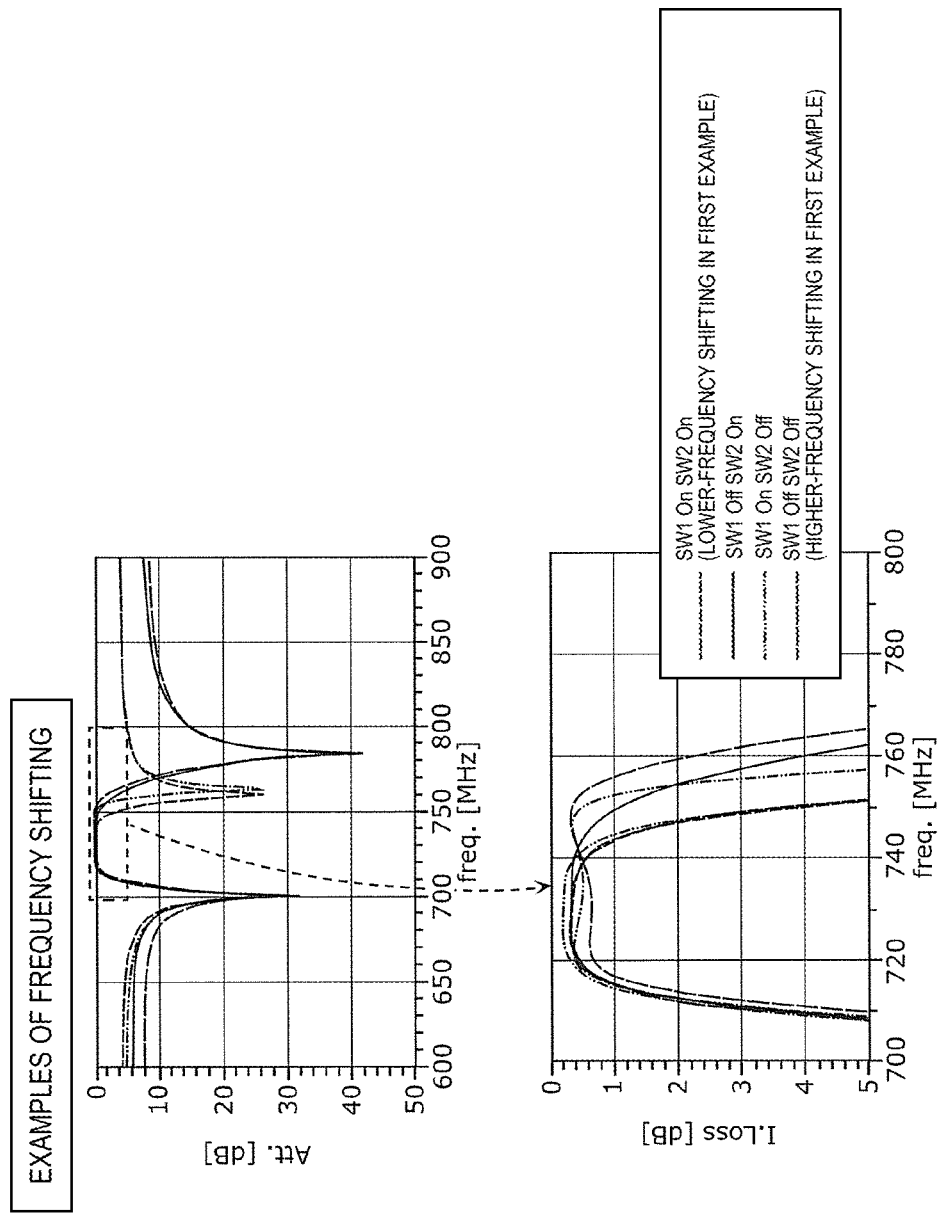
FIG. 4 shows graphs illustrating variations in the filter characteristics when the ON/OFF states of the switches of the radio-frequency filter according to the first example are changed.

FIG. 4 shows graphs illustrating variations in the filter characteristics when the ON/OFF states of the switches SW1 and SW2 of the radio-frequency filter 10 of the first example are changed.

As shown in FIG. 4, four filter characteristics can be formed as a result of individually changing the ON/OFF states of the switches SW1 and SW2.

The parallel connecting circuit of the capacitor C1 (first capacitor) and the switch SW2 (second switch) is connected in series with the series arm resonator s1. This configuration can shift the resonant frequency of the series arm circuit 11 as a result of the switch SW2 being switched between ON and OFF. It is thus possible to individually shift the resonant frequency and the anti-resonant frequency of the series arm circuit 11, thereby implementing more elaborate adjustments to the filter characteristics (in particular, the filter characteristics on the higher-frequency side). That is, variations in the bandwidths that can be switched can be increased.

[1-4. Resonance Analysis]

The resonance characteristics of the radio-frequency filter 10 will be explained below by using equivalent circuits.

[1-4-1. Single Resonator]

The resonance characteristics of a single resonator will first be discussed below.

Figure 5A:
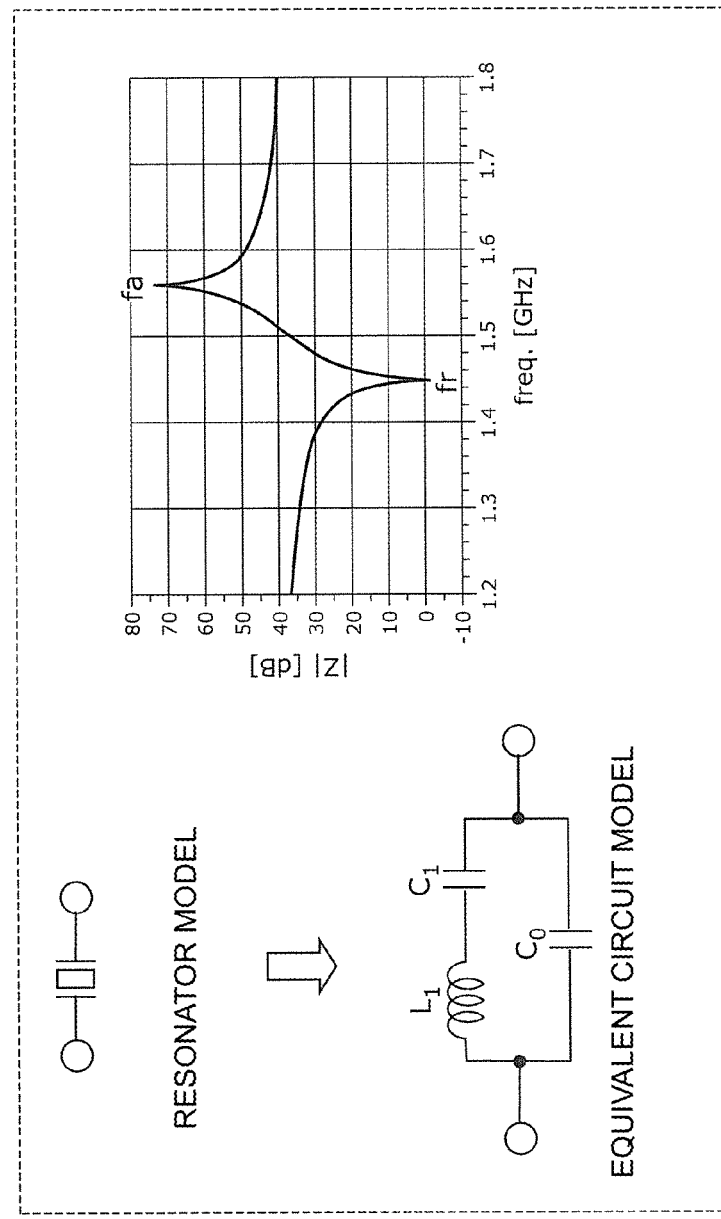
FIG. 5A illustrates an equivalent circuit model of a resonator and the resonance characteristics thereof.

FIG. 5A illustrates an equivalent circuit model of a single resonator and the resonance characteristics thereof. As shown in FIG. 5A, the resonator is represented by a parallel circuit (parallel connecting circuit) of a capacitor $C_0$ and a series circuit (series connecting circuit) of a capacitor $C_1$ and an inductor $L_1$. The capacitor $C_0$ is electrostatic capacity of the resonator.

In this equivalent circuit, the resonant frequency fr of the resonator is determined by the series circuit of the capacitor $C_1$ and the inductor $L_1$. The resonant frequency fr is the frequency at which the impedance of the equivalent circuit is 0. Accordingly, the resonant frequency fr is expressed by equation 2 as a result of solving equation 1.

[Math. 1]

$$Z = 0 = j\omega L_1 + \frac{1}{j\omega C_1} \qquad \text{(Equation 1)}$$

[Math. 2]

$$f_r = \frac{1}{2\pi\sqrt{L_1 C_1}} \qquad \text{(Equation 2)}$$

The anti-resonant frequency fa of the resonator is the frequency at which the admittance Y of the above-described equivalent circuit is 0. Accordingly, the anti-resonant frequency fa is expressed by equation 4 as a result of solving equation 3.

[Math. 3]

$$Y = \frac{1}{Z} = 0 = \frac{1}{\frac{1}{j\omega C_0}} + \frac{1}{j\omega L_1 + \frac{1}{j\omega C_1}} \quad \text{(Equation 3)}$$

[Math. 4]

$$f_a = \frac{\sqrt{1 + \frac{C_1}{C_0}}}{2\pi\sqrt{L_1 C_1}} = f_r \sqrt{1 + \frac{C_1}{C_0}} \quad \text{(Equation 4)}$$

According to equations 2 and 4, as shown in the graph on the right side of FIG. 5A, the anti-resonant frequency fa is positioned on the higher-frequency side than the resonant frequency fr.

That is, the resonator has one resonant frequency and one anti-resonant frequency positioned on the higher-frequency side than the resonant frequency.

[1-4-2. Series Connection of Impedance Element to Resonator]

A description will now be given, by using an equivalent circuit model, of the resonance characteristics when an impedance element is connected in series with a resonator.

Figure 5B:
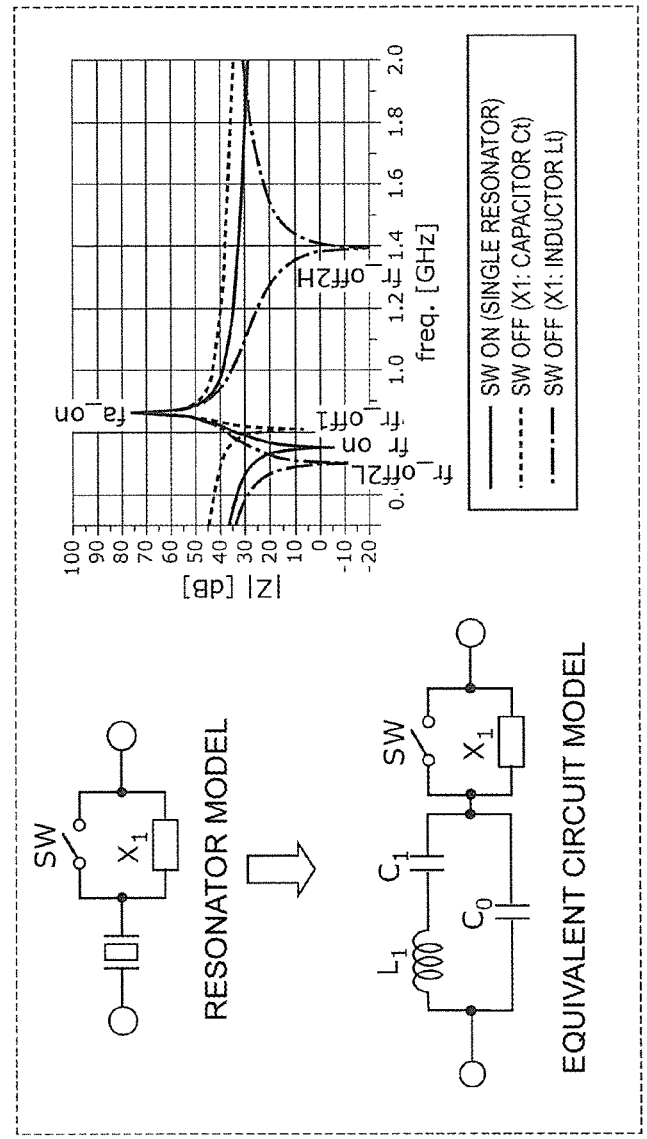
FIG. 5B illustrates an equivalent circuit model in which an impedance element is connected in series with a resonator and also illustrates the resonance characteristics of the equivalent circuit model.

FIG. 5B illustrates an equivalent circuit model in which an impedance element $X_1$ is connected in series with a resonator and also illustrates the resonance characteristics of the equivalent circuit model. As shown in FIG. 5B, the resonator is represented by a parallel circuit of a capacitor $C_0$ and a series circuit of a capacitor $C_1$ and an inductor $L_1$. The capacitor $C_0$ is the electrostatic capacity of the resonator. A parallel circuit of the impedance element $X_1$ and a switch SW is connected to this resonator. In the equivalent circuit models used in resonance analysis, the switch SW is assumed as an ideal switch in which the capacitance component is zero (that is, the impedance is infinite) when the switch SW is OFF and the resistance component is zero (that is, the impedance is zero) when the switch SW is ON.

The resonance characteristics of the above-described equivalent circuit when the switch SW is ON will first be discussed. When the switch SW is ON, the impedance element $X_1$ is short-circuited. Hence, the resonant frequency fr_on and the anti-resonant frequency fa_on respectively remain equal to the resonant frequency fr and the anti-resonant frequency fa shown in FIG. 5A, and are expressed by equations 5 and 6, respectively.

[Math. 5]

$$f_r\_on = \frac{1}{2\pi\sqrt{L_1 C_1}} \quad \text{(Equation 5)}$$

[Math. 6]

$$f_a\_on = \frac{\sqrt{1 + \frac{C_1}{C_0}}}{2\pi\sqrt{L_1 C_1}} = f_r\_on \sqrt{1 + \frac{C_1}{C_0}} \quad \text{(Equation 6)}$$

The resonance characteristics of the above-described equivalent circuit when the switch SW is OFF will now be discussed. In this case, (1) the resonance characteristics when the impedance element $X_1$ is a capacitor and (2) the resonance characteristics when the impedance element $X_1$ is an inductor will be described.

(1) When the Impedance Element $X_1$ is a Capacitor $C_t$

The resonant frequency fr_off1 when the switch SW is OFF is the frequency at which the impedance Z of the above-described equivalent circuit is 0. Accordingly, the resonant frequency fr_off1 is expressed by equation 8 as a result of solving equation 7.

[Math. 7]

$$Z = 0 = \frac{1}{\frac{1}{j\omega C_0} + \frac{1}{j\omega L_1 + \frac{1}{j\omega C_1}}} + \frac{1}{j\omega C_t} \quad \text{(Equation 7)}$$

[Math. 8]

$$f_r\_off1 = \frac{\sqrt{\frac{C_0 + C_1 + C_t}{L_1 C_1 C_t + L_1 C_0 C_t}}}{2\pi} \quad \text{(Equation 8)}$$

The anti-resonant frequency fa_off1 (not shown) when the switch SW is OFF is the same as the anti-resonant frequency fa_on when the switch SW is ON, and is expressed by equation 9.

[Math. 9]

$$f_a\_off1 = \frac{\sqrt{1 + \frac{C_1}{C_0}}}{2\pi\sqrt{L_1 C_1}} \quad \text{(Equation 9)}$$

According to equations 5, 6, 8, and 9, the graph on the right side of FIG. 5B shows that, when the impedance element $X_1$ is a capacitor, the anti-resonant frequencies fa_on and fa_off1 coincide with each other regardless of whether the switch SW is ON or OFF, and the resonant frequency (fr_off1) when the switch SW is OFF is positioned on the higher-frequency side than the resonant frequency (fr_on) when the switch SW is ON.

(2) When the Impedance Element $X_1$ is an Inductor $L_t$

The resonant frequency fr_off2 (the lower resonant frequency_fr_off2L and the higher resonant frequency fr_Off2H in FIG. 5B) when the switch SW is OFF is the frequency at which the impedance Z of the above-described equivalent circuit is 0. Accordingly, the resonant frequency fr_off2 is expressed by equation 11 as a result of solving equation 10.

[Math. 10]

$$Z = 0 = \frac{1}{\frac{1}{j\omega C_0} + \frac{1}{j\omega L_1} + \frac{1}{j\omega C_1}} + j\omega L_t \quad \text{(Equation 10)}$$

-continued

[Math. 11]

$$f_{r\_off2L} = \frac{\sqrt{\frac{-b - \sqrt{b^2 - 4ac}}{2a}}}{2\pi} \quad \text{(Equation 11)}$$

$$f_{r\_off2H} = \frac{\sqrt{\frac{-b + \sqrt{b^2 - 4ac}}{2a}}}{2\pi}$$

$$a = L_1 L_t C_0 C_1$$

$$b = -L_1 C_1 - L_t C_0 - L_t C_1$$

$$c = 1$$

In equation 11, fr_off2L (FIG. 5B) is the lower resonant frequency when the switch SW is OFF, while fr_off2H (FIG. 5B) is the higher resonant frequency when the switch SW is OFF.

The anti-resonant frequency fa_off2 (not shown) when the switch SW is OFF is the same as the anti-resonant frequency fa_on when the switch SW is ON, and is expressed by equation 12.

[Math. 12]

$$f_{a\_off2} = \frac{\sqrt{1 + \frac{C_1}{C_0}}}{2\pi\sqrt{L_1 C_1}} \quad \text{(Equation 12)}$$

According to equations 5, 6, 11, and 12, the graph on the right side of FIG. 5B shows that, when the impedance element $X_1$ is an inductor, the anti-resonant frequencies fa_on and fa_off2 coincide with each other regardless of whether the switch SW is ON or OFF. The graph on the right side of FIG. 5B also shows that the resonant frequency (fr_off2L) when the switch SW is OFF is positioned on the lower-frequency side than the resonant frequency (fr_on) when the switch SW is ON.

[1-4-3. Parallel Connection of Impedance Element to Resonator]

The resonance characteristics of a resonator when an impedance element is connected in parallel with the resonator will now be discussed below. In this case, the resonance characteristics when the impedance element is a capacitor $C_t$ will be discussed, and the resonance characteristics when the impedance element is an inductor will not be discussed. The equivalent circuit model of this configuration is a circuit model in which a capacitor $C_t$ is connected in parallel with the equivalent circuit model shown in FIG. 5A, and an explanation thereof will thus be simplified.

When the impedance element $X_1$ is a capacitor $C_t$, the capacitor $C_t$ is connected in parallel with the capacitor $C_0$ in the equivalent circuit model shown in FIG. 5A. The resonant frequency of such an equivalent circuit is expressed by the equation in which $C_0$ in equation 5 is replaced by the combined capacitance $(C_0+C_t)$ of the capacitor $C_0$ and the capacitor $C_t$, and is found to be the same as that of a single resonator. It is seen from equation 6 that the anti-resonant frequency of this equivalent circuit becomes lower than that of the single resonator.

[1-5. Electrode Structure of Radio-Frequency Filter]

Details of the electrode structure of the radio-frequency filter 10 will now be described below.

[1-5-1. Overall Structure]

Figures 6A, 6B, 6C:
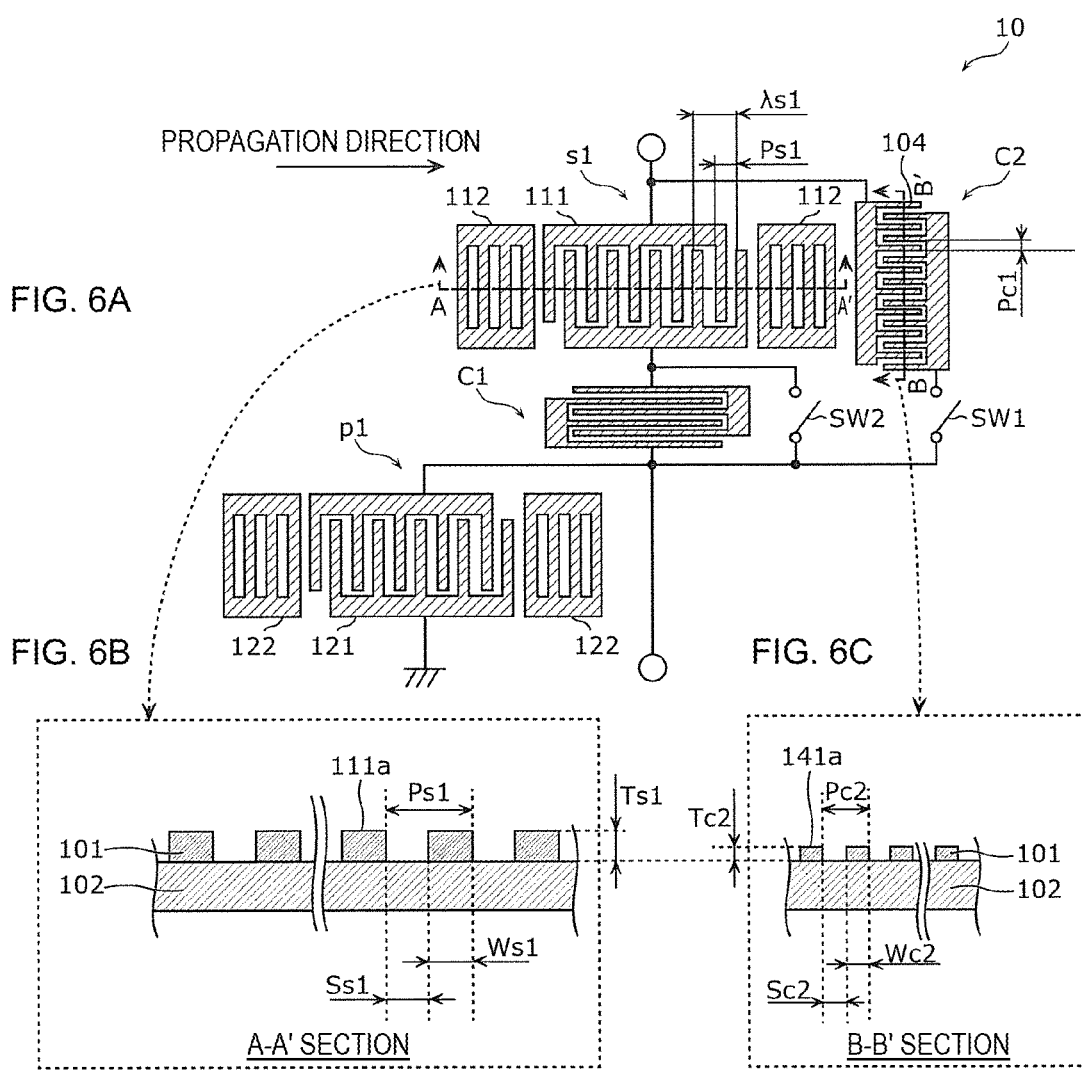
FIGS. 6A, 6B and 6C show schematic views illustrating the electrode structure of the radio-frequency filter according to the first example.

FIGS. 6A, 6B and 6C show schematic views illustrating the electrode structure (electrode layout) of the radio-frequency filter 10 according to the first example. More specifically, FIG. 6A is a plan view of the electrode structure, FIG. 6B is a sectional view taken along line A-A' of FIG. 6A, and FIG. 6C is a sectional view taken along line B-B' of FIG. 6A. The electrode structure shown in FIGS. 6A, 6B and 6C is illustrated for explaining the typical structure of each resonator forming the radio-frequency filter 10 and interdigital capacitor electrodes forming the capacitors C1 and C2. The numbers and the lengths of electrode fingers forming the IDT electrode of each resonator and those forming the interdigital capacitor electrodes of the radio-frequency filter 10 are not restricted to those shown in FIGS. 6A, 6B and 6C. The switches SW1 and SW2 are also schematically illustrated in FIG. 6A. However, the position and structure of the switches SW1 and SW2 are not particularly restricted. For example, the switches SW1 and SW2 may be formed on a different chip from that on which the resonators and the interdigital capacitor electrodes are formed.

As shown in FIGS. 6A, 6B and 6C, each of the resonators (series arm resonator s1 and parallel arm resonator p1) forming the radio-frequency filter 10 is an acoustic wave resonator using acoustic waves, for example. The radio-frequency filter 10 can thus be formed by using interdigital transducer (IDT) electrodes formed on a piezoelectric substrate 102, which is a substrate at least partly exhibiting piezoelectricity. This makes it possible to implement a small-size, low-height filter circuit exhibiting the bandpass characteristics having the improved sharpness.

The series arm resonator s1 includes an IDT electrode 111 constituted by plural electrode fingers 111a (FIG. 6B), a pair of reflectors 112, and the piezoelectric substrate 102.

As shown in FIG. 6A and FIG. 6B, the IDT electrode 111 of the series arm resonator s1 is constituted by an electrode film 101, which is formed on the piezoelectric substrate 102.

The IDT electrode 111 is formed as follows. The IDT electrode 111 includes the plural electrode fingers 111a and a pair of busbar electrodes which oppose each other with the plural electrode fingers 111a interposed therebetween. The plural electrode fingers 111a are alternately connected to one and the other busbar electrodes. The plural electrode fingers 111a are formed along the direction perpendicular to the propagation direction of acoustic waves and are regularly arranged along the propagation direction.

In the series arm resonator s1 configured as described above, the wavelength of acoustic waves to be excited is determined by the design parameters of the IDT electrode 111, for example. The design parameters of the IDT electrode 111 will be discussed below.

The wavelength of acoustic waves is determined by the repeating period $\lambda s1$ of the electrode fingers 111a (FIG. 6B) connected to one busbar electrode among the electrode fingers 111a. The electrode finger pitch (pitch of the plural electrode fingers 111a, that is, the electrode finger period) Ps1, is ½ of the repeating period $\lambda s1$. The electrode finger pitch Ps1 is also defined by Ps1=(Ws1+Ss1) where Ws1 indicates the line width of each electrode finger 111a and Ss1 indicates the space width between adjacent electrode fingers 111a. The electrode duty (duty ratio) is the ratio of the line width of each of the plural electrode fingers 111a, and is defined by the ratio of the line width to the total width of the line width and the space width of the plural electrode fingers 111a, that is, the electrode duty is defined by Ws1/(Ws1+

Ss1). In other words, the electrode duty is defined by the ratio of the width of each of the plural electrode fingers 111a to the electrode finger pitch (pitch of the plural electrode fingers 111a), that is, by Ws1/Ps1. The number of pairs is the number of pairs of electrode fingers 111a, and is roughly half the total number of electrode fingers 111a. For example, Mp1=2Np1+1 is satisfied where Np1 is the number of pairs of electrode fingers 111a and Mp1 is the total number of electrode fingers 111a. The film thickness Ts1 of the electrode fingers 111a is the thickness of the electrode film 101 forming the electrode fingers 111a. The electrostatic capacity $C_0$ of the acoustic wave resonator is expressed by equation 13.

[Math. 13]

$$\text{Electrostatic capacity } C_0 = \frac{\varepsilon_0 \cdot \varepsilon_r \cdot \text{Number of pairs of electrode fingers} \cdot \text{Intersecting width}}{2 \cdot (1 - \text{Electrode duty})} \quad \text{(Equation 13)}$$

$\varepsilon_0$ is a dielectric constant in a vacuum, and $\varepsilon_r$ is a dielectric constant of the piezoelectric substrate 102.

The structure of the capacitors C1 and C2 will now be discussed below. The capacitors C1 and C2 have similar structures, except for the design parameters required for the specifications. The structure of the capacitor C2 will thus be discussed below while omitting an explanation of the structure of the capacitor C1.

The capacitor C2 includes the piezoelectric substrate 102 and an interdigital capacitor electrode 104 formed on the piezoelectric substrate 102. The interdigital capacitor electrode 104 is constituted by plural electrode fingers 141a. As shown in FIG. 6A and FIG. 6C, the interdigital capacitor electrode 104 is constituted by the electrode film 101, as in the IDT electrode 111. That is, the interdigital capacitor electrode 104 forming the capacitor C2 is formed on the same piezoelectric substrate 102 as the IDT electrode 111 forming the serial arm resonator s1. However, the interdigital capacitor electrode 104 and the IDT electrode 111 may alternatively be formed on different substrates.

The interdigital capacitor electrode 104 is formed as follows. The interdigital capacitor electrode 104 includes plural electrode fingers 141a and a pair of busbar electrodes which oppose each other with the plural electrode fingers 141a interposed therebetween. The plural electrode fingers 141a are alternately connected to one and the other busbar electrodes. The plural electrode fingers 141a are formed in the propagation direction of acoustic waves and are regularly arranged in the direction perpendicular to the propagation direction.

In the capacitor C2 configured as described above, the characteristics, such as the capacitance and the Q factor, are determined by the design parameters of the interdigital capacitor electrode 104, for example. The design parameters of the interdigital capacitor electrode 104 will be discussed below.

The electrode finger pitch (pitch of the electrode fingers, that is, the electrode finger period) Pc2 (FIG. 6C) of the interdigital capacitor electrode 104 is defined by Pc2=Wc2+Sc2 where Wc2 is the line width of each of the electrode fingers 141a and Sc2 is the space width between adjacent electrode fingers 141a. The electrode duty (duty ratio) is the ratio of the line width of each of the plural electrode fingers 141a, and is defined by the ratio of the line width to the total width of the line width and the space width of the plural electrode fingers 141a, that is, the electrode duty is defined by Wc2/(Wc2+Sc2). In other words, the electrode duty is defined by the ratio of each of the width of each of the plural electrode fingers 141a to the pitch of the plural electrode fingers 141a, that is, by Wc2/Pc2. The film thickness of the electrode fingers 141a is the thickness Tc2 of the electrode film 101 forming the electrode fingers 141a.

The design parameters of the interdigital capacitor electrode 104 forming the capacitor C2 and those of the IDT electrode 111 forming the series arm resonator s1 connected to the capacitor C2 will be discussed below in comparison with each other.

The electrode finger pitch of the capacitor C2 is narrower than that of the series arm resonator s1. That is, Pc2<Ps1 is satisfied. The pitch of the plural electrode fingers 141a of the capacitor C2 is preferably 80% or smaller of the pitch of the plural electrode fingers 111a of the series arm resonator s1 (that is, Pc2≤0.8×Ps1=0.4×λXs1).

The film thickness of the plural electrode fingers 141a of the capacitor C2 is smaller than that of the plural electrode fingers 111a of the series arm resonator s1. That is, Tc2<Ts1 is satisfied. Because of the manufacturing reason, the film thickness Tc2 of the electrode fingers 141a is preferably 40% or smaller of the electrode finger pitch Pc2 of the capacitor C2 (that is, Tc2≤0.40×Pc2). For a similar reason, the film thickness Ts1 of the electrode fingers 111a is preferably 40% or smaller of the electrode finger pitch Ps1 of the series arm resonator s1 (that is, Ts1≤0.40×Ps1). Although the minimum value of the film thickness Tc2 of the electrode fingers 141a is not particularly restricted, it may be 15% or greater of the electrode finger pitch Pc2 (that is, 0.15×Pc2≤Tc2). Likewise, although the minimum value of the film thickness Ts1 of the electrode fingers 111a is not particularly restricted, it may be 15% or greater of the electrode finger pitch Ps1 (that is, 0.15×Ps1≤Ts1).

The electrode duty of the capacitor C2 is preferably greater than that of the series arm resonator s1. That is, the capacitor C2 and the series arm resonator s1 preferably satisfy Wc2/Pc2>Ws1/Ps1. With this configuration, the capacitance per unit area of the interdigital capacitor electrode 104 is increased, thereby making it possible to reduce the size of the radio-frequency filter and also to enhance the space-saving characteristics.

In each of the elements (such as series arm resonator s1, parallel arm resonator p1, and capacitor C2), each of the electrode finger pitch, film thickness, electrode duty is not necessarily uniform due to the variations in the manufacturing process or adjustments made to the characteristics, for example. Each of the interdigital capacitor electrode forming the capacitor C2 and the IDT electrode forming the parallel arm resonator s1 may not entirely satisfy the above-described relationships regarding the electrode finger pitch, film thickness, and electrode duty. However, it is sufficient if the above-described relationships regarding the electrode finger pitch, film thickness, and electrode duty between the capacitor C2 and the series arm resonator s1 are substantially satisfied. For example, it is sufficient if the above-described relationships between the average of each of the electrode finger pitch, film thickness, and electrode duty of the capacitor C2 and that of the series arm resonator s1 are satisfied.

The relationships concerning the electrode finger pitch, film thickness, and electrode duty between the capacitor C2 and the series arm resonator s1 have been discussed by way of example. The relationships between the capacitor C1 and the series arm resonator s1 may have relationships similar to those described above. Similar relationships may be implemented in at least one of the relationship between the capacitor C1 and the series arm resonator s1 and the relationship between the capacitor C2 and the series arm resonator s1.

[1-5-2. Characteristics of Capacitors]

In the radio-frequency filter 10 of the first example, the electrode finger pitch and the film thickness of the series arm resonator s1 and those of the capacitors C1 and C2 satisfy the above-described relationships. It is thus possible to achieve both of the required Q factor of the series arm resonator s1 and the required Q factors of the capacitors C1 and C2.

This is due to the fact that the characteristics of the capacitors C1 and C2 are determined by the design parameters. The reason why the above-described advantage is achieved will be explained below through illustration of a case in which the switch SW1 is OFF and the switch SW2 is ON by using the capacitor C2 in a typical example.

[1-5-3. Relation to Electrode Finger Pitch]

The relation between the electrode finger pitch and the characteristics of the capacitor C2 in a typical example will first be discussed. The design parameters other than the electrode finger pitch are fixed. The electrode duty is 0.60 (that is, Wc2/Pc2=0.55), and the ratio of the film thickness to the electrode finger pitch is 0.20 (that is, Tc2=0.20×Pc2). The electrode finger pitch of the series arm resonator s1 is 2.12 μm.

FIGS. 7A, 7B, 7C and 7D show graphs illustrating the relationships of the electrode finger pitch of the capacitor C2 to the capacitance and capacitor Q factor of the capacitor C2, the impedance of the series arm circuit 11, and the filter characteristics in a typical example. More specifically, FIGS. 7A, 7B, 7C and 7D illustrate the frequency characteristics when the electrode finger pitch Pc2 is varied among 0.75, 1.75, 2.50, and 4.00 (unit is μm). The characteristics shown in FIGS. 7A, 7B, 7C and 7D are obtained when the switch SW1 is ON and the switch SW2 is OFF. That is, the series arm circuit 11 is represented by a series circuit of the series arm resonator s1 and the capacitor C2.

As shown in FIG. 7A, the capacitance remains almost the same even though the electrode finger pitch Pc2 is varied. In this case, the capacitance is the capacitance (electrostatic capacity) in a low-frequency range where the influences caused by the self-resonance of the interdigital capacitor are almost negligible. The self-resonant point of the capacitor C2 shifts to the higher-frequency side as the electrode finger pitch Pc2 is narrower.

As shown in FIG. 7B, although the Q factor (capacitor Q) of the capacitor C2 roughly progressively decreases as the frequency becomes higher, it is locally decreased at the self-resonant point. Accordingly, if the electrode finger pitch Pc2 is set to be small to shift the self-resonant point of the interdigital capacitor to the higher-frequency side than the pass band of the radio-frequency filter 10, the Q factor of the interdigital capacitor in the pass band can be increased.

In other words, as the electrode finger pitch Pc2 is wider, the self-resonant point of the capacitor C2 shifts to the lower-frequency side. This may cause the frequency at the self-resonant point to coincide with the frequency at the resonant point or the anti-resonant point of the series arm resonator s1, which is connected to the capacitor C2 without having another acoustic wave resonator interposed therebetween. That is, the resonant point or the anti-resonant point of the series arm resonator s1 may coincide with the frequency at which the capacitor Q is locally decreased. In this case, the Q factor at the resonant point or the anti-resonant point obtained by the combined characteristics of the series arm resonator s1 and the capacitor C2 is decreased due to the locally decreased Q factor of the capacitor C2. This makes it difficult to achieve the required Q factor. Because of the above-described reason, the electrode finger pitch Pc2 is decreased so as to shift the self-resonant point of the capacitor C2 to the higher-frequency side than the resonant point and the anti-resonant point of the series arm resonator s1. This makes it less likely to reduce the Q factor of the combined characteristics of the series arm resonator s1 and the capacitor C2. As a result, the required Q factor is achieved.

As the electrode finger pitch Pc2 is smaller, the size of the interdigital capacitor can be reduced while maintaining the capacitance. It is thus possible to reduce the size of a radio-frequency filter including the capacitor C2, and also to enhance the space-saving characteristics.

Figure 7E:
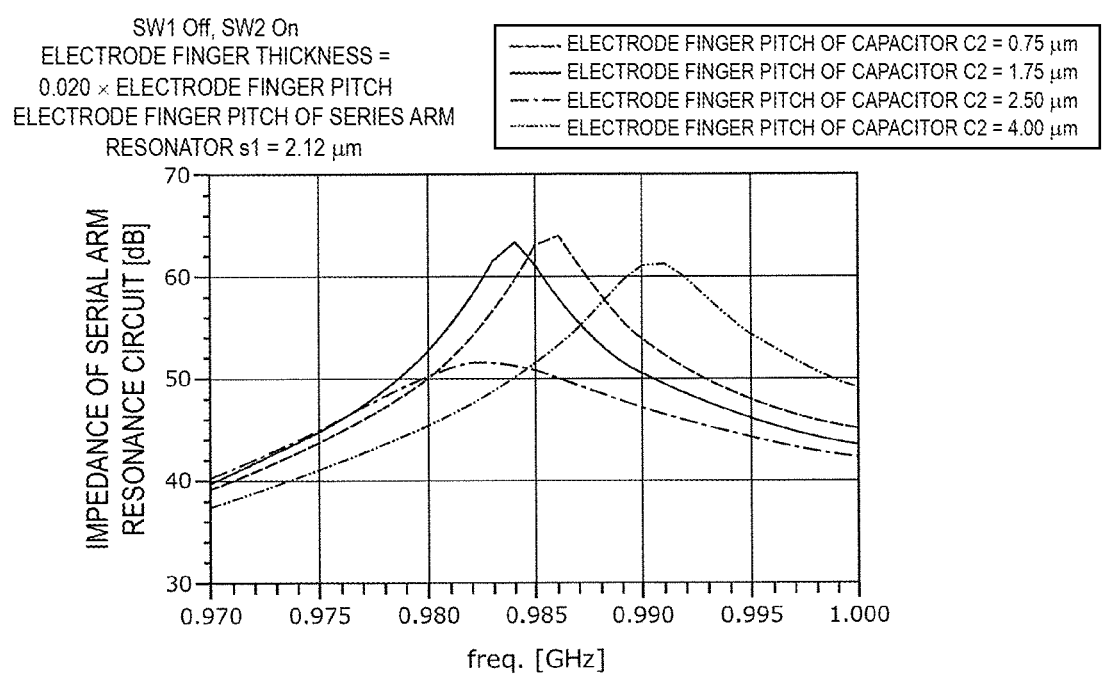
FIG. 7E is an enlarged graph illustrating the characteristics in the vicinity of the portion indicated by the broken-line circle in the graph of FIG. 7C.

FIG. 7E is an enlarged graph illustrating the characteristics in the vicinity of the portion indicated by the broken-line circle in the graph of FIG. 7C. More specifically, FIG. 7E illustrates the impedance characteristics at and around the anti-resonant frequency of the series arm circuit 11.

As shown in FIGS. 7A, 7B, 7C and 7D, as the electrode finger pitch of the capacitor C2 becomes wider, the frequency at the self-resonant point of the capacitor C2 shifts to the lower-frequency side, thereby decreasing the capacitor Q factor. Accordingly, as shown in FIG. 7E, when the switch SW1 is ON, as the electrode finger pitch of the capacitor C2 becomes closer to that of the series arm resonator s1, the Q factor at the anti-resonant point of the series arm circuit 11 is decreased due to the reduced capacitor Q factor. Table 2 shows the relationships between the electrode finger pitch of the capacitor C2 and the Q factor at the anti-resonant point (Qa) of the series arm circuit 11.

TABLE 2

| Electrode finger pitch of capacitor C2 [μm] | Q factor at anti-resonant point of series arm circuit [a.u.] |
|---|---|
| 0.75 | 379 |
| 1.75 | 364 |
| 2.50 | 101 |
| 4.00 | 235 |

A decrease in the Q factor increases the loss and decreases the attenuation characteristics at the high edge of the pass band (see FIG. 7C and FIG. 7D). It is thus necessary to set the electrode finger pitch of the capacitor C2 to be smaller than that of the series arm resonator s1 and also to set the film thickness of the capacitor C2 to be thinner than that of the series arm resonator s1.

The relationships of the electrode finger pitch to the characteristics have been discussed through illustration of the capacitor C2. The capacitor C1 also has relationships similar to those described above. More specifically, as the electrode finger pitch of the capacitor C1 becomes wider, the frequency at the self-resonant point of the capacitor C1 shifts to the lower-frequency side, thereby decreasing the capacitor Q factor. Accordingly, when the switch SW1 is OFF, as the electrode finger pitch of the capacitor C1 becomes closer to that of the series arm resonator s1, the Q factor at the resonant point of the series arm circuit 11 is decreased due to the reduced capacitor Q factor. This leads to an increase in the loss in the pass band and at the high edge of the pass band. It is thus necessary to set the electrode finger pitch of the capacitor C1 to be smaller than that of the series arm resonator s1 and also to set the film thickness of the capacitor C1 to be thinner than that of the series arm resonator s1.

As described above, the self-resonant point of a capacitor constituted by an interdigital capacitor electrode shifts to the higher-frequency side as the electrode finger pitch is narrower. In the first example, the electrode finger pitch of the interdigital capacitor electrode is set to be smaller than the pitch of the electrode fingers 111a of the series arm resonator s1 so as to shift the self-resonant point of the interdigital capacitor electrode to the higher-frequency side than the pass band of the radio-frequency filter 10. This can enhance the Q factors of the capacitors C1 and C2 in the pass band and in the vicinity of the higher-frequency side of the pass band. It is thus possible to regulate the loss in the pass band and/or to enhance the sharpness of the attenuation slope on the higher-frequency side of the pass band. More specifically, increasing the Q factor of the capacitor C1 can regulate the loss in the pass band, and increasing the Q factor of the capacitor C2 can widen the attenuation band in the vicinity of the higher-frequency side of the pass band.

Because of the manufacturing reason, the pitch of electrode fingers is restricted by the film thickness of the electrode fingers. Accordingly, the film thickness of the electrode fingers of a capacitor constituted by an interdigital capacitor electrode is set to be smaller than that of a series arm resonator, thereby making it possible to reduce the pitch of the electrode fingers of the capacitor to be even smaller. This makes it easier to achieve both of the required Q factor of the series arm resonator s1 and that of the capacitor. As a result of obtaining the required Q factor of the series arm resonator s1 and the required Q factors of the capacitors C1 and C2, it is possible to further regulate the loss in the pass band and/or to further enhance the sharpness of the attenuation slope on the higher-frequency side of the pass band.

Second Embodiment

In the above-described first embodiment, the switch SW2 (second switch) is connected in parallel with the capacitor C1 (first capacitor). However, the provision of the switch SW2 may be omitted. In a second embodiment, a radio-frequency filter configured in this manner will be described below through illustration of an example (second example).

[2-1. Configuration]

Figure 8:
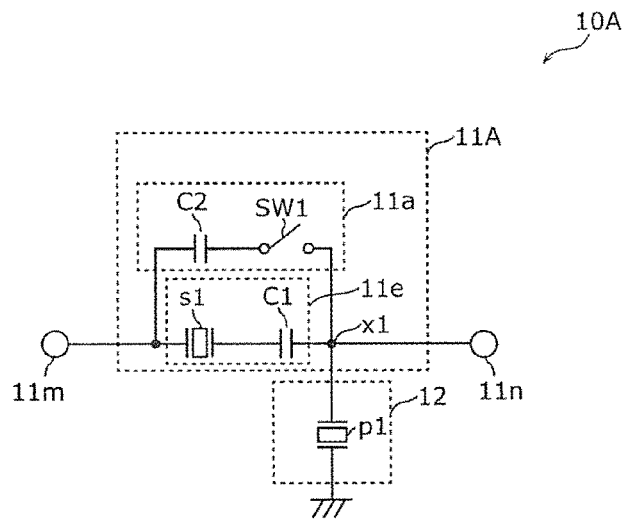
FIG. 8 is a circuit diagram of a radio-frequency filter according to an example (second example) of a second embodiment.

FIG. 8 is a circuit diagram of a radio-frequency filter 10A according to the second example.

As shown in FIG. 8, a series arm circuit 11A in the second example is different from the series arm circuit 11 in the first example in that it does not include a switch SW2. That is, the series arm circuit 11A includes a series arm resonator s1, a capacitor C1 (first capacitor) connected in series with the series arm resonator s1, and a first variable frequency circuit 11a which varies the anti-resonant frequency of the series arm circuit 11A.

In the radio-frequency filter 10A configured as described above, too, as in the first example, it is possible to vary the frequency of the attenuation pole on the higher-frequency side of the pass band substantially without increasing the loss at the high edge of the pass band as a result of the switch SW1 being switched between ON and OFF.

[2-2. Characteristics]

Figure 9A:
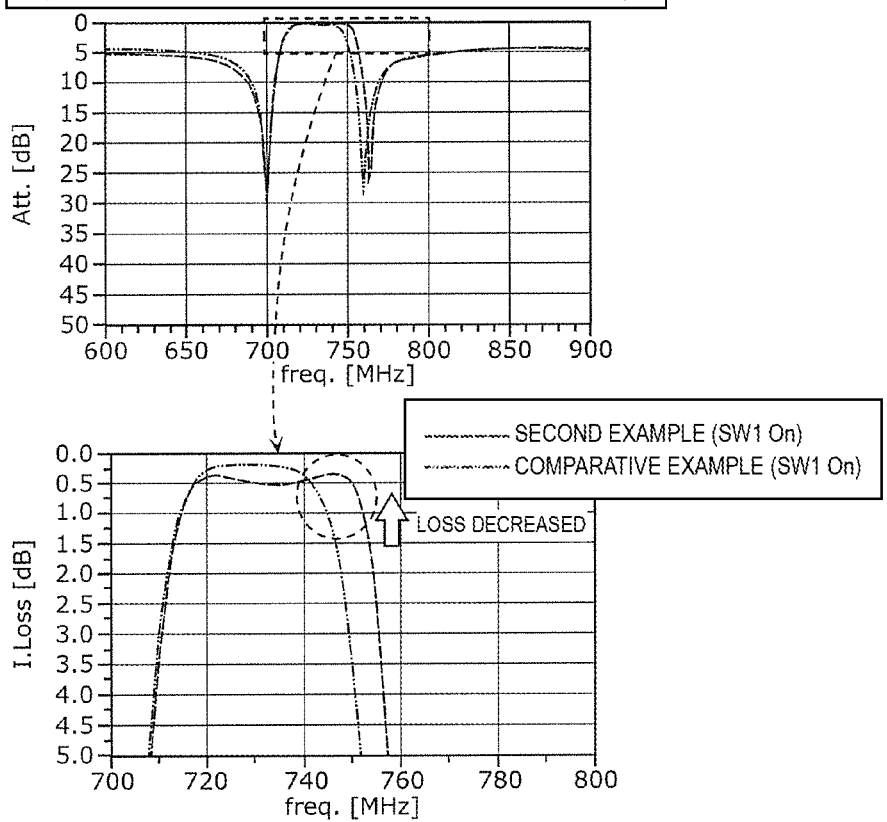
FIG. 9A shows graphs illustrating a comparison between the characteristics of the radio-frequency filter of the second example and those of a comparative example in the case of lower-frequency shifting.
Figure 9B:
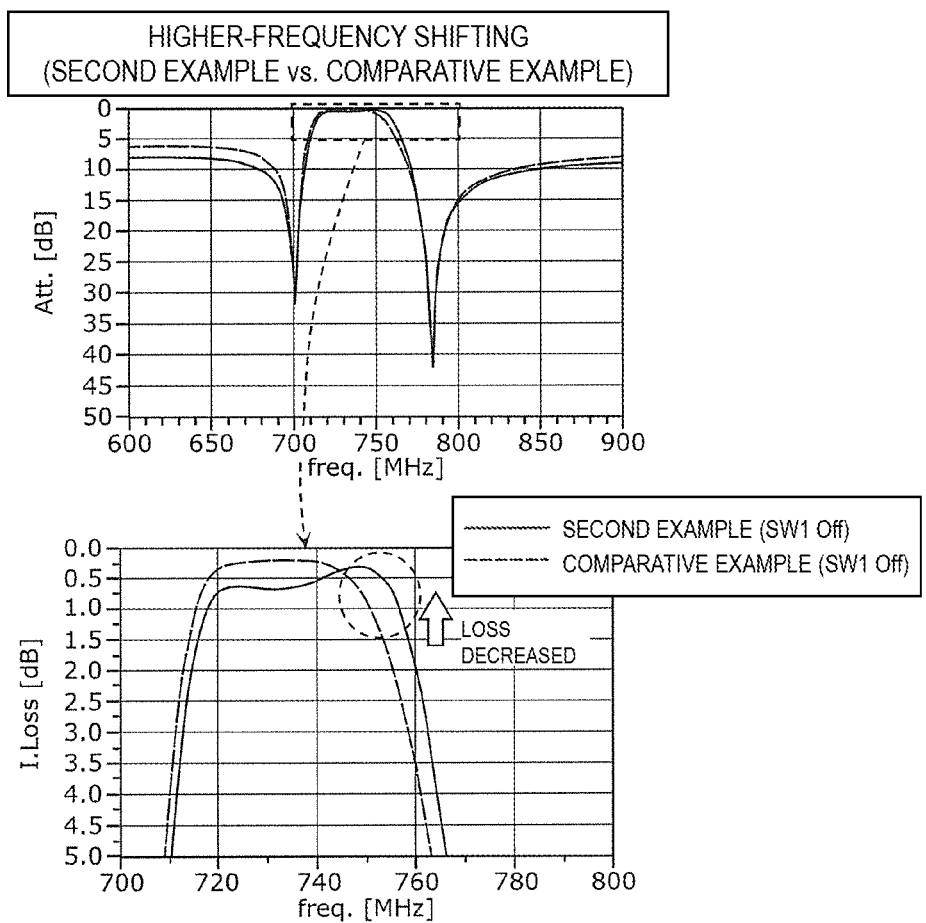
FIG. 9B shows graphs illustrating a comparison between the characteristics of the radio-frequency filter of the second example and those of the comparative example in the case of higher-frequency shifting.

FIG. 9A shows graphs illustrating a comparison between the characteristics of the radio-frequency filter of the second example and those of a comparative example in the case of lower-frequency shifting. FIG. 9B shows graphs illustrating a comparison between the characteristics of the radio-frequency filter of the second example and those of the comparative example in the case of higher-frequency shifting.

FIGS. 9A and 9B show that, both in the case of lower-frequency shifting and that of higher-frequency shifting, the loss at the high edge of the pass band in the second example is smaller than that in the comparative example.

In the second example, as well as in the first example, since the series arm resonator s1 and the capacitor C1 (first capacitor) are connected in series with each other, the resonant frequency of the series connecting circuit 11e (first series connecting circuit) constituted by the series arm resonator s1 and the capacitor C1 becomes higher than that of the single series arm resonator s1. That is, the series connecting circuit 11e can decrease the difference between the resonant frequency and the anti-resonant frequency to be smaller than the single series arm resonator s1. In the second example, advantages similar to those of the first example are thus achieved. That is, according to the second example, it is possible to vary the frequency of the attenuation pole on the higher-frequency side of the pass band substantially without increasing the loss at the high edge of the pass band.

Third Embodiment

In the first and second embodiments, the resonant frequency or the anti-resonant frequency of the parallel arm circuit is fixed. However, as in the series arm circuit, the resonant frequency or the anti-resonant frequency of the parallel arm circuit may be variable. Additionally, although one parallel arm resonator is provided in the parallel arm circuit in the first and second embodiments, plural parallel arm resonators may be disposed. In a third embodiment, such a radio-frequency filter will be described below through illustration of an example (third example).

[3-1. Configuration]

Figure 10A:
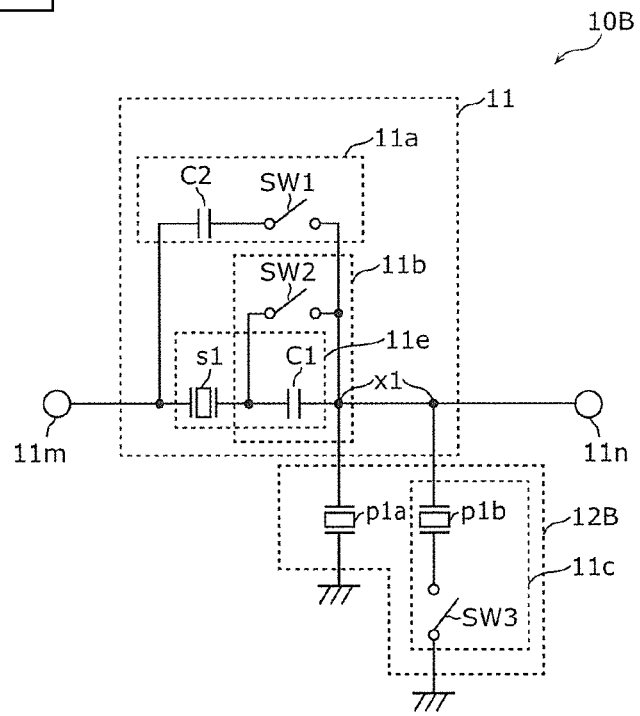
FIG. 10A is a circuit diagram of a radio-frequency filter according to an example (third example) of a third embodiment.

FIG. 10A is a circuit diagram of a radio-frequency filter 10B according to the third example.

As shown in FIG. 10A, a parallel arm circuit 12B in the third example includes a parallel arm resonator p1a (first parallel arm resonator), a parallel arm resonator p1b (second parallel arm resonator), and a switch SW3 (third switch). The parallel arm resonator p1b and the switch SW3 are connected in series with each other, and this series connecting circuit forms a third variable frequency circuit 11c.

The parallel arm resonator p1a is a resonator (first parallel arm resonator) disposed on a parallel arm connecting a node x1 and a ground, and is connected between the node x1 and the ground.

The third variable frequency circuit 11c is a series connecting circuit constituted by the parallel arm resonator p1b (second parallel arm resonator) and the switch SW3 (third switch), and is connected in parallel with the parallel arm resonator p1a (first parallel arm resonator). The third variable frequency circuit 11c varies the resonant frequency and the anti-resonant frequency of the parallel arm circuit 12B. More specifically, the third variable frequency circuit 11c varies the resonant frequency and the anti-resonant frequency as a result of the switch SW3 being switched between ON and OFF in accordance with a control signal from a controller (not shown), such as an RFIC.

In the third example, the parallel arm resonator p1b and the switch SW3 forming the third variable frequency circuit 11c are connected in this order as viewed from the node x1. However, the connection order may be reversed. If the switch SW3 is disposed closer to the node x1 than the parallel arm resonator p1b is, the loss of the radio-frequency filter 10B is increased due to the resistance components (ON resistance) of the switch SW3 which is in the ON state. It is thus preferable that the switch SW3 is disposed closer to a ground than the parallel arm resonator p1b is.

In the third example, when the switch SW1 (first switch) in the first variable frequency circuit 11a is ON, the switch SW2 (second switch) in the second variable frequency circuit 11b and the switch SW3 (third switch) in the third variable frequency circuit 11c are also ON, and when the switch SW1 is OFF, the switch SW2 and the switch SW3 are also OFF. That is, the switches SW1, SW2, and SW3 are turned ON together or turned OFF together. Consequently, fewer control lines are required for controlling the switches SW1, SW2, and SW3, thereby making it possible to simplify the configuration. That is, the same control circuit can be used for the switches SW1 through SW3, thereby reducing the size of the radio-frequency filter 10B. Alternatively, the switches SW1 through SW3 may be turned ON or OFF individually.

The switch SW3 is an SPST switch element and is configured similarly to the switches SW1 and SW2.

In the above-described configuration, too, as in the first example, it is possible to vary the frequency of the attenuation pole on the higher-frequency side of the pass band substantially without increasing the loss at the high edge of the pass band as a result of the switch SW1 (first switch) and the second switch SW2 (second switch) being switched between ON and OFF. Additionally, in the above-described configuration, a second series connecting circuit (that is, the third variable frequency circuit 11c in the third example), which is a series connecting circuit of the parallel arm resonator p1b (second parallel arm resonator) and the switch SW3 (third switch), is connected in parallel with the parallel arm resonator p1a (first parallel arm resonator). It is thus possible to vary the resonant frequency and the anti-resonant frequency of the parallel arm circuit 12B as a result of the switch SW3 being switched between ON and OFF.

[3-2. Characteristics]

The filter characteristics (bandpass characteristics) of the radio-frequency filter 10B of the third example will be discussed below while also referring to the impedance characteristics (resonance characteristics) which determine the filter characteristics.

The circuit constants of the radio-frequency filter 10B of the third example are shown in Table 3.

TABLE 3

|  | Series arm resonator s1 | Parallel arm resonator p1a | Parallel arm resonator p1b | Capacitor C1 | Capacitor C2 |
| --- | --- | --- | --- | --- | --- |
| Electrostatic capacity Cap. [pF] | 2.0 | 5.0 | 1.0 | 2.0 | 7.0 |
| Resonant frequency fr [MHz] | 730 | 700 | 785 | | |
| Anti-resonant frequency fa [MHz] | 788 | 756 | 848 | | |

As shown in this table, the resonant frequency of the parallel arm resonator p1a (first parallel arm resonator) is lower than that of the series arm resonator s1, and the resonant frequency of the parallel arm resonator p1b (second parallel arm resonator) is higher than that of the parallel arm resonator p1a. The anti-resonant frequency of the parallel arm resonator p1b is higher than that of the parallel arm resonator p1a.

Figure 10B:
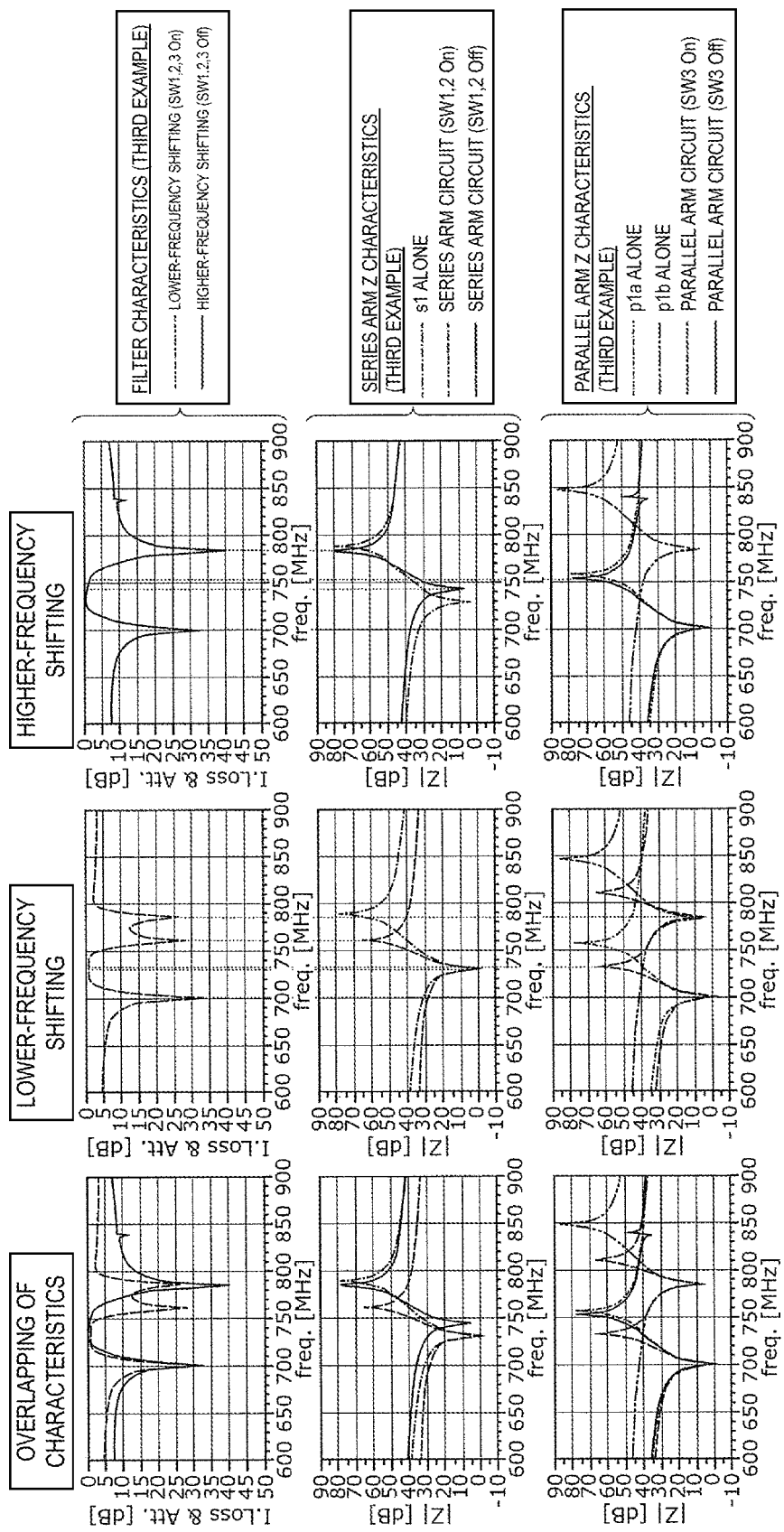
FIG. 10B shows graphs illustrating various characteristics concerning the radio-frequency filter of the third example.

FIG. 10B shows graphs illustrating various characteristics concerning the radio-frequency filter 10B. More specifically, the top section of FIG. 10B shows a graph in which the filter characteristics in two states, that is, the filter characteristics in a state in which the switches SW1 through SW3 are all ON (lower-frequency shifting) and those in a state in which the switches SW1 through SW3 are all OFF (higher-frequency shifting), overlap each other. The top section of FIG. 10B also shows graphs illustrating the individual filter characteristics of the two states. The middle section of FIG. 10B illustrates the impedance characteristics of the series arm circuit 11 corresponding to the filter characteristics illustrated in the respective graphs in the top section. The bottom section of FIG. 10B illustrates the impedance characteristics of the parallel arm circuit 12B corresponding to the filter characteristics illustrated in the respective graphs in the top section. Concerning the impedance characteristics of the series arm circuit 11, the impedance characteristics of the series arm resonator s1 alone, those of the series arm circuit 11 when the switches SW1 and SW2 are both ON, and those of the series arm circuit 11 when the switches SW1 and SW2 are both OFF are shown. Concerning the impedance characteristics of the parallel arm resonator 12B, the impedance characteristics of the parallel arm resonator p1a alone, those of the parallel arm resonator p1b alone, those of the parallel arm circuit 12B when the switch SW3 is ON, and those of the parallel arm circuit 12B when the switch SW3 is OFF are shown. Various characteristics concerning a radio-frequency filter of a fourth example, which will be discussed later, are also represented in graphs (see FIG. 16B) in a similar manner.

A description will first be given of the characteristics when the switches SW1 through SW3 are all OFF (higher-frequency shifting) in the circuit configuration shown in FIG. 10A.

In this case, the characteristics of the series arm circuit 11 are similar to those when the switches SW1 and SW2 are both OFF in the first example. The graph in the middle section of the right side in FIG. 10B shows that the anti-resonant frequency of the series arm circuit 11 becomes slightly lower than that of the series arm resonator s1, while the resonant frequency of the series arm circuit 11 becomes much higher than that of the series arm resonator s1.

In this case, the parallel arm circuit 12B is in the state in which the third variable frequency circuit 11c including the OFF switch SW3 is connected in parallel with the parallel arm resonator p1a. The graph in the bottom section of the right side in FIG. 10B shows that the parallel arm circuit 12B has two resonant frequencies and two anti-resonant frequencies. More specifically, the parallel arm circuit 12B has a first resonant frequency, which is equal to the resonant frequency of the parallel arm resonator p1a, a second resonant frequency, which is higher than the resonant frequency of the parallel arm resonator p1b, a first anti-resonant frequency, which is positioned between the first and second resonant frequencies, and a second anti-resonant frequency, which is lower than the anti-resonant frequency of the parallel arm resonator p1b. This will be discussed in detail below.

In the parallel arm circuit 12B, ideally, when the switch SW3 is OFF, the impedance of the switch SW3 becomes infinite so as to make the parallel arm resonator p1b ineffective. The parallel arm circuit 12B thus has the resonant frequency and the anti-resonant frequency of the parallel arm resonator p1a. In contrast, when the switch SW3 is ON, the parallel arm resonator p1b becomes effective, and the parallel arm circuit 12B is represented by a parallel connecting circuit of the parallel arm resonators p1a and p1b. The parallel arm circuit 12B thus has a first resonant frequency, which is equal to the resonant frequency of the parallel arm resonator p1a, a second resonant frequency, which is equal to the resonant frequency of the parallel arm resonator p1b, a first anti-resonant frequency, which is higher than the first resonant frequency and is lower than the anti-resonant frequency of the parallel arm resonator p1a, and a second anti-resonant frequency, which is higher than the second resonant frequency and is lower than the anti-resonant frequency of the parallel arm resonator p1b.

In this manner, ideally, the parallel arm circuit 12B is able to change the number and the frequencies of resonant points and those of anti-resonant points as a result of the switch SW3 being switched between ON and OFF. Hence, when the switch SW3 is switched from OFF to ON, the cut-off frequency on the higher-frequency side of the pass band ideally shifts to the lower-frequency side, and also, another attenuation pole determined by the resonant frequency of the parallel arm resonator p1b is ideally formed on the higher-frequency side of the pass band. That is, in the case of lower-frequency shifting, another attenuation pole is formed on the higher-frequency side of the pass band, thereby increasing the attenuation in the vicinity of the higher-frequency side of the pass band.

In actuality, however, when the switch SW3 is OFF, it has OFF capacitance (Coff3), which is a very small capacitance component. Accordingly, even when the switch SW3 is OFF, the parallel arm resonator p1b becomes effective, and as shown in the graph in the bottom section of the right side in FIG. 10B, the parallel arm circuit 12B has two resonant frequencies and two anti-resonant frequencies produced by the parallel arm resonator p1a and a series connecting circuit of the parallel arm resonator p1b and the OFF capacitance of the switch SW3.

Typically, the OFF capacitance of a switch is very small (about 0.3 pF). Accordingly, the OFF capacitance of the switch SW3 is much smaller than the electrostatic capacity of the parallel arm resonator p1b. The combined capacitance of the electrostatic capacity of the parallel arm resonator p1b and the OFF capacitance (Coff3) of the switch SW3 is much smaller than the electrostatic capacity of the parallel arm resonator p1b. When the switch SW3 is OFF, the first anti-resonant frequency is slightly lower than the anti-resonant frequency of the parallel arm resonator p1a, while the second anti-resonant frequency is slightly lower than the anti-resonant frequency of the parallel arm resonator p1b. The second resonant frequency is positioned on the higher-frequency side, which is higher than the resonant frequency of the parallel arm resonator p1b and is slightly lower than the second anti-resonant frequency. When the switch SW3 is OFF, the second resonant frequency and the second anti-resonant frequency are positioned on the higher-frequency side than the attenuation pole determined by the anti-resonant frequency of the series arm circuit 11.

As a result, when the switches SW1 through SW3 are all OFF, the filter characteristics illustrated in the graph in the top section of the right side in FIG. 10B are formed.

A description will now be given of the characteristics when the switches SW1 through SW3 are all ON (lower-frequency shifting) in the circuit configuration shown in FIG. 10A.

In this case, the characteristics of the series arm circuit 11 are similar to those when the switches SW1 and SW2 are both ON in the first example. The graph in the middle section of the center column in FIG. 10B shows that the anti-resonant frequency of the series arm circuit 11 is lower than that of the series arm resonator s1, while the resonant frequency of the series arm circuit 11 is equal to that of the series arm resonator s1.

In this case, the parallel arm circuit 12B is in the state in which the third variable frequency circuit 11c including the ON switch SW3 is connected in parallel with the parallel arm resonator p1a. That is, the parallel arm circuit 12B is represented by a parallel connecting circuit of the parallel arm resonators p1a and p1b.

As illustrated in the graph in the bottom section of the center column in FIG. 10B, the parallel arm circuit 12B has a first resonant frequency equal to the resonant frequency of the parallel arm resonator p1a, a second resonant frequency equal to the resonant frequency of the parallel arm resonator p1b, a first anti-resonant frequency positioned between the first and second resonant frequencies, and a second anti-resonant frequency, which is higher than the second resonant frequency. As a result, the first anti-resonant frequency is much lower than the anti-resonant frequency of the parallel arm resonator p1a.

As discussed above, the resonant frequency of the parallel arm resonator p1b is higher than that of the series arm resonator s1. Hence, the first anti-resonant frequency determines the pass band of the radio-frequency filter 10B, while the second resonant frequency determines the attenuation pole on the higher-frequency side of the pass band.

As a result, when the switches SW1 through SW3 are all ON, the filter characteristics illustrated in the graph in the top section of the center column in FIG. 10B are formed.

That is, as illustrated in the graph in the bottom section of the left side in FIG. 10B, as a result of the switch SW3 being switched between ON and OFF, the parallel arm circuit 12B is able to shift the lower anti-resonant frequency (that is, the first anti-resonant frequency) and the higher resonant frequency (that is, the second resonant frequency) to the lower-frequency side or the higher-frequency side together.

That is, as illustrated in the graph in the top section of the center column in FIG. 10B, as a result of the switch SW3 being switched from OFF to ON, the attenuation pole determined by the second resonant frequency shifts to the lower-frequency side, thereby making it possible to increase the attenuation in the vicinity of the higher-frequency side of the pass band. Additionally, as a result of the switch SW3 being switched between ON and OFF, the cut-off frequency and the attenuation pole on the higher-frequency side of the pass band shift to the lower-frequency side or the higher-frequency side together. It is thus possible to vary the frequency substantially without increasing the loss at the high edge of the pass band.

Figure 11A:
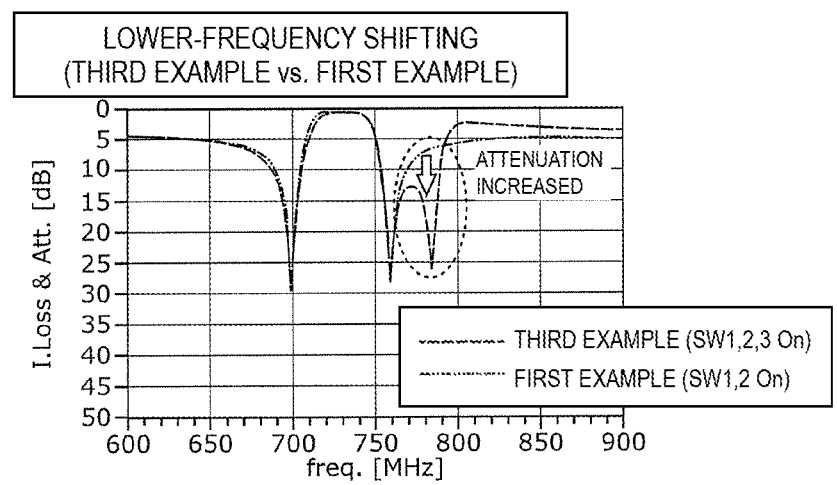
FIG. 11A is a graph illustrating a comparison between the characteristics of the radio-frequency filter of the third example and those of the first example in the case of lower-frequency shifting.
Figure 11B:
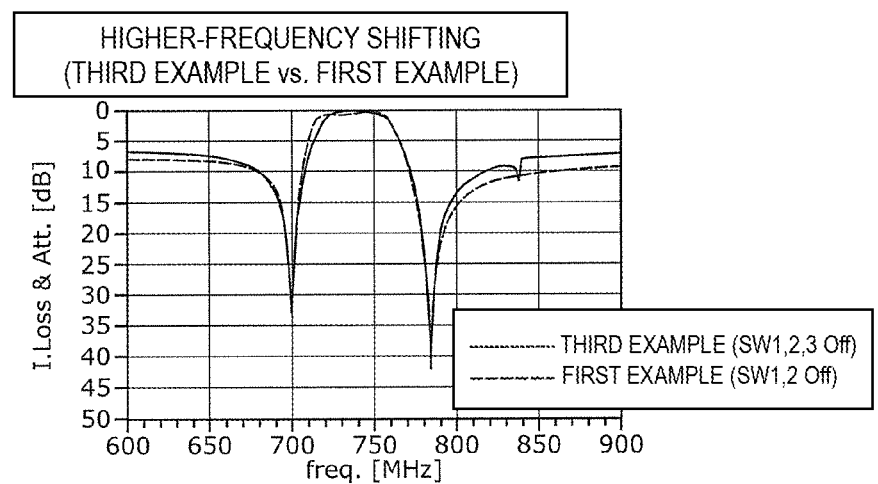
FIG. 11B is a graph illustrating a comparison between the characteristics of the radio-frequency filter of the third example and those of the first example in the case of higher-frequency shifting.

FIG. 11A is a graph illustrating a comparison between the characteristics of the radio-frequency filter of the third example and those of the first example in the case of lower-frequency shifting. FIG. 11B is a graph illustrating a comparison between the characteristics of the radio-frequency filter of the third example and those of the first example in the case of higher-frequency shifting.

FIGS. 11A and 11B show that, as in the radio-frequency filter 10 of the first example, the radio-frequency filter 10B of the third example is able to vary the frequency of the attenuation pole on the higher-frequency side of the pass band substantially without increasing the loss at the high edge of the pass band. FIG. 11A shows that, in the case of lower-frequency shifting, the radio-frequency filter 10B of the third example is able to increase the attenuation in the vicinity of the higher-frequency side of the pass band in comparison with the radio-frequency filter 10 of the first example.

[3-3. Resonance Analysis (Parallel Connection of Two Resonators)]

The characteristics of two parallel-connected resonators will be explained below by using an equivalent circuit model.

Figure 12:
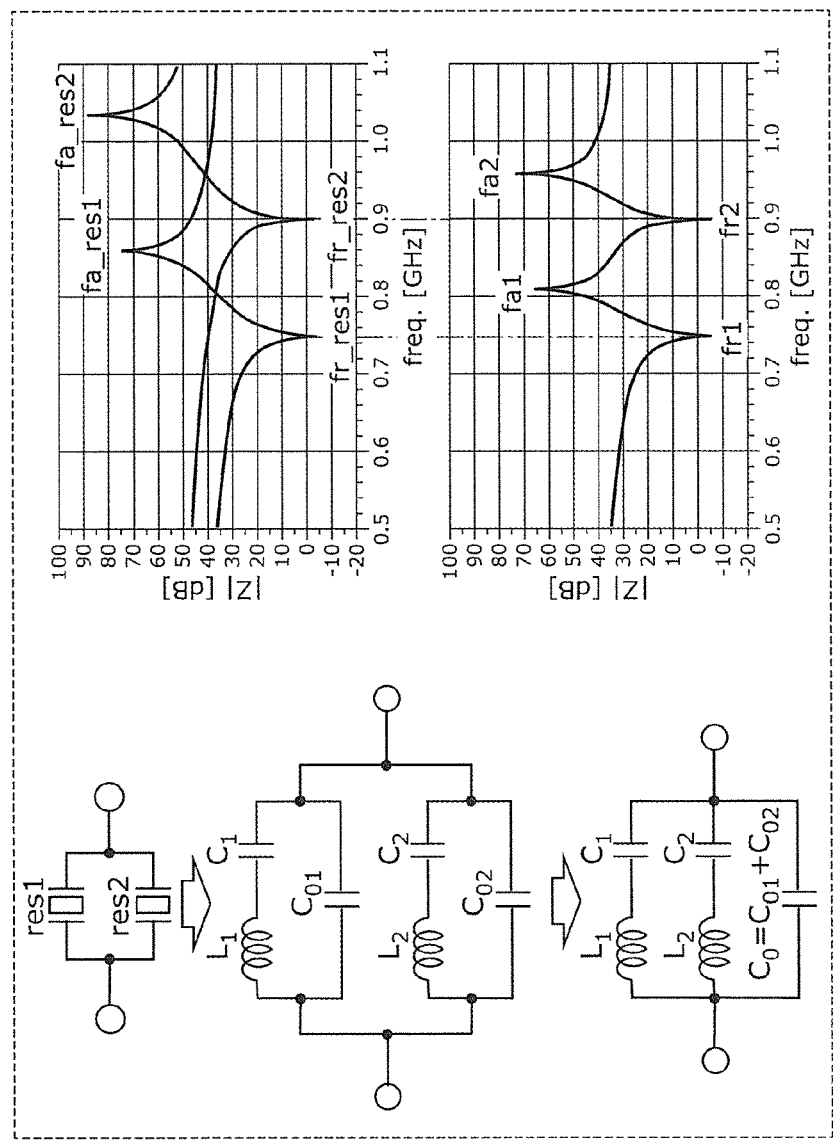
FIG. 12 shows diagrams of an equivalent circuit model of two resonators connected in parallel with each other and also shows graphs illustrating the resonance characteristics of the parallel-connected resonators.

FIG. 12 shows diagrams of an equivalent circuit model of two resonators connected in parallel with each other and also shows graphs illustrating the resonance characteristics of the parallel-connected resonators. In FIG. 12, a model of resonators res1 and res2 connected in parallel with each other is shown. The resonator res1 can be represented by a parallel circuit of a capacitor $C_{01}$ and a series circuit of a capacitor $C_1$ and an inductor $L_1$. The resonator res2 can be represented by a parallel circuit of a capacitor $C_{02}$ and a series circuit of a capacitor $C_2$ and an inductor $L_2$. The capacitor $C_{01}$ is the electrostatic capacity of the resonator res1, while the capacitor $C_{02}$ is the electrostatic capacity of the resonator res2. The resonance circuit including the resonators res1 and res2 is represented by the equivalent circuit shown on the bottom left side of FIG. 12. That is, this resonance circuit can be represented by a parallel circuit of a series circuit of the capacitor $C_1$ and the inductor $L_1$, a series circuit of the capacitor $C_2$ and the inductor $L_2$, and the capacitor $C_0$ (=$C_{01}$+$C_{02}$).

In the above-described equivalent circuit, the resonant frequency fr of the resonator is determined by the series circuit of the capacitor $C_1$ and the inductor $L_1$ and is expressed by equation 2.

In the above-described equivalent circuit, two resonant frequencies are formed. The resonant frequency fr1 is determined by the series circuit of the capacitor $C_1$ and the inductor $L_1$ and the resonant frequency fr2 is determined by the series circuit of the capacitor $C_2$ and the inductor $L_2$. The resonant frequencies fr1 and fr2 are expressed by equation 14.

[Math. 14]

$$f_r1 = \frac{1}{2\pi\sqrt{L_1C_1}} \quad f_r2 = \frac{1}{2\pi\sqrt{L_2C_2}} \quad \text{(Equation 14)}$$

That is, the two resonant frequencies fr1 and fr2 represented by the above-described equivalent circuit are substantially equal to the resonant frequency fr_res1 of the resonator res1 and the resonant frequency fr_res2 of the resonator res2, respectively.

The anti-resonant frequency of this equivalent circuit is the frequency at which the admittance Y of the equivalent circuit is 0. Accordingly, by solving equation 15, this equivalent circuit is found to have two anti-resonant frequencies (fa1, fa2), as expressed by equation 16.

[Math. 15]

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}} \quad \text{(Equation 15)}$$

[Math. 16]

$$f_a1 = \frac{\sqrt{\frac{-b - \sqrt{b^2 - 4ac}}{2a}}}{2\pi} \quad \text{(Equation 16)}$$

$$f_a2 = \frac{\sqrt{\frac{-b + \sqrt{b^2 - 4ac}}{2a}}}{2\pi}$$

$$a = L_1L_2C_0C_1C_2$$

$$b = -L_1C_0C_1 - L_2C_0C_2 - L_1C_1C_2 - L_2C_1C_2$$

$$c = C_0 + C_1 + C_2$$

The anti-resonant frequencies fa1 and fa2 found from equation 16 are different from the anti-resonant frequencies of the resonators alone (indicated by fa_res1 and fa_res2 in the graph of FIG. 12) found from equation 4. More specifically, the anti-resonant frequency fa1 found from equation 16 is lower than the anti-resonant frequency fa_res1 of the resonator res1 alone, and the anti-resonant frequency fa2 found from equation 16 is lower than the anti-resonant frequency fa_res2 of the resonator res2 alone.

Based on the above-described resonance analysis, it can be explained why the resonance characteristics of the parallel arm circuit 12B in the radio-frequency filter 10B of the third example are changed as a result of the switch SW3 being switched between ON and OFF.

When the switch SW3 (third switch) is ON, the parallel arm resonators p1a and p1b are connected in parallel with each other. The parallel arm circuit 12B thus has two resonant frequencies (first and second resonant frequencies) and two anti-resonant frequencies (first and second anti-resonant frequencies). That is, the first resonant frequency of the parallel arm circuit 12B is equal to the resonant frequency of the parallel arm resonator p1a, while the second resonant frequency of the parallel arm circuit 12B is equal to the resonant frequency of the parallel arm resonator p1b. The first anti-resonant frequency of the parallel arm circuit 12B becomes lower than the anti-resonant frequency of the parallel arm resonator p1a, while the second anti-resonant frequency of the parallel arm circuit 12B becomes lower than the anti-resonant frequency of the parallel arm resonator p1b.

When the switch SW3 (third switch) is OFF, the combined capacitance of the electrostatic capacity of the parallel arm resonator p1b and the OFF capacitance of the switch SW3 is connected in parallel with the parallel arm resonator p1a. As discussed above, the OFF capacitance of the switch SW3 is much smaller than the electrostatic capacity of the parallel arm resonator p1b. The combined capacitance of the electrostatic capacity of the parallel arm resonator p1b and the OFF capacitance (Coff3) of the switch SW3 is thus much smaller than the electrostatic capacity of the parallel arm resonator p1b. The first resonant frequency of the parallel arm circuit 12B becomes equal to the resonant frequency of the parallel arm resonator p1a, and the first anti-resonant frequency of the parallel arm circuit 12B becomes slightly lower than the anti-resonant frequency of the parallel arm resonator p1a. The second anti-resonant frequency of the parallel arm circuit 12B becomes slightly lower than the anti-resonant frequency of the parallel arm resonator p1b. The second resonant frequency of the parallel arm circuit 12B is positioned on the higher-frequency side, which is higher than the resonant frequency of the parallel arm resonator p1*b* and is slightly lower than the second anti-resonant frequency.

[3-4. Influence of Third Variable Frequency Circuit on Characteristics]

The influence of the configuration of the third variable frequency circuit 11*c* in the radio-frequency filter 10B on the filter characteristics will be discussed below through illustration of typical examples. More specifically, a description will be given of the influence of the OFF capacitance of the switch SW3 (third switch) connected to the parallel arm resonator p1*b* on the filter characteristics and the influence of the characteristic impedance of wiring connecting the parallel arm resonator p1*b* and the switch SW3 on the filter characteristics.

The influence of the third variable frequency circuit 11*c* on the filter characteristics is not dependent on the configuration of the series arm circuit. For the sake of simple representation, the influence on the filter characteristics will be discussed through illustration of a radio-frequency filter including a series arm circuit constituted by only one series arm resonator.

[3-4-1. Configuration of First Typical Example]

Figure 13A:
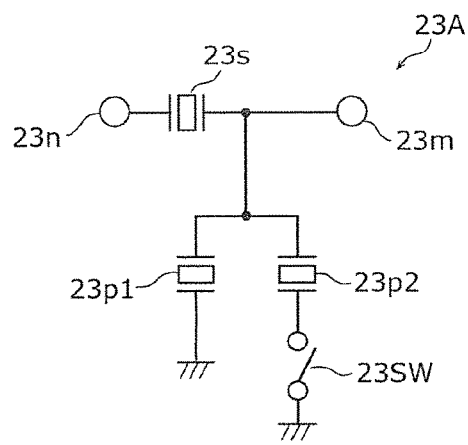
FIG. 13A is a circuit diagram of a radio-frequency filter according to a first typical example.
Figure 13B:
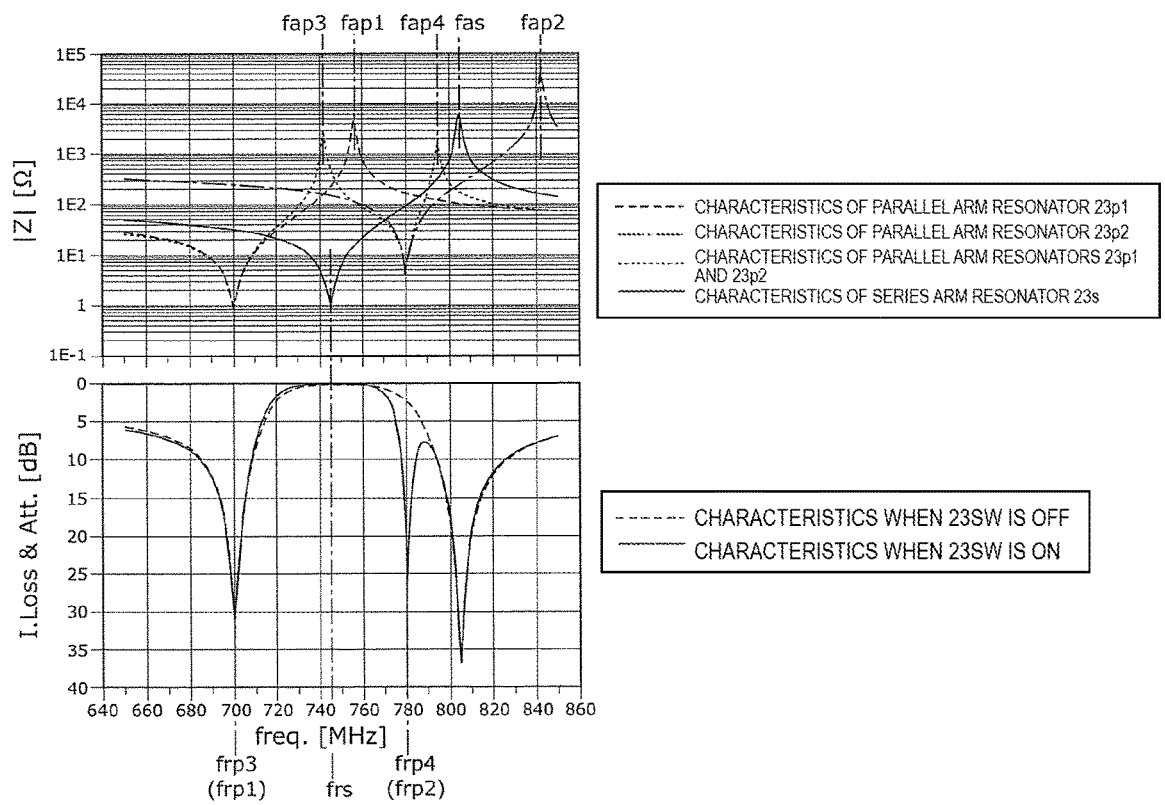

FIG. 13A is a circuit diagram of a radio-frequency filter 23A of a first typical example, which will be used for explaining the influence of the third variable frequency circuit 11*c* on the characteristics. FIG. 13B shows graphs illustrating a comparison between the impedance characteristics and the bandpass characteristics when the radio-frequency filter 23A of the first typical example is switched OFF and those when the radio-frequency filter 23A is switched ON.

When a switch 23SW is OFF, the impedance of a parallel arm resonator 23*p*2 is substantially infinite. The impedance characteristics of the radio-frequency filter 23A are thus represented by the combined impedance characteristics of a series arm resonator 23*s* (indicated by the solid line in the graph of the top section of FIG. 13B) and a parallel arm resonator 23*p*1 (indicated by the rough broken line in the graph of the top section of FIG. 13B). Consequently, when the switch 23SW is OFF, the radio-frequency filter 23A is represented by the following band pass filter (indicated by the broken line in the graph of the bottom section of FIG. 13B). The band pass filter uses the resonant frequency frp1 of the parallel arm resonator 23*p*1 as the attenuation pole on the lower-frequency side and the anti-resonant frequency fas of the series arm resonator 23*s* as the attenuation pole on the higher-frequency side, and forms the pass band by using the anti-resonant frequency fap1 of the parallel arm resonator 23*p*1 and the resonant frequency frs of the series arm resonator 23*s*.

When the switch 23SW is ON, the impedance characteristics of the radio-frequency filter 23A are represented by the combined impedance characteristics of the series arm resonator 23*s* (indicated by the solid line in the graph of the top section of FIG. 13B) and a parallel resonance circuit of the parallel arm resonators 23*p*1 and 23*p*2 (indicated by the fine broken line in the graph of the top section of FIG. 13B). The impedance characteristics of the parallel resonance circuit (indicated by the fine broken line in the graph of the top section of FIG. 13B) are represented by those of the parallel arm resonator 23*p*1 (indicated by the rough broken line in the graph of the top section of FIG. 13B) and those of the parallel arm resonator 23*p*2 (indicated by the long dashed dotted line in the graph of the top section of FIG. 13B). Hence, when the switch 23SW is ON, the radio-frequency filter 23A is represented by the following band pass filter (indicated by the solid line in the graph of the bottom section of FIG. 13B). The band pass filter uses the resonant frequency frp3 of the parallel resonance circuit (reflecting the resonant frequency frp1 of the parallel arm resonator 23*p*1) as the attenuation pole on the lower-frequency side and uses the resonant frequency frp4 of the parallel resonance circuit (reflecting the resonant frequency frp2 of the parallel arm resonator 23*p*2) as the attenuation pole on the higher-frequency side.

When the switch 23SW is ON, the resonant frequency frp2 of the parallel arm resonator 23*p*2 is positioned on the higher-frequency side than the resonant frequency frp1 of the parallel arm resonator 23*p*1. Accordingly, the anti-resonant frequency fap3 of the parallel resonance circuit becomes lower than the anti-resonant frequency fap1 of the parallel arm resonator 23*p*1, and also, the anti-resonant frequency fap4 of the parallel resonance circuit becomes lower than the anti-resonant frequency fap2 of the parallel arm resonator 23*p*2. That is, the anti-resonant frequency fap3 of the parallel resonance circuit is lower than the anti-resonant frequency fap1 of the parallel arm resonator 23*p*1, and also, the resonant frequency frp4 of the parallel resonance circuit is lower than the anti-resonant frequency fas of the series arm resonator 23*s*. When the switch 23SW is ON, the pass band width thus becomes narrower toward the lower-frequency side than that when the switch 23SW is OFF, and also, the attenuation band shifts to the lower-frequency side than that when the switch 23SW is OFF.

With the above-described configuration, the resonant frequency frp2 of the parallel arm resonator 23*p*2 is higher than the resonant frequency frs of the series arm resonator 23*s* which influences the insertion loss in the vicinity of the center frequency of the pass band, and is also lower than the anti-resonant frequency fas of the series arm resonator 23*s* which determines the attenuation pole on the higher-frequency side outside the pass band. This makes it possible to shift the attenuation pole on the higher-frequency side outside the pass band to the lower-frequency side while maintaining a low insertion loss in the pass band when the switch 23SW is ON. The high edge of the pass band accordingly shifts to the lower-frequency side when the switch 23SW is ON. It is thus possible to decrease the pass band width without impairing the sharpness at the high frequency edge of the pass band (high edge of the pass band).

[3-4-2. Influence of OFF Capacitance on Filter Characteristics]

When the switch 23SW is OFF, the impedance is ideally infinite. In actuality, however, the switch 23SW has OFF capacitance (Coff), which is a capacitance component.

Figure 14A:
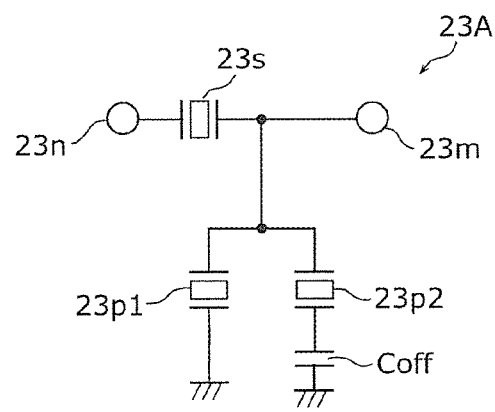
FIG. 14A is an equivalent circuit diagram of the radio-frequency filter of the first typical example when it is switched OFF.
Figure 14B:
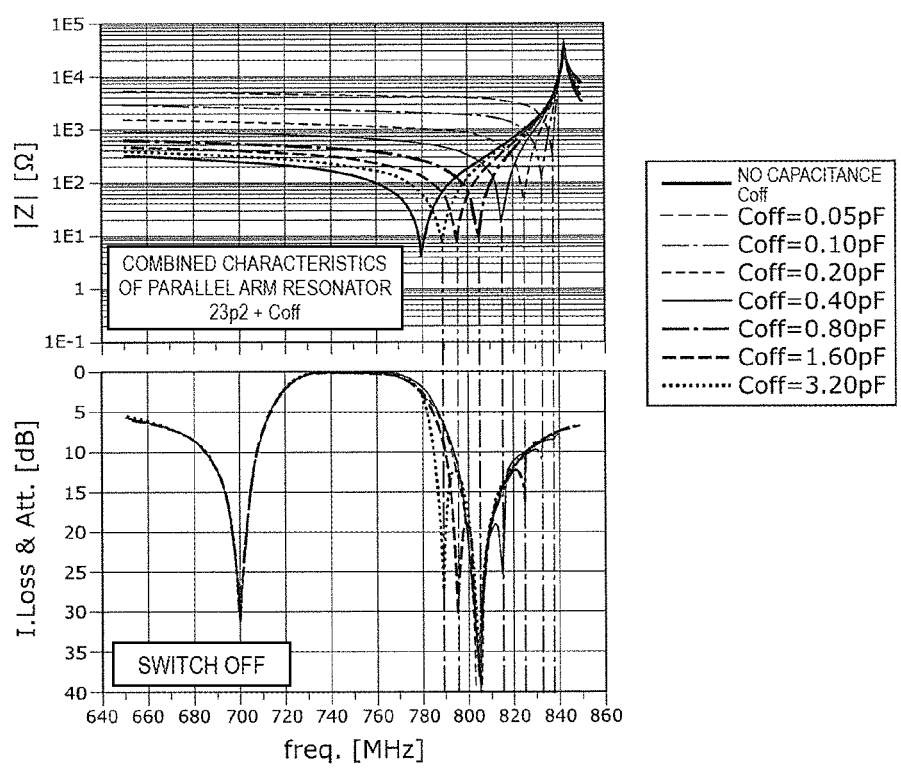
FIG. 14B shows graphs illustrating the impedance characteristics and the bandpass characteristics of the radio-frequency filter of the first typical example when the OFF capacitance is changed.

FIG. 14A is an equivalent circuit diagram of the radio-frequency filter 23A of the first typical example when the switch 23SW is OFF. FIG. 14B shows graphs illustrating the impedance characteristics and the bandpass characteristics of the radio-frequency filter 23A of the first typical example when the OFF capacitance is changed. More specifically, the graph in the top section of FIG. 14B illustrates variations in the combined characteristics of the parallel arm resonator 23*p*2 and the OFF capacitance Coff of the switch 23SW as a result of the OFF capacitance Coff being changed. The graph in the bottom section of FIG. 14B illustrates variations in the filter characteristics of the radio-frequency filter 23A when the switch 23SW is OFF as a result of the OFF capacitance Coff of the switch 23SW being changed.

The graph in the top section of FIG. 14B shows that increasing the OFF capacitance Coff shifts the resonant frequency (frp2) of the combined characteristics of the parallel arm resonator 23p2 and the OFF capacitance Coff to the lower-frequency side. The graph in the bottom section of FIG. 14B shows that increasing the OFF capacitance Coff also shifts the attenuation pole (frp4) on the higher-frequency side of the pass band to the lower-frequency side. Changing of the OFF capacitance Coff does not influence the anti-resonant frequency (fap2) of the combined characteristics of the parallel arm resonator 23p2 and the OFF capacitance Coff.

Figure 14C:
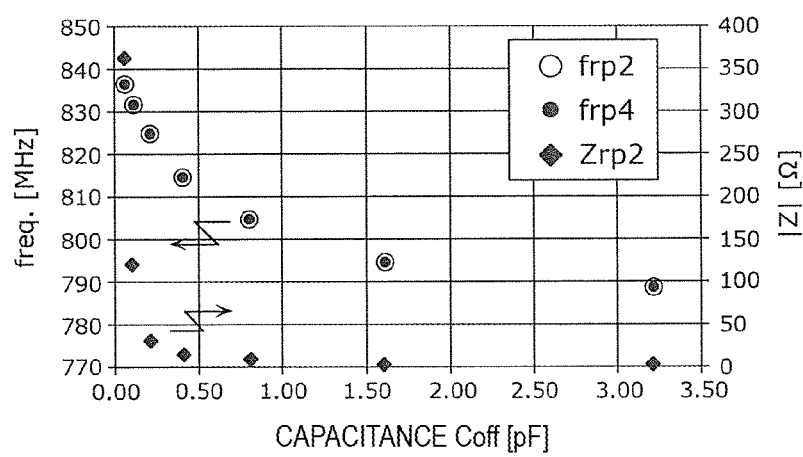
FIG. 14C is a graph illustrating the relationships among the OFF capacitance, resonant frequency, and impedance at the resonant frequency in the radio-frequency filter of the first typical example.

FIG. 14C is a graph illustrating the relationships among the OFF capacitance, resonant frequency, and impedance at the resonant frequency in the radio-frequency filter 23A of the first typical example.

When the switch 23SW is OFF, ideally, the impedance of the switch 23SW is infinite. In actuality, however, an increase in the OFF capacitance Coff reduces the impedance. Because of the combined characteristics of the parallel arm resonator 23p2 and the OFF capacitance Coff, another attenuation pole (frp4) is formed, and the value of the OFF capacitance Coff determines the resonant frequency (frp2) of the above-described combined characteristics.

The attenuation pole (frp4) formed by the parallel arm resonator 23p2 (no capacitance Coff in the graph of the top section of FIG. 14B) when the switch 23SW is ON is 780 MHz. As the OFF capacitance Coff increases, the variable frequency range obtained as a result of the switch 23SW being switched between ON and OFF becomes narrower. A variable frequency filter, such as the above-described filter, requires a variable frequency range of 20 MHz or higher, and it is thus necessary to set the OFF capacitance Coff to be 0.8 pF or smaller.

This makes it possible to achieve a large variable frequency range as a result of the switch 23SW being switched between ON and OFF. The above-described required variable frequency range is set also from the fact that, in a filter which varies Band 28Tx (703 to 748 MHz) and Band 68Tx (698 to 728 MHz), the frequency difference between the two bands at the high edge of the pass band is 20 MHz.

[3-4-3. Configuration of Second Typical Example]

Figure 15A:
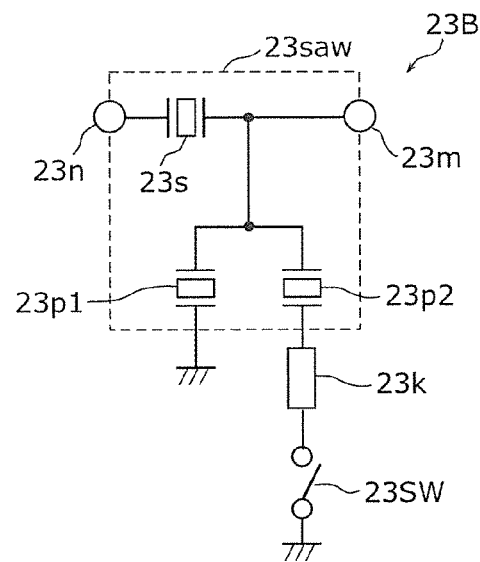
FIG. 15A is a circuit diagram of a radio-frequency filter according to a second typical example.

FIG. 15A is a circuit diagram of a radio-frequency filter 23B of a second typical example, which will be used for explaining the influence of the third variable frequency circuit 11c on the characteristics. The circuit configuration of the radio-frequency filter 23B of the second typical example is the same as that of the radio-frequency filter 23A of the first typical example, and the filter characteristics of the radio-frequency filter 23B are also substantially the same as those of the radio-frequency filter 23A. The basic filter characteristics of the radio-frequency filter 23B when the switch 23SW is ON and those when the switch 23SW is OFF will not be explained.

In the radio-frequency filter 23B shown in FIG. 15A, wiring 23k connecting the parallel arm resonator 23p2 to the switch 23SW is shown.

"Wiring impedance" refers to the characteristic impedance of wiring. For the sake of convenience, the characteristic impedance of wiring is called "wiring impedance" in the second typical example.

[3-4-4. Structure of Second Typical Example]

Figure 15B:
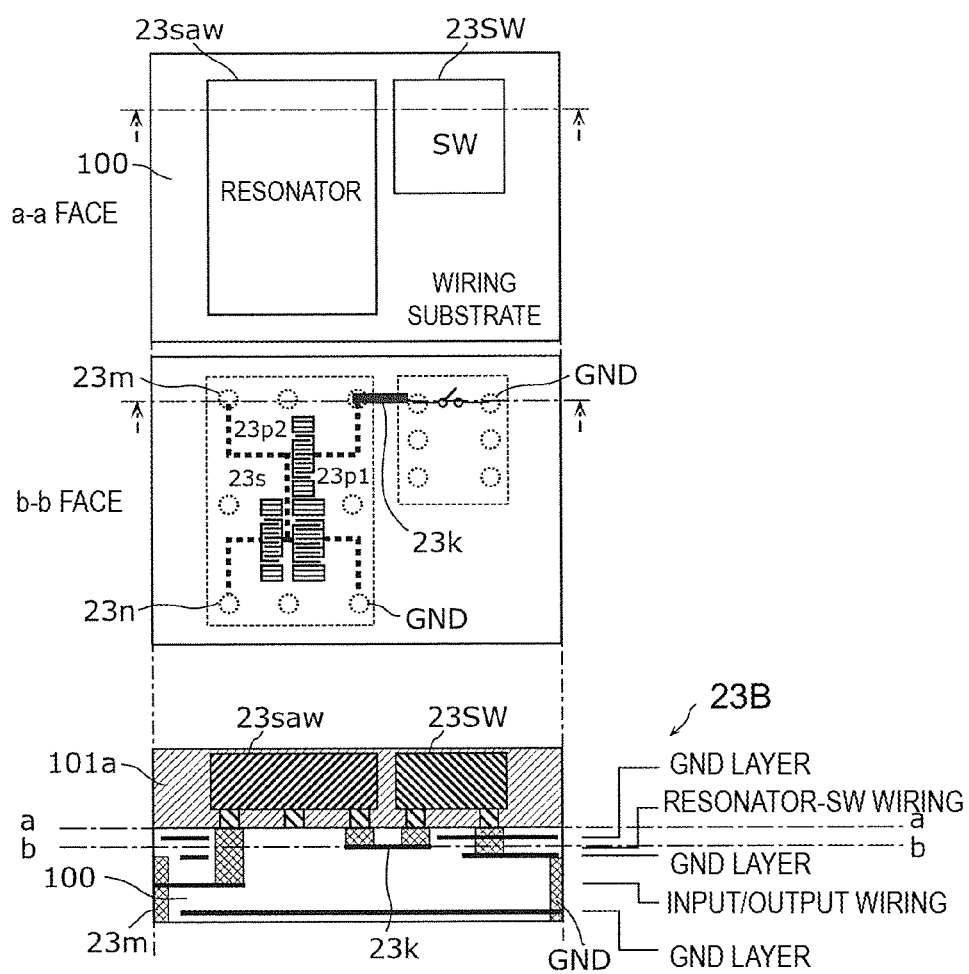
FIG. 15B shows plan views and a sectional view of the radio-frequency filter of the second typical example for explaining its structure.

FIG. 15B shows plan views and a sectional view of the radio-frequency filter 23B of the second typical example for explaining its structure. More specifically, the top section of FIG. 15B shows a plan view of the radio-frequency filter 23B as viewed from above; the middle section of FIG. 15B shows a plan view of the radio-frequency filter 23B when the inside of a wiring substrate is seen through; and the bottom section of FIG. 15B shows a sectional view of the radio-frequency filter 23B. A surface acoustic wave resonator (23saw) includes the series arm resonator 23s and the parallel arm resonators 23p1 and 23p2. The surface acoustic wave resonator (23saw) and the switch 23SW are constituted by different packages (chips), and are mounted on a wiring substrate 100. The surface acoustic wave resonator (23saw) and the switch 23SW are covered with a resin member 101a. As the wiring substrate 100, an LTCC substrate or a PCB substrate, for example, is used. The surface acoustic wave resonator (23saw) and the switch 23SW are connected with each other by using via-holes and wiring patterns provided within the wiring substrate 100. The parallel arm resonator 23p2 in the surface acoustic wave resonator (23saw) is connected to the switch 23SW by wiring 23k disposed on or in the wiring substrate 100. Ideally, the wiring 23k is not disposed, that is, it is desirable that the parallel arm resonator 23p2 and the switch 23SW are directly connected with each other. However, the surface acoustic wave resonator (23saw) and the switch 23SW are contained in different packages, and the wiring 23k is thus required.

[3-5. Influence of Wiring Impedance on Filter Characteristics]

The characteristic impedance of the wiring 23k influences the filter characteristics of the radio-frequency filter 23B.

Figure 15C:
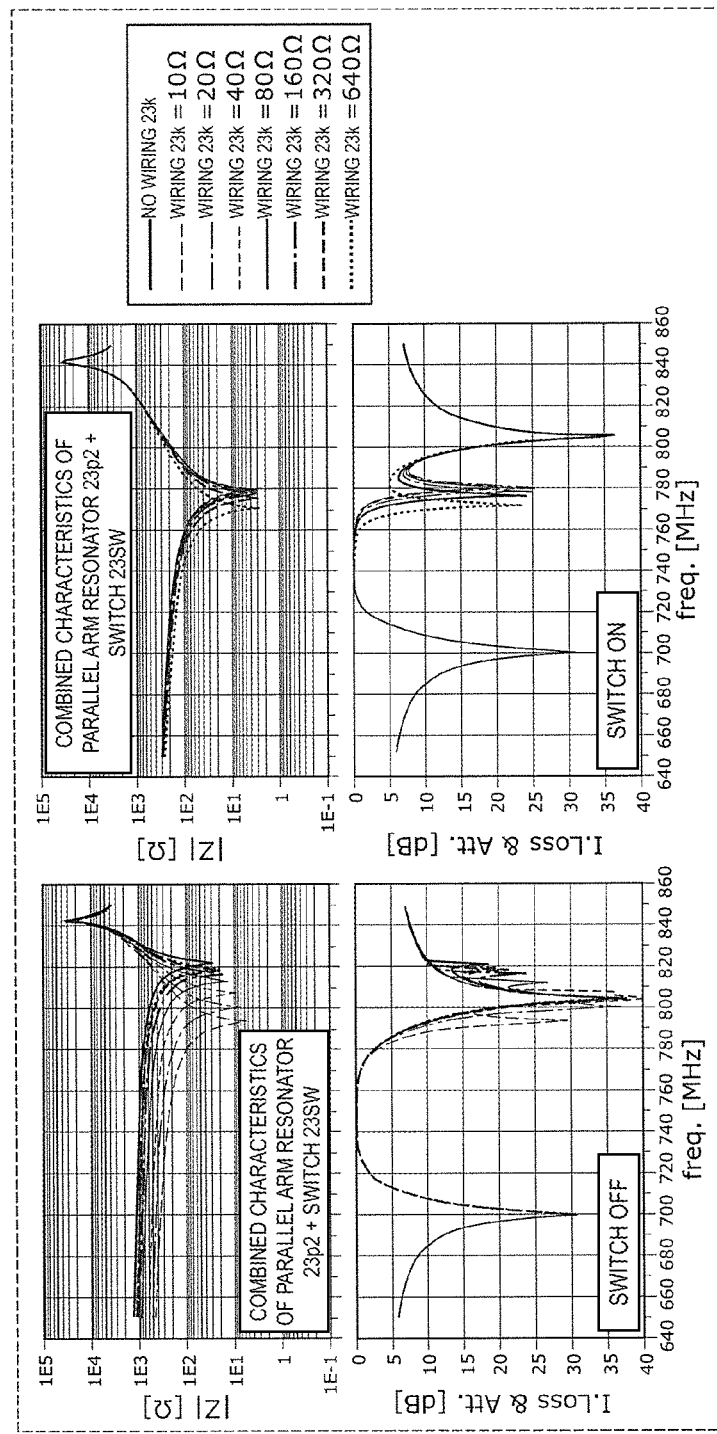
FIG. 15C shows graphs illustrating the impedance characteristics and the bandpass characteristics of the radio-frequency filter of the second typical example when the wiring impedance is changed.

FIG. 15C shows graphs illustrating the impedance characteristics and the bandpass characteristics of the radio-frequency filter 23B of the second typical example when the wiring impedance is changed. More specifically, the graph in the top left section of FIG. 15C illustrates variations in the combined characteristics of the parallel arm resonator 23p2, the wiring 23k, and the switch 23SW as a result of the characteristic impedance of the wiring 23k being changed when the switch 23SW is OFF. The graph in the top right section of FIG. 15C illustrates variations in the combined characteristics of the parallel arm resonator 23p2 and the switch 23SW as a result of the characteristic impedance of the wiring 23k being changed when the switch 23SW is ON. The graph in the bottom left section of FIG. 15C illustrates variations in the filter characteristics of the radio-frequency filter 23B as a result of the characteristic impedance of the wiring 23k being changed when the switch 23SW is OFF. The graph in the bottom right section of FIG. 15C illustrates variations in the filter characteristics of the radio-frequency filter 23B as a result of the characteristic impedance of the wiring 23k being changed when the switch 23SW is ON.

When the switch 23SW is OFF, as the characteristic impedance of the wiring 23k becomes higher, the characteristics of the radio-frequency filter 23B approach closer to the ideal characteristics, and as the characteristic impedance of the wiring 23k becomes lower, the attenuation pole (frp4) on the higher-frequency side of the pass band farther shifts to the lower-frequency side.

When the switch 23SW is ON, as the characteristic impedance of the wiring 23k becomes higher, the attenuation pole (frp4) on the higher-frequency side of the pass band farther shifts to the lower-frequency side, and as the characteristic impedance of the wiring 23k becomes lower, the characteristics of the radio-frequency filter 23B approach closer to the ideal characteristics.

Figure 15D:
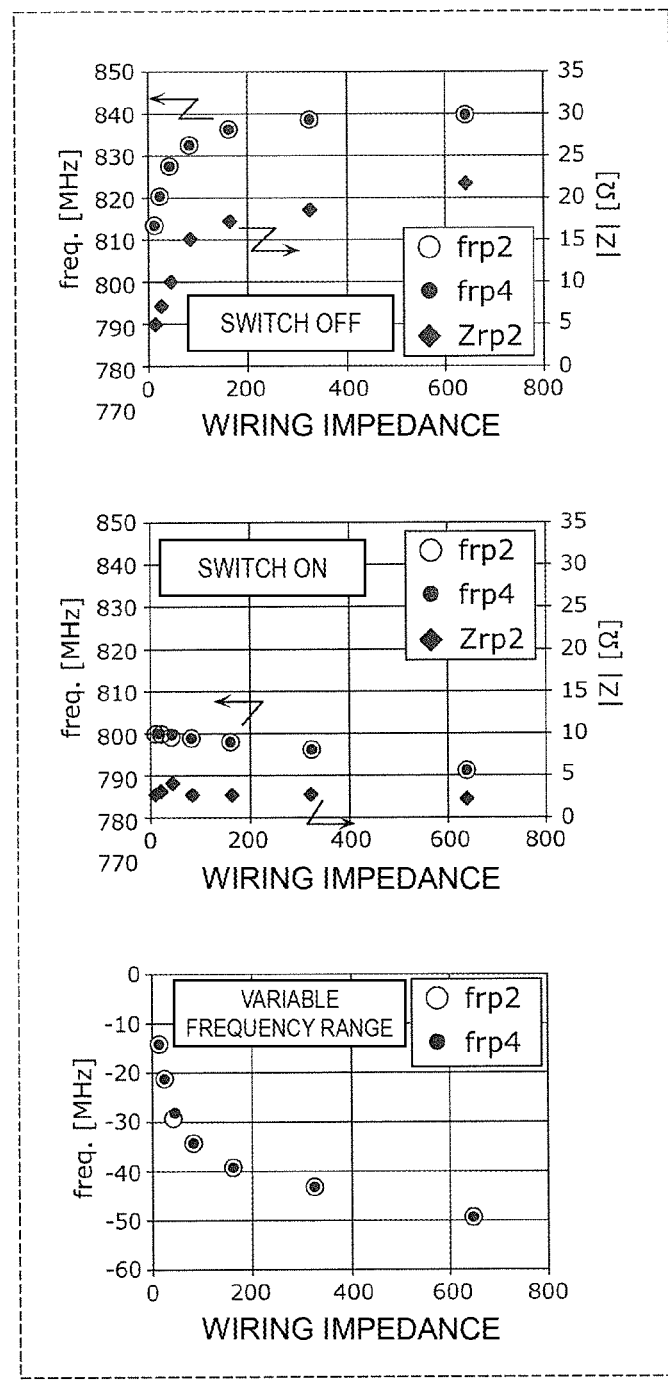
FIG. 15D shows graphs illustrating the relationships among the wiring impedance, resonant frequency, and impedance in the radio-frequency filter of the second typical example.

FIG. 15D shows graphs illustrating the relationships among the wiring impedance, resonant frequency, and impedance in the radio-frequency filter 23B of the second typical example. More specifically, the graph in the top section of FIG. 15D illustrates the relationships of the characteristic impedance of the wiring 23k to the resonant frequency and the impedance of the combined characteristics of the parallel arm resonator 23p2, wiring 23k, and switch 23SW when the switch 23SW is OFF. The graph in the middle section of FIG. 15D illustrates the relationships of the characteristic impedance of the wiring 23k to the resonant frequency and the impedance of the combined characteristics of the parallel arm resonator 23p2, wiring 23k, and switch 23SW when the switch 23SW is ON. The graph in the bottom section of FIG. 15D illustrates the relationships between the characteristic impedance of the wiring 23k and the variable frequency range obtained as a result of the switch 23SW being switched between ON and OFF.

The variable frequency range, which is the frequency difference in the attenuation pole (frp4) on the higher-frequency side of the pass band, obtained as a result of the switch 23SW being switched between ON and OFF will now be focused. The bottom section of FIG. 15D shows that the variable frequency range is increased as the characteristic impedance of the wiring 23k becomes higher and that the variable frequency range is decreased as the characteristic impedance of the wiring 23k becomes lower. As discussed in the first typical example, a variable frequency range of 20 MHz or higher is required in a variable frequency filter. It is thus necessary to set the characteristic impedance of the wiring 23k to be 20Ω or higher.

It is thus possible to achieve a large variable frequency range as a result of the switch 23SW being switched between ON and OFF.

To set the characteristic impedance of the wiring 23k to a high value, the following approaches may be taken.

(1) The relative dielectric constant of the wiring substrate 100 is set to be 15 or smaller.

(2) The distance between the wiring 23k and each of ground patterns above and below the wiring 23k is set to be 100 μm or greater.

(3) A ground is not disposed above the wiring 23k.

(4) A via-hole for the wiring 23k is set to be smaller than other interlayer via-holes.

(5) The wiring 23k is disposed in the upper half region of the wiring substrate 100 in its thickness direction.

Fourth Embodiment

The configuration in which the resonant frequency or the anti-resonant frequency of a parallel arm circuit is changed is not restricted to that in the third embodiment. In a fourth embodiment, a radio-frequency filter configured in a different manner will be described below through illustration of an example (fourth example).

[4-1. Configuration]

Figure 16A:
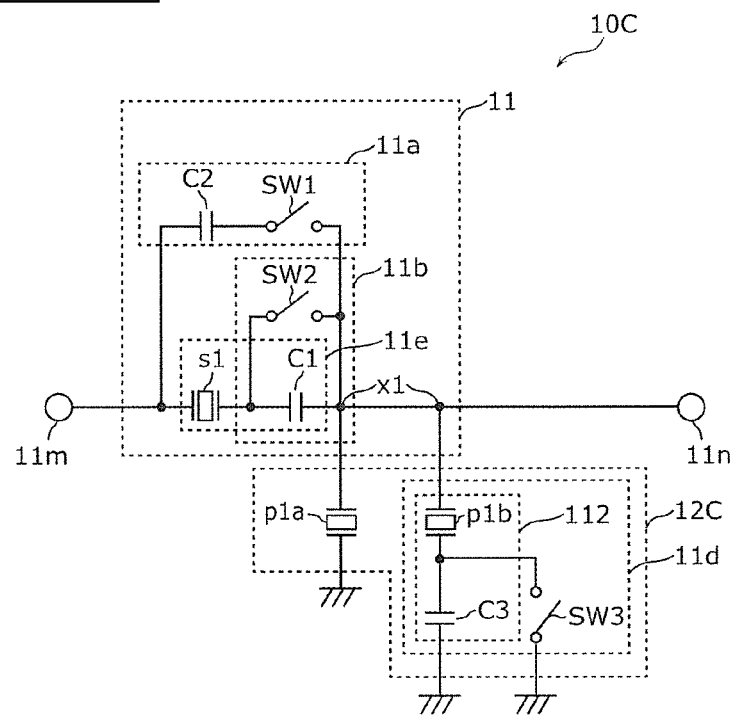
FIG. 16A is a circuit diagram of a radio-frequency filter according to an example (fourth example) of a fourth embodiment.

FIG. 16A is a circuit diagram of a radio-frequency filter 10C according to the fourth example.

As shown in FIG. 16A, a parallel arm circuit 12C of the fourth example is different from the parallel arm circuit 12B of the third example in that it includes a capacitor C3 (third capacitor), which is an impedance element connected in parallel with the switch SW3 (third switch). That is, in the fourth example, a parallel connecting circuit constituted by the capacitor C3 and the switch SW3 is connected in series with the parallel arm resonator p1b, and this series connecting circuit forms a third variable frequency circuit 11d.

In the above-described configuration, too, in a manner similar to the first example, it is possible to vary the frequency of the attenuation pole on the higher-frequency side of the pass band substantially without increasing the loss at the high edge of the pass band as a result of the switch SW1 (first switch) being switched between ON and OFF. Additionally, in the above-described configuration, the capacitor C3 is connected in parallel with the switch SW3, thereby making it possible to vary the resonant frequency and the anti-resonant frequency of the parallel arm circuit 12C as a result of the switch SW3 being switched between ON and OFF.

[4-2. Characteristics]

The filter characteristics (bandpass characteristics) of the radio-frequency filter 10C of the fourth example will be discussed below while also referring to the impedance characteristics (resonance characteristics) which determine the filter characteristics.

The circuit constants of the radio-frequency filter 10C of the fourth example are shown in Table 4.

TABLE 4

| | Series arm resonator s1 | Parallel arm resonator p1a | Parallel arm resonator p1b | Capacitor C1 | Capacitor C2 | Capacitor C3 |
| --- | --- | --- | --- | --- | --- | --- |
| Electrostatic capacity Cap. [pF] | 2.0 | 5.0 | 1.0 | 2.0 | 7.0 | 2.0 |
| Resonant frequency fr [MHz] | 730 | 700 | 785 | | | |
| Anti-resonant frequency fa [MHz] | 788 | 756 | 848 | | | |

Figure 16B:
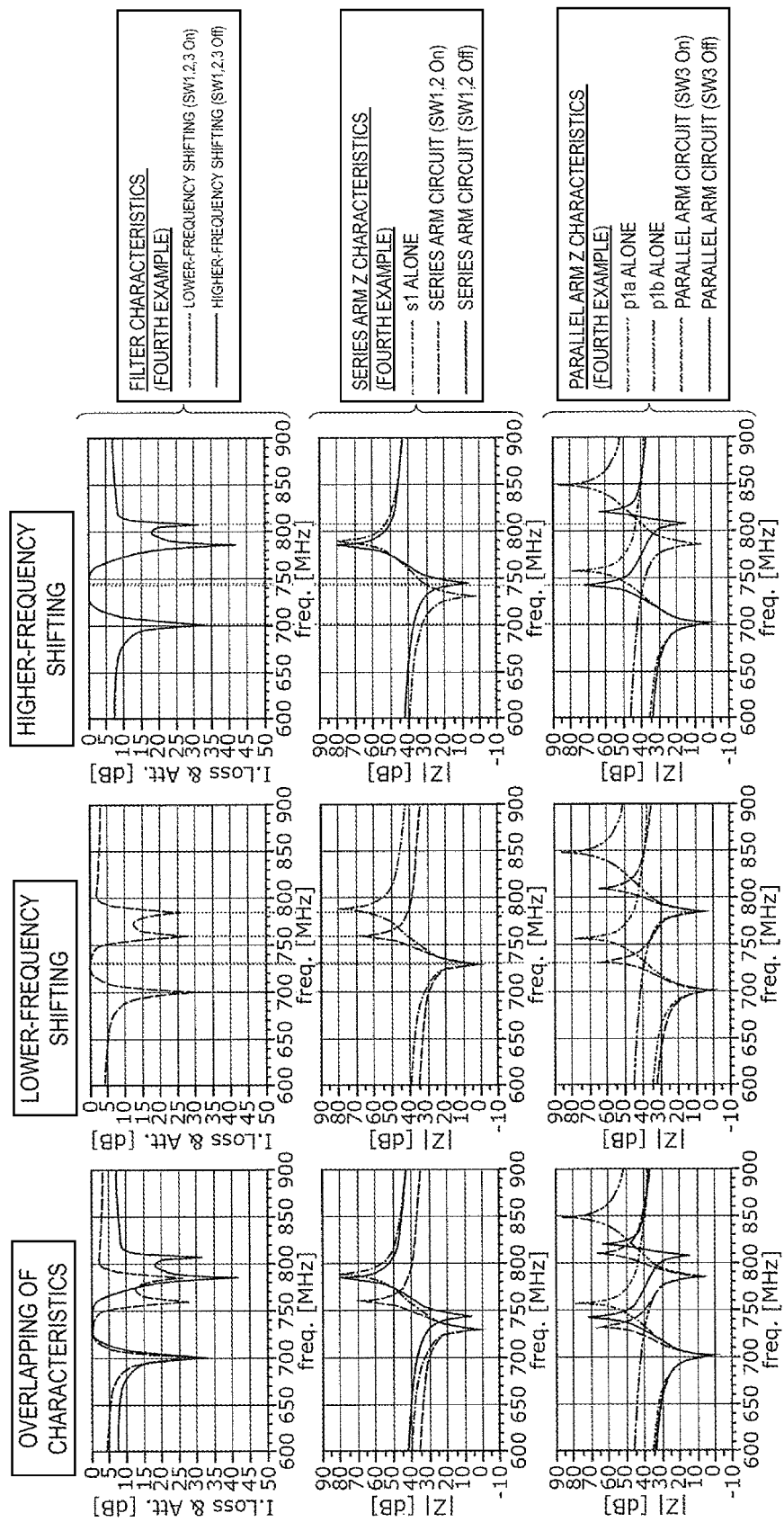
FIG. 16B shows graphs illustrating various characteristics concerning the radio-frequency filter of the fourth example.

FIG. 16B shows graphs illustrating various characteristics concerning the radio-frequency filter 10C. Concerning the impedance characteristics of the parallel arm, the impedance characteristics of the parallel arm resonator p1a alone, those of the parallel arm resonator p1b alone, those of the parallel arm circuit 12C when the switch SW3 is ON, and those of the parallel arm circuit 12C when the switch SW3 is OFF are shown.

A description will first be given of the characteristics when the switches SW1 through SW3 are all OFF (higher-frequency shifting) in the circuit configuration shown in FIG. 16A.

In this case, the characteristics of the series arm circuit 11 are similar to those when the switches SW1 and SW2 are both OFF in the first example. The graph in the middle section of the right side in FIG. 16B shows that the anti-resonant frequency of the series arm circuit 11 is slightly lower than that of the series arm resonator s1, while the resonant frequency of the series arm circuit 11 is much higher than that of the series arm resonator s1.

In this case, the parallel arm circuit 12C is in the state in which the third variable frequency circuit 11d including the OFF switch SW3 is connected in parallel with the parallel arm resonator p1a. That is, the parallel arm circuit 12C is represented by a parallel connecting circuit of the parallel arm resonator p1a and the parallel arm resonator p1b to which the combined capacitance of the capacitor C3 and the switch SW3 is added. The combined capacitance is that of the capacitor C3 and the OFF capacitance of the switch SW3.

The graph in the bottom section of the right side in FIG. 16B shows that the parallel arm circuit 12C has a first resonant frequency, which is equal to the resonant frequency of the parallel arm resonator p1a, a second resonant frequency, which is higher than the resonant frequency of the parallel arm resonator p1b, a first anti-resonant frequency, which is positioned between the first and second resonant frequencies, and a second anti-resonant frequency, which is higher than the second resonant frequency.

As a result, when the switches SW1 through SW3 are all OFF, the filter characteristics illustrated in the graph in the top section of the right side in FIG. 16B are formed.

A description will now be given of the characteristics when the switches SW1 through SW3 are all ON (lower-frequency shifting) in the circuit configuration shown in FIG. 16A.

In this case, the characteristics of the series arm circuit 11 are similar to those when the switches SW1 and SW2 are both ON in the first example. The graph in the middle section of the center column in FIG. 16B shows that the anti-resonant frequency of the series arm circuit 11 is lower than that of the series arm resonator s1, while the resonant frequency of the series arm circuit 11 is equal to that of the series arm resonator s1.

In this case, the parallel arm circuit 12C is in the state in which the third variable frequency circuit 11d including the ON switch SW3 is connected in parallel with the parallel arm resonator p1a. That is, the parallel arm circuit 12C is represented by a parallel connecting circuit of the parallel arm resonators p1a and p1b.

As illustrated in the graph in the bottom section of the center column in FIG. 16B, the parallel arm circuit 12C has a first resonant frequency equal to the resonant frequency of the parallel arm resonator p1a, a second resonant frequency equal to the resonant frequency of the parallel arm resonator p1b, a first anti-resonant frequency positioned between the first and second resonant frequencies, and a second anti-resonant frequency, which is higher than the second resonant frequency.

As a result, when the switches SW1 through SW3 are all ON, the filter characteristics illustrated in the graph in the top section of the center column in FIG. 16B are formed.

It is seen from the graph in the bottom section of the left side in FIG. 16B that, upon comparing when the switch SW3 is ON with when the switch SW3 is OFF, the second resonant frequency and the first anti-resonant frequency both shift to the lower-frequency side or the higher-frequency side. That is, the second resonant frequency when the switch SW3 is ON is lower than that when the switch SW3 is OFF, and the first anti-resonant frequency when the switch SW3 is ON is lower than that when the switch SW3 is OFF. When the switch SW3 is OFF, the second resonant frequency is positioned in the vicinity of the anti-resonant frequency of the series arm circuit 11.

The first anti-resonant frequency of the parallel arm circuit 12C determines the pass band of the radio-frequency filter 10C, while the second resonant frequency of the parallel arm circuit 12C and the anti-resonant frequency of the series arm circuit 11 determine the attenuation pole on the higher-frequency side of the pass band.

According to the fourth example, the impedance element (capacitor C3 in the fourth example) is connected in parallel with the switch SW3. With this configuration, even when the switch SW3 is OFF, the attenuation pole formed by the second resonant frequency (higher resonant frequency) of the parallel arm circuit 12C can be located in the vicinity of the attenuation pole formed by the anti-resonant frequency of the series arm circuit 11. When the switch SW3 is OFF, as well as when the switch SW3 is ON, the attenuation band width is increased, and also, the cut-off frequency on the higher-frequency side of the pass band and the attenuation pole on the higher-frequency side of the pass band shift together as a result of the switch SW3 being switched between ON and OFF. It is thus possible to vary the frequency of the attenuation pole on the higher-frequency side of the pass band while maintaining the attenuation band width and substantially without increasing the loss at the high edge of the pass band.

Figure 17A:
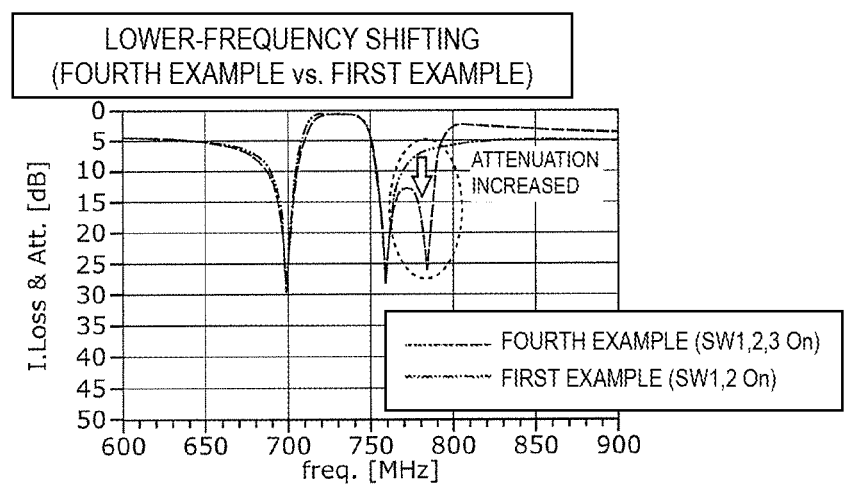
FIG. 17A is a graph illustrating a comparison between the characteristics of the radio-frequency filter of the fourth example and those of the first example in the case of lower-frequency shifting.
Figure 17B:
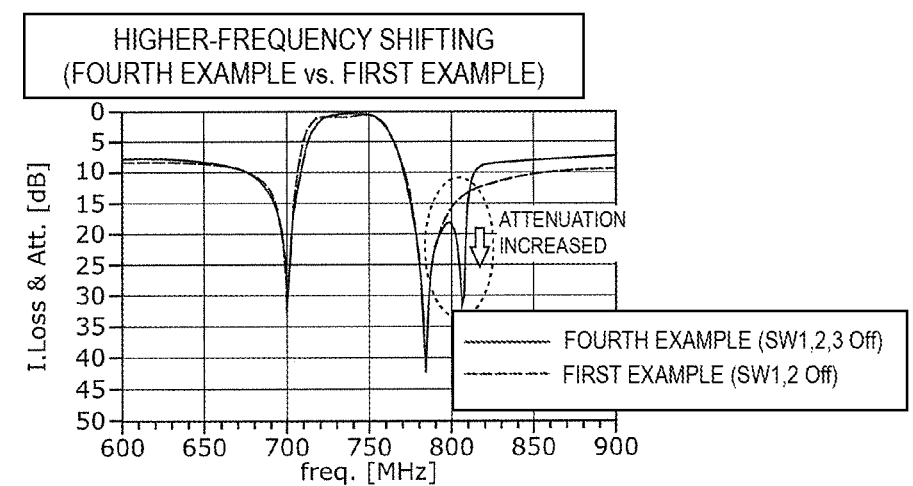
FIG. 17B is a graph illustrating a comparison between the characteristics of the radio-frequency filter of the fourth example and those of the first example in the case of higher-frequency shifting.

FIG. 17A is a graph illustrating a comparison between the characteristics of the radio-frequency filter of the fourth example and those of the first example in the case of lower-frequency shifting. FIG. 17B is a graph illustrating a comparison between the characteristics of the radio-frequency filter of the fourth example and those of the first example in the case of higher-frequency shifting.

FIGS. 17A and 17B show that, as in the radio-frequency filter 10 of the first example, the radio-frequency filter 10C of the fourth example is able to vary the frequency of the attenuation pole on the higher-frequency side of the pass band substantially without increasing the loss at the high edge of the pass band. FIGS. 17A and 17B show that the radio-frequency filter 10C of the fourth example is able to increase the attenuation in the vicinity of the higher-frequency side of the pass band in comparison with the radio-frequency filter 10 of the first example.

As stated above, in many bands defined in 3GPP, for example, the Tx band (transmit band) is a lower-frequency band, while the Rx band (receive band) is a higher-frequency band, and the center frequency and the bandwidth are different among the bands. A variable-frequency radio-frequency filter for such bands uses one of the Tx band and the Rx band as a pass band and the other band as an attenuation band, and is also required to shift the pass band and the attenuation band to the lower-frequency side or the higher-frequency side together.

According to the fourth example, the impedance element connected in parallel with the switch SW3 (third switch) is the capacitor C3 (third capacitor). Hence, as a result of setting the switches SW1, SW2, and SW3 to the same state (ON or OFF), it is possible to shift the resonant frequency and the anti-resonant frequency of the series arm circuit 11 and the lower anti-resonant frequency and the higher resonant frequency of the parallel arm circuit 12C to the lower-frequency side or the higher-frequency side together. Accordingly, the cut-off frequency and the attenuation pole on the higher-frequency side of the pass band can shift to the lower-frequency side or the higher-frequency side together. It is thus possible to vary the frequency substantially without increasing the loss at the high edge of the pass band.

In the fourth example, the capacitor C3 (third capacitor) is used as the impedance element connected in parallel with the switch SW3 (third switch). However, the impedance element may be an inductor instead of a capacitor.

If an inductor is used as the impedance element, however, the second resonant frequency when the switch SW3 is ON is lower than that when the switch SW3 is OFF, and the first anti-resonant frequency when the switch SW3 is ON is higher than that when the switch SW3 is OFF. That is, the shifting directions of the second resonant frequency and the first anti-resonant frequency of the parallel arm circuit 12C as a result of the switch SW3 being switched between ON and OFF are opposite to those in the fourth example.

In this case, by turning the third switch OFF when the first and second switches are ON or by turning the third switch ON when the first and second switches are OFF, it is possible to vary the frequency substantially without increasing the loss at the high edge of the pass band, as in the fourth example.

Fifth Embodiment

The configurations of the above-described radio-frequency filters may be applicable to the configuration including plural series arm resonators. In a fifth embodiment, such a radio-frequency filter will be described through illustration of an example (fifth example).

[5-1. Configuration]

Figure 18A:
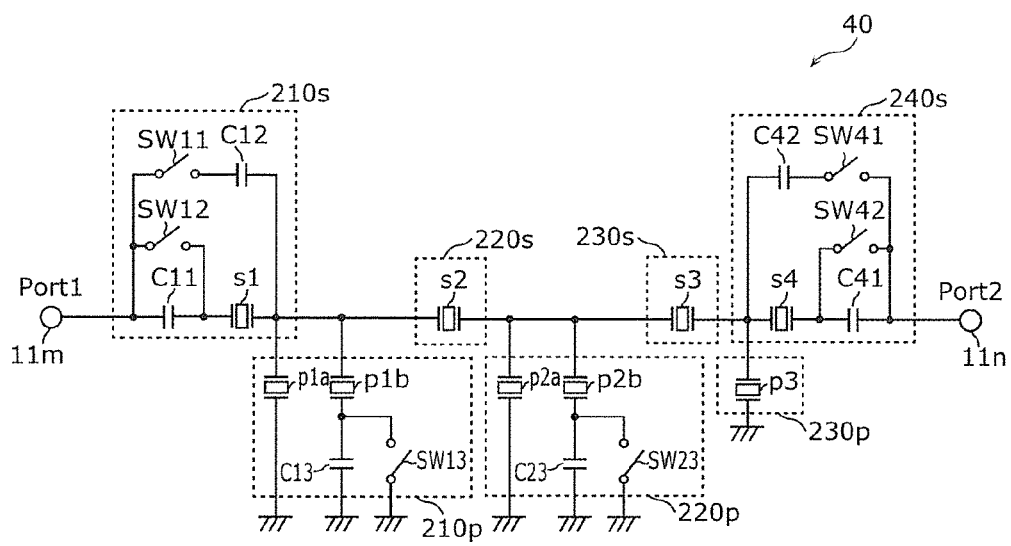
FIG. 18A is a circuit diagram of a radio-frequency filter according to an example (fifth example) of a fifth embodiment.

FIG. 18A is a circuit diagram of a radio-frequency filter 40 according to the fifth example.

The radio-frequency filter 40 shown in FIG. 18A is a ladder filter circuit including plural series arm circuits (four series arm circuits 210s, 220s, 230s, and 240s in the fifth example) disposed on a path connecting an input/output terminal 11m (first input/output terminal) and an input/output terminal 11n (second input/output terminal) and one or more parallel arm circuits (three parallel arm circuits 210p, 220p, and 230p in the fifth example). More specifically, the radio-frequency filter 40 is a variable-frequency band pass filter using multiple bands as path bands and including four series arm resonators s1 through s4 and also including parallel arm resonators p1a, p1b, p2a, p2b, and p3, switches SW11 through SW13, SW23, SW41, and SW42, and capacitors C11 through C13, C23, C41, and C42. The number of series arm circuits and that of parallel arm circuits are not limited to those described above.

Among the series arm circuits 210s, 220s, 230s, and 240s, the series arm circuit 210s disposed most closely to the input/output terminal 11m and the series arm circuit 240s disposed most closely to the input/output terminal 11n each correspond to the series arm circuit 11 of the radio-frequency filter of one of the first through fourth embodiments (first embodiment in this case). The switches SW11 and SW41 correspond to the switch SW1 of the series arm circuit 11, the switches SW12 and SW42 correspond to the switch SW2 of the series arm circuit 11, the capacitors C11 and C41 correspond to the capacitor C1 of the series arm circuit 11, and the capacitors C12 and C42 correspond to the capacitor C2 of the series arm circuit 11. The parallel arm circuits 210p and 220p correspond to the parallel arm circuit 12C of the radio-frequency filter 10C of the fourth example, and the parallel arm circuit 230p corresponds to the parallel arm circuit 12 of the radio-frequency filter 10 of the first example. The parallel arm resonators p1a and p2a correspond to the parallel arm resonator p1a of the parallel arm circuit 12C, the parallel arm resonators p1b and p2b correspond to the parallel arm resonator p1b of the parallel arm circuit 12C, the switches SW13 and SW23 correspond to the switch SW3 of the parallel arm circuit 12C, and the parallel arm resonator p3 corresponds to the parallel arm resonator p1 of the parallel arm circuit 12. That is, in the radio-frequency filter 40, the configuration corresponding to the radio-frequency filter 10C of the fourth example is disposed most closely to the input/output terminal 11m, while the configuration corresponding to the radio-frequency filter 10 of the first example is disposed most closely to the input/output terminal 11n.

The configuration of the radio-frequency filter 40 is not limited to that described above if at least one of the plural series arm circuits corresponds to the series arm circuit of one of the first through fourth embodiments. For example, only the series arm circuit located most closely to one of the input/output terminals may correspond to the series arm circuit of one of the first through fourth embodiments. Alternatively, only a series arm circuit different from the series arm circuits provided most closely to the input/output terminals may correspond to the series arm circuit of one of the first through fourth embodiments.

A parallel arm circuit may be provided to connect a ground and a node on a path which connects the input/output terminal (input/output terminal 11m or 11n) and the series arm circuit disposed most closely to this input/output terminal.

The radio-frequency filter 40 configured as described above includes the configuration of the radio-frequency filter of one of the first through fourth embodiments. The radio-frequency filter 40 is thus able to vary the frequency of the attenuation pole on the higher-frequency side of the pass band substantially without increasing the loss at the high edge of the pass band.

[5-2. Structure]

Figure 18B:
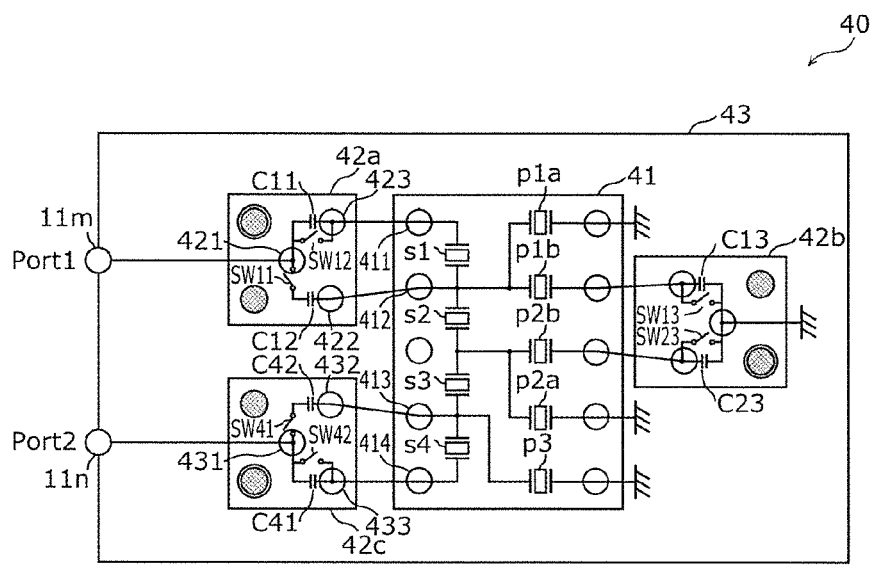
FIG. 18B is a plan view of the radio-frequency filter of the fifth example for explaining its structure.

FIG. 18B is a plan view of the radio-frequency filter 40 of the fifth example for explaining its structure.

As shown in FIG. 18B, in the fifth example, the plural resonators (series arm resonators s1 through s4 and parallel arm resonators p1a, p1b, p2a, p2b, and p3) are constituted by a single resonator package 41 (chip), and the other elements (switches SW11 through SW13, SW23, SW41, and SW42 and capacitors C11 through C13, C23, C41, and C42) are constituted by packages 42a through 42c different from the resonator package 41. The packages 41 and 42a through 42c are mounted on a wiring substrate 43. That is, the resonators and the switches are included in different packages.

The packages 41 and 42a through 42c have surface electrodes (indicated by the circles in FIG. 18B, which are also called "lands" or "pads") on the bottom surfaces. The surface electrodes are used for mounting the packages 41 and 42a through 42c on the wiring substrate 43. For the sake of simple representation, in FIG. 18B, the circuit elements and wiring formed in the packages are schematically shown, and the insides of the packages 41 and 42a through 42c are seen through to show the surface electrodes on the bottom surfaces.

The wiring substrate 43 includes external connecting electrodes (indicated by the circles in FIG. 18B) forming the respective input/output terminals 11m and 11n. The external connecting electrodes are surface electrodes for mounting the wiring substrate 43 on a collective board, for example, or connectors for connecting the wiring substrate 43 to another electronic component, or, if an electronic component is mounted on the wiring substrate 43, the external connecting electrodes are a part of pattern wiring for connecting this electronic component to the package 42a or 42c.

As shown in FIG. 18B, in the package 42a, one terminal of the switch SW11 and one terminal of the switch SW12 are formed into a single terminal, which is connected to the input/output terminal 11m as a common terminal 421 of the package 42a. The other terminal of the switch SW11 is connected to a first terminal 422 of the package 42a via the capacitor C12. The other terminal of the switch SW12 is connected to a second terminal 423 of the package 42a. The capacitor C11 is connected in parallel with the switch SW12.

In the package 42c, one terminal of the switch SW41 and one terminal of the switch SW42 are formed into a single terminal, which is connected to the input/output terminal 11n as a common terminal 431 of the package 42c. The other terminal of the switch SW41 is connected to a first terminal 432 of the package 42c via the capacitor C42. The other terminal of the switch SW42 is connected to a second terminal 433 of the package 42c. The capacitor C41 is connected in parallel with the switch SW42.

In the resonator package 41, the series arm resonator s1 is connected between a first terminal 411 and a second terminal 412 of the package 41. The series arm resonator s4 is connected between a third terminal 413 and a fourth terminal 414 of the package 41.

The parallel arm circuits 210p, 220p, and 230p and the series arm circuits 220s and 230s shown in FIG. 18A are connected between the second and third terminals 412 and 413 of the package 41.

On the wiring substrate 43, the second terminal 423 of the package 42a and the first terminal 411 of the package 41 are connected, the first terminal 422 of the package 42a and the second terminal 412 of the package 41 are connected, the first terminal 432 of the package 42c and the third terminal 413 of the package 41 are connected, and the second terminal 433 of the package 42c and the fourth terminal 414 of the package 41 are connected.

In this manner, one of the terminals of each switch provided on a series arm is connected to one of the input/output terminals 11m and 11n. In this case, when the packages 42a and 42c including the switches and the package 41 including a resonator group are separately disposed, the switches are located closer to the corresponding input/output terminals than the resonator group is. Fewer terminals are thus required for the resonator package 41 and the switch packages 42a and 42c, thereby reducing the size of the radio-frequency filter 40.

In the circuit configuration shown in FIG. 18A, at least one of the capacitors C11, C12, C41, and C42 may be integrated into the resonator package 41. If the connecting order of the switch SW12 and the capacitor C12 is opposite to that shown in FIG. 18A, the switch SW12 may be integrated into the resonator package 41. If the connecting order of the switch SW42 and the capacitor C42 is opposite to that shown in FIG. 18A, the switch SW42 may be integrated into the resonator package 41.

At least one of the parallel arm resonators p1a, p1b, p2a, p2b, and p3 may be provided separately from the resonator package. The switches SW11 through SW13, SW23, SW41, and SW42 and the capacitors C11 through C13, C23, C41, and C42 may be formed into packages by combinations different from those described above.

[5-3. Application Example to Multiplexer]

The radio-frequency filter 40 may be applicable to a multiplexer.

Figure 19:
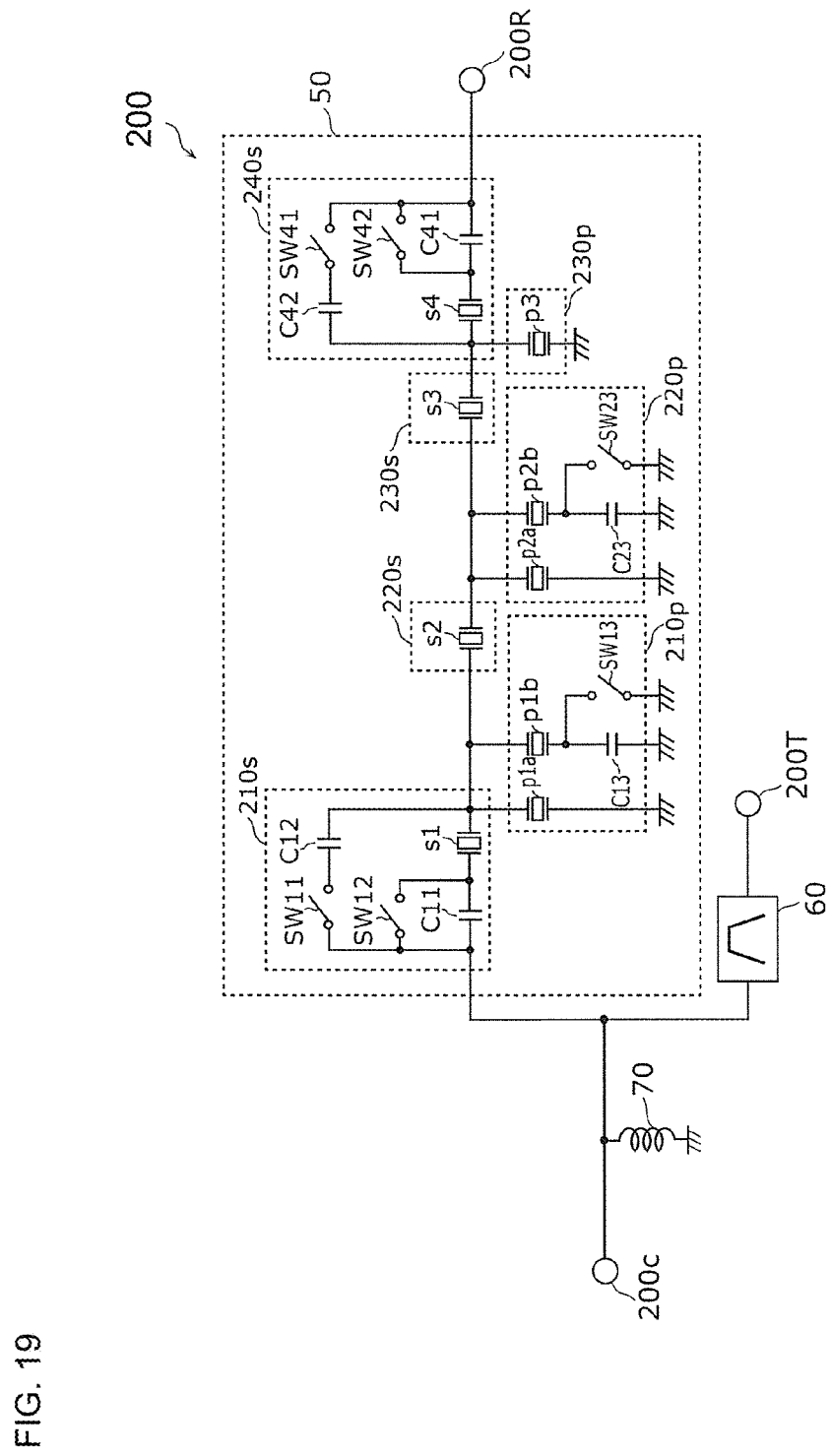
FIG. 19 is a circuit diagram of a multiplexer according to the fifth example.

FIG. 19 is a circuit diagram of a multiplexer (duplexer) 200 according to the fifth example. The multiplexer 200 shown in FIG. 19 includes a transmit filter 60, a receive filter 50, and a matching inductor 70. The transmit filter 60 is connected to an input terminal 200T and a common terminal 200c. The receive filter 50 is connected to the common terminal 200c and an output terminal 200R.

The transmit filter 60 is a band pass filter using a transmit band as the pass band. The transmit filter 60 is not restricted to a particular circuit configuration.

The receive filter 50 corresponds to the radio-frequency filter 40 of the fifth example and is a variable-frequency band pass filter using multiple bands as pass bands.

With the above-described configuration, in a tunable duplexer applied to a system for suitably selecting from among multiple frequency bands, the frequency of the attenuation band on the higher-frequency side of the pass band can be changed substantially without increasing the loss at the high edge of the pass band. That is, it is possible to implement a high-performance duplexer that can switch the pass band and the attenuation band substantially without increasing the loss at the high edge of the pass band. Additionally, instead of providing plural filters for individual frequency bands, one filter circuit having switches can handle multiple frequency bands, thereby reducing the size of the multiplexer.

The receive filter 50 may have the configuration of one of the first through fourth examples in place of that of the fifth example. The radio-frequency filters of the first through fifth examples may be applied to a transmit filter instead of a receive filter. The radio-frequency filters may not necessarily be applied to a duplexer, and may be applied to a multiplexer including plural transmit filters and plural receive filters.

If a surface acoustic wave resonator is used as a series arm resonator, a bulk wave loss is incurred on the higher-frequency side of the anti-resonant frequency of the series arm resonator. In a multiplexer having a common terminal to which one terminal of each of plural filters is connected, if a radio-frequency filter including such a series arm resonator is applied to a filter having a lower center frequency, the loss in the pass band of a filter having a higher center frequency is increased due to the bulk wave loss. Such an increase in the loss is mainly due to the influence of the bulk wave loss in the series arm circuit positioned most closely to the common terminal (that is, the series arm circuit connected to the common terminal without having another series arm circuit interposed therebetween).

The bulk wave loss is a loss caused by an increase in the equivalent DC resistance of a surface acoustic wave resonator. More specifically, in a higher stopband on the higher-frequency side of the anti-resonant frequency of a surface acoustic wave resonator, mechanical energy is radiated within a substrate, which increases the equivalent DC resistance of the surface acoustic wave resonator.

As to this bulk wave loss, in the above-described first through fifth examples, the series arm circuit includes the capacitor C1 (first capacitor) and the capacitor C2 (second capacitor). Accordingly, an input signal (power) is distributed between the series arm resonator s1 and the capacitors C1 and C2, thereby reducing the bulk wave loss in the series arm circuit as a whole. Such a series arm circuit of the first through fifth examples is disposed most closely to one of the input/output terminals (input/output terminal 11m or 11n). With this configuration, in a multiplexer including a filter having a lower center frequency and also including a common terminal connected to this input/output terminal, an increase in the loss within the pass band in a filter having a higher center frequency can be regulated.

Sixth Embodiment

The radio-frequency filters and the multiplexer discussed in the first through fifth embodiments may be applicable to a radio-frequency front-end circuit that supports a system using many bands. Such a radio-frequency front-end circuit and a communication apparatus will be described below in a sixth embodiment.

Figure 20:
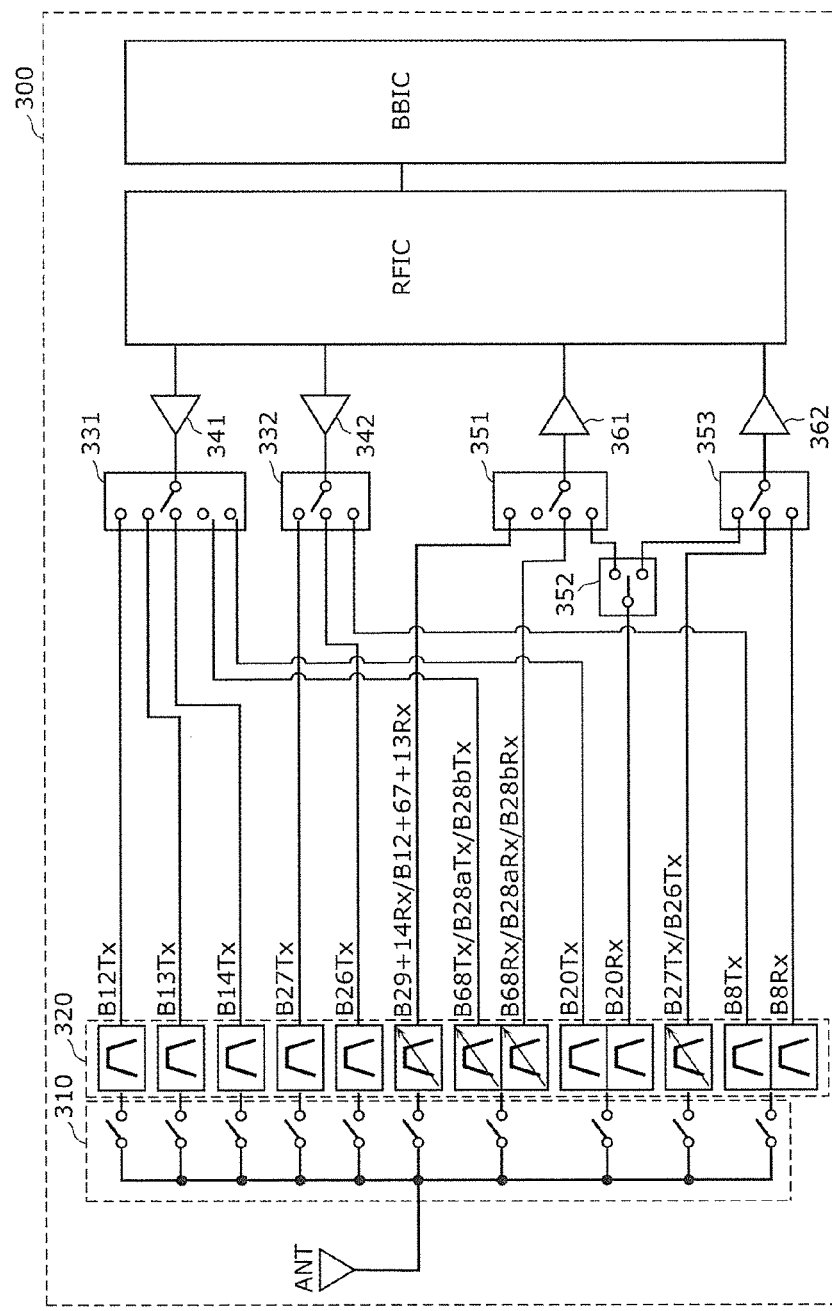
FIG. 20 is a schematic diagram of a communication apparatus according to a sixth embodiment.

FIG. 20 is a schematic diagram of a communication apparatus 300 according to the sixth embodiment.

As shown in FIG. 20, the communication apparatus 300 includes a switch group 310 constituted by multiple switches, a filter group 320 constituted by multiple filters, transmit switches 331 and 332, receive switches 351, 352, and 353, transmit amplifier circuits 341 and 342, receive amplifier circuits 361 and 362, an RF signal processing circuit (RFIC), a baseband signal processing circuit (BBIC), and an antenna element (ANT). The antenna element (ANT) may not necessarily be contained in the communication apparatus 300.

The switch group 310 connects the antenna element (ANT) and a signal path corresponding to the predetermined band in accordance with a control signal output from a controller (not shown). The switch group 310 is constituted by plural SPST switches. The switch group 310 may not necessarily connect the antenna element (ANT) to only one signal path and may connect it to multiple signal paths. That is, the communication apparatus 300 may support carrier aggregation.

The filter group 320 is constituted by multiple filters (including duplexers) having pass bands in: (i) the transmit band of Band 12; (ii) the transmit band of Band 13; (iii) the transmit band of Band 14; (iv) the transmit band of Band 27; (v) the transmit band of Band 26; (vi) the receive bands of Band 29 and Band 14 (or Band 12, Band 67, and Band 13); (vii-Tx) the transmit band of Band 68 (or Band 28a or Band 28b); (vii-Rx) the receive band of Band 68 (or Band 28a or Band 28b); (viii-Tx) the transmit band of Band 20; (viii-Rx) the receive band of Band 20; (ix-Tx) the transmit band of Band 27 (or Band 26); (x-Tx) the transmit band of Band 8; and (x-Rx) the receive band of Band 8.

The transmit switch 331 is a switch circuit including plural selection terminals connected to plural low-band transmit signal paths and a common terminal connected to the transmit amplifier circuit 341. The transmit switch 332 is a switch circuit including plural selection terminals connected to plural high-band transmit signal paths and a common terminal connected to the transmit amplifier circuit 342. The transmit switches 331 and 332 are switch circuits that are disposed at a stage preceding the filter group 320 (at a stage preceding the filter group 320 in the transmit signal paths, in this case) and that are connected or disconnected in accordance with a control signal from the controller (not shown). Radio-frequency signals (radio-frequency transmit signals in this case) amplified by the transmit amplifier circuits 341 and 342 are outputted to the antenna element (ANT) via the predetermined filters of the filter group 320.

The receive switch 351 is a switch circuit including plural selection terminals connected to plural low-band receive signal paths and a common terminal connected to the receive amplifier circuit 361. The receive switch 352 is a switch circuit including a common terminal connected to the receive signal path of the predetermined band (Band 20 in this case) and two selection terminals connected to the selection terminal of the receive switch 351 and that of the receive switch 353. The receive switch 353 is a switch circuit including plural selection terminals connected to plural high-band receive signal paths and a common terminal connected to the receive amplifier circuit 362. The receive switches 351 through 353 are disposed at a stage following the filter group 320 (at a stage following the filter group 320 in the receive signal paths, in this case) and are connected or disconnected in accordance with a control signal from the controller (not shown). Radio-frequency signals (radio-frequency received signals in this case) inputted into the antenna element (ANT) pass through predetermined filters of the filter group 320, and are amplified in the receive amplifier circuits 361 and 362, and are then outputted to the RF signal processing circuit (RFIC). An RF signal processing circuit (RFIC) corresponding to low bands and an RF signal processing circuit (RFIC) corresponding to high bands may individually be provided.

The transmit amplifier circuit 341 is a power amplifier which amplifies the power of a low-band radio-frequency transmit signal. The transmit amplifier circuit 342 is a power amplifier which amplifies the power of a high-band radio-frequency transmit signal.

The receive amplifier circuit 361 is a low-noise amplifier which amplifies the power of a low-band radio-frequency received signal. The receive amplifier circuit 362 is a low-noise amplifier which amplifies the power of a high-band radio-frequency received signal.

The RF signal processing circuit (RFIC) is a circuit which processes the radio-frequency signals received by the antenna element (ANT) and those to be sent from the antenna element (ANT). More specifically, the RF signal processing circuit (RFIC) performs signal processing, such as down-conversion, on a radio-frequency signal (radio-frequency received signal in this case) input from the antenna element (ANT) via a receive signal path. The RF signal processing circuit (RFIC) then outputs a received signal generated by performing signal processing to the baseband signal processing circuit (BBIC). The RF signal processing circuit (RFIC) also performs signal processing, such as up-conversion, on a transmit signal input from the baseband signal processing circuit (BBIC). The RF signal processing circuit (RFIC) then outputs a radio-frequency signal (radio-frequency transmit signal in this case) generated by performing signal processing to a transmit signal path.

The communication apparatus 300 configured as described above includes the radio-frequency filter according to any of the first through fifth embodiments as at least one of the filter using (vi) the receive bands of Band 29 and Band 14 (or Band 12, Band 67, and Band 13) as the pass bands, the filter using (vii-Tx) the transmit band of Band 68 (or Band 28a or Band 28b) as the pass band, the filter using (vii-Rx) the receive band of Band 68 (or Band 28a or Band 28b) as the pass band, and the filter using (ix-Tx) the transmit band of Band 27 (or Band 26) as the pass band. That is, this filter switches the pass band in accordance with a control signal.

Among the elements of the communication apparatus 300, the switch group 310, the filter group 320, the transmit switches 331 and 332, the receive switches 351, 352, and 353, the transmit amplifier circuits 341 and 342, the receive amplifier circuits 361 and 362, and the above-described controller form a radio-frequency front-end circuit.

The controller may be contained in the RF signal processing circuit (RFIC), or may form a switch IC together with the switches controlled by the controller, though such a configuration is not shown in FIG. 20.

The radio-frequency front-end circuit and the communication apparatus 300 configured as described above each include the radio-frequency filter according to any of the first through fifth embodiments. The radio-frequency front-end circuit and the communication apparatus 300 are thus able to vary the frequency of the attenuation band on the higher-frequency side of the pass band substantially without increasing the loss at the high edge of the pass band. That is, it is possible to implement a high-performance radio-frequency front-end circuit and communication apparatus that can switch the pass band and the attenuation band substantially without increasing the loss at the high edge of the pass band. Additionally, the radio-frequency front-end circuit and the communication apparatus require fewer filters than the configuration in which filters are individually provided for the respective bands, and the size thereof can accordingly be reduced.

The radio-frequency front-end circuit according to the sixth embodiment includes the transmit switches 331 and 332 (switch circuits) disposed at a stage preceding the filter group 320 (plural radio-frequency filters) and the receive switches 351 through 353 (switch circuits) disposed at a stage following the filter group 320. With this configuration, it is possible to handle together some of the signal paths through which radio-frequency signals are transferred. Hence, the same transmit amplifier circuit 341 (amplifier circuit) can be used for some of the radio-frequency filters, and the same transmit amplifier circuit 342 (amplifier circuit) can be used for some of the radio-frequency filters. Similarly, the same receive amplifier circuit 361 (amplifier circuit) can be used for some of the radio-frequency filters, and the same receive amplifier circuit 362 (amplifier circuit) can be used for some of the radio-frequency filters. As a result, the size and the cost of the radio-frequency front-end circuit can be reduced.

Although the transmit switches 331 and 332 and the receive switches 351 through 353 are provided, at least one of the transmit switches 331 and 332 and at least one of the receive switches 351 through 353 may be provided. The number of transmit switches 331 and 332 and that of the receive switches 351 through 353 are not limited to those discussed above. For example, one transmit switch and one receive switch may be provided. The number of terminals such as selection terminals of the transmit switches and that of the receive switches are not restricted to those discussed in the sixth embodiment. The transmit switches and receive switches may each have two selection terminals.

Other Embodiments

The radio-frequency filter, the radio-frequency front-end circuit, and the communication apparatus according to embodiments of the present disclosure have been discussed above through illustration of the first through sixth embodiments. However, the radio-frequency filter, the radio-frequency front-end circuit, and the communication apparatus according to the present disclosure are not restricted to the above-described embodiments. Other embodiments implemented by combining certain elements in the above-described embodiments, and modified examples obtained by making various modifications to the above-described embodiments by those skilled in the art without departing from the scope and spirit of the disclosure are also encompassed in the disclosure. Various devices integrating some of the radio-frequency filter, the radio-frequency front-end circuit, and the communication apparatus according to the present disclosure are also encompassed in the disclosure.

For example, a radio-frequency filter realized by combining the series arm circuit 11A of the second example with the parallel arm circuit 12B of the third example or the parallel arm circuit 12C of the fourth example is also encompassed in the disclosure. In such a radio-frequency filter, the impedance element connected in parallel with the third switch may be a capacitor. When the first switch is ON, the third switch may be ON, and when the first switch is OFF, the third switch may be OFF. This configuration makes it possible to shift the anti-resonant frequency of the series arm circuit and the higher resonant frequency of the parallel arm circuit to the lower-frequency side or the higher-frequency side together. Accordingly, the attenuation pole formed by the series arm circuit and that formed by the parallel arm circuit on the higher-frequency side of the pass band shift to the lower-frequency side or the higher-frequency side together. It is thus possible to vary the frequency while maintaining the attenuation band width on the higher-frequency side of the pass band. Additionally, the same control circuit can be used for the first and third switches, thereby reducing the size of the radio-frequency filter.

The radio-frequency filters according to the first through fifth embodiments may be applicable to a system that mutually exclusively switches between adjacent multiple channels allocated to one frequency band, as well as to a system that mutually exclusively switches between adjacent frequency bands.

In the radio-frequency filters according to the first through fifth embodiments, the series arm resonators and the parallel arm resonators are not restricted to acoustic wave resonators using surface acoustic waves, and may be constituted by acoustic wave resonators using bulk waves or boundary acoustic waves. Each of the series arm resonators and the parallel arm resonators may not necessarily be a single acoustic wave resonator, and may alternatively be plural series-connected resonators divided from one acoustic wave resonator.

In the radio-frequency filters according to the first through fifth embodiments, at least one of the first and second capacitors may not necessarily be constituted by an interdigital capacitor electrode, and may be constituted by electrode films opposing each other with an insulating layer or a dielectric layer interposed therebetween on a substrate.

In the radio-frequency filters according to the first through fifth embodiments, the parallel arm circuit may be constituted by an LC resonance circuit, instead of an acoustic wave resonator. The parallel arm circuit is not limited to a resonance circuit and may be an inductance element or a capacitance element.

The configuration of the series arm circuits discussed in the first through fourth embodiments may be applicable to a ladder filter circuit including plural series arm circuits, one of which is the series arm circuit of one of the first through fourth embodiments, and also including one or more parallel arm circuits. In such a filter circuit, the series arm circuits different from the series arm circuit of one of the first through fourth embodiments are not restricted to a particular configuration, and may be a resonance circuit, such as a longitudinally coupled resonator or an LC resonance circuit, or an inductance element or a capacitance element. The configuration of such series arm circuits are suitably selected in accordance with the required filter characteristics. If, for example, enhanced attenuation is required, a longitudinally coupled resonator may be selected.

In the ladder filter circuit according to the fifth embodiment including plural series arm circuits, one of which is the series arm circuit discussed in one of the first through fourth embodiments, and also including one or more parallel arm circuits, the series arm circuit of one of the first through fourth embodiments is disposed most closely to the input/output terminal 11*m* or 11*n*. However, the ladder filter circuit is not restricted to this configuration. For example, a series arm circuit different from the series arm circuit of one of the first through fourth embodiments may be disposed most closely to the input/output terminal 11*m* or 11*n*. That is, the series arm circuit of one of the first through fourth embodiments may be disposed at a position other than the ends of a group of the plural series arm circuits.

In the radio-frequency filters according to the first through fifth embodiments, the piezoelectric substrate 102 forming a surface acoustic wave filter may be a multilayer structure constituted by a high acoustic velocity support substrate, a low acoustic velocity film, and a piezoelectric film stacked on each other in this order. The piezoelectric film is made of a 50°-Y-cut X-propagating LiTaO$_3$ piezoelectric single crystal (assuming that the x axis is the central axis, a lithium tantalite single crystal is cut in cross section normal to the axis rotated by 50° from the y axis, and acoustic waves propagate through this single crystal in the x-axis direction) or piezoelectric ceramics through which acoustic waves propagate in the x-axis direction, for example. The thickness of the piezoelectric film is 3.5λ or smaller, where λ denotes the wavelength determined by the electrode finger pitch of the IDT electrode. The high acoustic velocity support substrate is a substrate supporting the low acoustic velocity film, the piezoelectric film, and the electrode film 101. The high acoustic velocity support substrate is a substrate through which bulk waves propagate at a higher speed than acoustic waves, such as surface acoustic waves and boundary acoustic waves, propagating through the piezoelectric film. The high acoustic velocity support substrate serves to trap acoustic waves within the area where the piezoelectric film and the low acoustic velocity film are stacked on each other so as to prevent acoustic waves from leaking downward from the high acoustic velocity support substrate. The high acoustic velocity support substrate is a silicon substrate, for example, and has a thickness of 120 μm, for example. The low acoustic velocity film is a film through which bulk waves propagate at a lower speed than acoustic waves propagating through the piezoelectric film. The low acoustic velocity film is disposed between the piezoelectric film and the high acoustic velocity support substrate. Because of this structure and the properties that acoustic wave energy inherently concentrates on a transmission medium having a low acoustic velocity, a leakage of surface acoustic wave energy to the outside of the IDT electrode is reduced. The low acoustic velocity film is a film made of silicon dioxide as a main constituent, for example, and has a thickness of 670 nm, for example. This multilayer structure makes it possible to significantly increase the Q factor at the resonant frequency and at the anti-resonant frequency to be higher than the structure in which the piezoelectric substrate 102 has a single layer. That is, this multilayer structure can form surface acoustic wave resonators having a high Q factor. Using such acoustic wave resonators makes it possible to form a filter having a small insertion loss.

The high acoustic velocity support substrate may have a multilayer structure of a support substrate and a high acoustic velocity film through which bulk waves propagate at a higher speed than acoustic waves, such as surface acoustic waves and boundary acoustic waves, propagating through the piezoelectric film. In this case, as the support substrate, a piezoelectric substrate made of a substance, such as sapphire, lithium tantalite, lithium niobate, and crystal; a ceramic substrate made of a substance, such as alumina, magnesia, silicon nitride, aluminum nitride, silicon carbide, zirconia, cordierite, mullite, steatite, and forsterite; a dielectric substrate made of glass, for example; a semiconductor substrate made of a substance, such as silicon and gallium nitride; and a resin substrate may be used. As the high acoustic velocity film, various high acoustic velocity materials, such as aluminum nitride, aluminum oxide, silicon carbide, silicon nitride, silicon oxynitride, a DLC film or diamond, a medium made of any of the above-described materials as a main constituent, and a medium made of a mixture of the above-described materials as a main constituent may be used.

In the radio-frequency filters, the radio-frequency front-end circuit, and the communication apparatus according to the first through sixth embodiments, an inductance element and a capacitance element may be connected between the common terminal and each of the input/output terminals. The radio-frequency filters, the radio-frequency front-end circuit, and the communication apparatus may also include inductance components of wiring for connecting the circuit elements.

The present disclosure finds widespread applications in communication devices, such as cellular phones, as a small-size radio-frequency filter, radio-frequency front-end circuit, and communication apparatus which can be used in a multiband and multimode system simultaneously or mutually exclusively using adjacent multiple bands.

10, 10A, 10B, 10C, 10X, 23A, 23B, 40 radio-frequency filter
11, 11A, 11X, 210s, 220s, 230s, 240s series arm circuit
11a first variable frequency circuit
11b second variable frequency circuit
11c, 11d third variable frequency circuit
11e series connecting circuit
11m, 23m input/output terminal
11n, 23n input/output terminal
12, 12B, 12C, 210p, 220p, 230p parallel arm circuit
22SW, 23SW, SW, SW1, SW2, SW3, SW11, SW12, SW13, SW23, SW41, SW42 switch
23k wiring
23p1, 23p2, p1, p1a, p1b, p2, p2a, p2b, p3 parallel arm resonator
23s, s1, s2, s3, s4 series arm resonator
41, 42a, 42b, 42c package
43, 100 wiring substrate
receive filter
transmit filter
matching inductor
101 electrode film
101a resin member
102 piezoelectric substrate
104 interdigital capacitor electrode
111 IDT electrode
111a, 141a electrode finger
112 reflector
200 multiplexer (duplexer)
200c common terminal
200R output terminal
200T input terminal
300 communication apparatus
310 switch group
320 filter group
331, 332 transmit switch
341, 342 transmit amplifier circuit
351 to 353 receive switch
361, 362 receive amplifier circuit
411, 422, 432 first terminal
412, 423, 433 second terminal
413 third terminal
414 fourth terminal
421, 431 common terminal
ANT antenna element
BBIC baseband signal processing circuit
C1, C2, C3, C11, C12, C13, C23, C41, C42 capacitor
x1 node

The invention claimed is:

1. A radio-frequency filter comprising:
   a series arm circuit disposed in a path, the path connecting a first input/output terminal and a second input/output terminal; and
   a parallel arm circuit connected between a node on the path and ground,
   wherein the series arm circuit comprises:
      a series arm resonator and a first capacitor that are connected in series with each other, and
      a first variable frequency circuit that is connected in parallel with the first series arm resonator and the first capacitor, the first variable frequency circuit being configured to vary an anti-resonant frequency of the series arm circuit,
   wherein the first variable frequency circuit comprises a second capacitor and a first switch that are connected in series with each other,
   wherein the series arm resonator comprises an interdigital transducer (IDT) electrode on a substrate, the substrate at least partly exhibiting piezoelectricity characteristics, and the IDT electrode having a plurality of electrode fingers,
   wherein the first capacitor or the second capacitor is constituted by the substrate and an interdigital capacitor electrode on the substrate, the interdigital capacitor electrode having a plurality of electrode fingers,
   wherein a pitch of the plurality of electrode fingers of the interdigital capacitor electrode is less than a pitch of the plurality of electrode fingers of the series arm resonator, and
   wherein a self-resonant point of the first capacitor or the second capacitor is at a frequency greater than a pass band of the radio-frequency filter.

2. The radio-frequency filter according to claim 1, wherein:
   the series arm circuit further comprises a second switch connected in parallel with the first capacitor, and
   the first capacitor and the second switch constitute a second variable frequency circuit configured to vary a resonant frequency of the series arm circuit.

3. The radio-frequency filter according to claim 2, wherein:
   when the first switch is ON, the second switch is ON; and
   when the first switch is OFF, the second switch is OFF.

4. The radio-frequency filter according to claim 1, wherein the first switch is a field effect transistor (FET) switch made of gallium arsenide (GaAs) or a complementary metal oxide semiconductor (CMOS), or is a diode switch.

5. The radio-frequency filter according to claim 1, wherein a film thickness of the plurality of electrode fingers of the interdigital capacitor electrode is less than or equal to a film thickness of the plurality of electrode fingers of the series arm resonator.

6. The radio-frequency filter according to claim 1, further comprising:
   another series arm circuit disposed in the path,
   wherein the series arm circuit is connected to the first input/output terminal or the second input/output terminal without said another series arm circuit interposed therebetween.

7. The radio-frequency filter according to claim 6, wherein a first terminal of the first switch is connected to the input/output terminal to which the series arm circuit is connected without the another series arm circuit interposed therebetween, and a second terminal of the first switch is connected to the second capacitor.

8. A radio-frequency front-end circuit comprising:
   the radio-frequency filter according to claim 1; and
   a controller configured to selectively control the first switch between an ON state and an OFF state.

9. A communication apparatus comprising:
   a radio-frequency (RF) signal processing circuit configured to process radio-frequency signals transmitted and received by an antenna; and
   the radio-frequency front-end circuit according to claim 8 configured to transfer the radio-frequency signals between the antenna and the RF signal processing circuit.

10. A radio-frequency filter comprising:
    a series arm circuit disposed in a path, the path connecting a first input/output terminal and a second input/output terminal; and
    a parallel arm circuit connected between a node on the path and ground,
    wherein the series arm circuit comprises:
       a series arm resonator and a first capacitor that are connected in series with each other, and
       a first variable frequency circuit that is connected in parallel with the first series arm resonator and the first capacitor, the first variable frequency circuit being configured to vary an anti-resonant frequency of the series arm circuit,
    wherein the first variable frequency circuit comprises a second capacitor and a first switch that are connected in series with each other,
    wherein the parallel arm circuit comprises:
       a first parallel arm resonator connected between the node and ground, and
       a third variable frequency circuit connected in parallel with the first parallel arm resonator,
    wherein the third variable frequency circuit comprises a second parallel arm resonator and a third switch connected in series with each other,
    wherein a resonant frequency of the first parallel arm resonator is less than a resonant frequency of the series arm resonator,
    wherein a resonant frequency of the second parallel arm resonator is greater than the resonant frequency of the first parallel arm resonator, and
    wherein an anti-resonant frequency of the second parallel arm resonator is greater than an anti-resonant frequency of the first parallel arm resonator.

11. The radio-frequency filter according to claim 10, wherein the third variable frequency circuit further comprises an impedance element connected in parallel with the third switch.

12. The radio-frequency filter according to claim 11, wherein:
    the series arm circuit comprises a second switch connected in parallel with the first capacitor;
    the impedance element is a third capacitor;
    when the first switch is ON, both the second switch and the third switch are ON; and
    when the first switch is OFF, both the second switch and the third switches are OFF.

13. The radio-frequency filter according to claim 10, wherein the first switch is a field effect transistor (FET) switch made of gallium arsenide (GaAs) or a complementary metal oxide semiconductor (CMOS), or is a diode switch.

14. The radio-frequency filter according to claim 10, further comprising:
   another series arm circuit disposed in the path,
   wherein the series arm circuit is connected to the first input/output terminal or the second input/output terminal without said another series arm circuit interposed therebetween.

15. The radio-frequency filter according to claim 14, wherein a first terminal of the first switch is connected to the input/output terminal to which the series arm circuit is connected without the another series arm circuit interposed therebetween, and a second terminal of the first switch is connected to the second capacitor.

16. A radio-frequency front-end circuit comprising:
   the radio-frequency filter according to claim 10; and
   a controller configured to selectively control the first switch between an ON state and an OFF state.

17. A communication apparatus comprising:
   a radio-frequency (RF) signal processing circuit configured to process radio-frequency signals transmitted and received by an antenna; and
   the radio-frequency front-end circuit according to claim 16 configured to transfer the radio-frequency signals between the antenna and the RF signal processing circuit.

* * * * *

UNITED STATES PATENT AND TRADEMARK OFFICE
CERTIFICATE OF CORRECTION

PATENT NO. : 11,031,920 B2
APPLICATION NO. : 16/519596
DATED : June 8, 2021
INVENTOR(S) : Koji Nosaka It is certified that error appears in the above-identified patent and that said Letters Patent is hereby corrected as shown below:

In the Specification

Column 10, Line 24, "circuit lib is a parallel" should read -- circuit 11b is a parallel --.

Column 45, Line 8, "element (ΔNT). The antenna" should read -- element (ANT). The antenna --.

Column 50, Line 38, "receive filter" should read -- 50 receive filter --.

Column 50, Line 39, "transmit filter" should read -- 60 transmit filter --.

Column 50, Line 40, "matching inductor" should read -- 70 matching inductor --.

Signed and Sealed this
Third Day of May, 2022

Katherine Kelly Vidal
*Director of the United States Patent and Trademark Office*